(12) United States Patent
Wenham et al.

(10) Patent No.: US 7,998,863 B2
(45) Date of Patent: Aug. 16, 2011

(54) HIGH EFFICIENCY SOLAR CELL FABRICATION

(75) Inventors: Stuart Ross Wenham, Sydney (AU); Ly Mai, Sydney (AU); Nicole Bianca Kuepper, Sydney (AU); Budi Tjahjono, Sydney (AU)

(73) Assignee: Newsourth Innovations Pty Limited, New South Wales (AU)

( * ) Notice: Subject to any disclaimer, the term of this patent is extended or adjusted under 35 U.S.C. 154(b) by 98 days.

(21) Appl. No.: 12/125,827

(22) Filed: May 22, 2008
(Under 37 CFR 1.47)

(65) Prior Publication Data

US 2009/0008787 A1    Jan. 8, 2009

Related U.S. Application Data

(63) Continuation-in-part of application No. PCT/AU2006/001773, filed on Nov. 24, 2006.

(30) Foreign Application Priority Data

Nov. 24, 2005  (AU) ................................ 2005906552
Nov. 29, 2005  (AU) ................................ 2005906662
Apr. 11, 2006  (AU) ................................ 2006901903

(51) Int. Cl.
*H01L 21/44* (2006.01)
(52) U.S. Cl. ................ 438/675; 438/694; 257/E21.249
(58) Field of Classification Search .................. 438/675, 438/694
See application file for complete search history.

(56) References Cited

U.S. PATENT DOCUMENTS

| | | | |
|---|---|---|---|
| 4,419,811 A | 12/1983 | Rice | |
| 4,459,605 A | 7/1984 | Rice | |
| 4,920,402 A * | 4/1990 | Nakaya et al. | 257/773 |
| 5,701,264 A | 12/1997 | Shrivastava et al. | |
| 6,423,567 B1 * | 7/2002 | Ludemann et al. | 438/83 |
| 6,696,225 B1 | 2/2004 | Kanbe et al. | |
| 6,709,963 B1 | 3/2004 | Halderman et al. | |
| 6,716,764 B1 | 4/2004 | Girard et al. | |
| 6,811,670 B2 * | 11/2004 | Liu et al. | 205/123 |
| 2003/0183677 A1 | 10/2003 | Farrar et al. | |
| 2004/0077112 A1 | 4/2004 | Elliott | |
| 2005/0015175 A1 | 1/2005 | Huang | |
| 2006/0061270 A1 * | 3/2006 | Uhlig et al. | 313/506 |
| 2008/0166832 A1 * | 7/2008 | Young et al. | 438/73 |

FOREIGN PATENT DOCUMENTS

| | | |
|---|---|---|
| EP | 0 851 511 A | 7/1998 |
| GB | 2172747 A | 9/1986 |
| WO | WO2005024920 A1 | 3/2005 |

OTHER PUBLICATIONS

Guo, J. H. et al.; "Metallization Improvement on Fabrication of Interdigitated Backside and Double Sided Buried Contact Solar Cells"; Solar Energy Materials and Solar Cells, Elsevier Science Publishers, Amsterdam, NL vol. 86, No. 4, Apr. 1, 2005 pp. 485-498.
Watanabe, H. et al; "Selective Etching of Phosphosilicate glass with Low Pressure Vapor HF"; Journal of the Electrochemical Society, Electrochemical Society; Mancheser, New Hampshire; vol. 142, No. 1; Jan. 1, 1995; pp. 237-243.
Green, M. A. et al.; "Crystalline silicon on glass (CSG) thin-film solar cell modules"; Solar Energy, Pergamon Press, Oxford, GB, vol. 77, No. 6; Dec. 1, 2004; pp. 857-863.

* cited by examiner

*Primary Examiner* — Thanh Nguyen
(74) *Attorney, Agent, or Firm* — Vedder Price PC; Thomas J. Kowalski; Heidi Lunasin

(57) ABSTRACT

A method of forming a contact structure and a contact structure so formed is described. The structure contacts an underlying layer of a semiconductor junction, wherein the junction comprises the underlying layer of a semiconductor material and is separated from an overlying layer of semiconductor material by creating an undercut region to shade subsequent metal formation. Various steps are performed using inkjet printing techniques.

19 Claims, 36 Drawing Sheets

HIGH EFFICIENCY SOLAR CELL FABRICATION

This application is a continuation-in-part application of international patent application Serial No. PCT/AU2006/001773 filed 24 Nov. 2006, which published as PCT Publication No. WO 2007/059578 on 31 May 2007, which claims benefit of Australian patent application Serial Nos. 2005906552 filed 24 Nov. 2005, 2005906662 filed 29 Nov. 2005 and 2006901903 filed 11 Apr. 2006.

The foregoing applications, and all documents cited therein or during their prosecution ("appln cited documents") and all documents cited or referenced in the appln cited documents, and all documents cited or referenced herein ("herein cited documents"), and all documents cited or referenced in herein cited documents, together with any manufacturer's instructions, descriptions, product specifications, and product sheets for any products mentioned herein or in any document incorporated by reference herein, are hereby incorporated herein by reference, and may be employed in the practice of the invention. Citation or identification of any document in this application is not an admission that such document is available as prior art to the present invention. It is noted that in this disclosure and particularly in the claims and/or paragraphs, terms such as "comprises", "comprised", "comprising" and the like can have the meaning attributed to it in U.S. patent law; e.g., they can mean "includes", "included", "including", and the like; and that terms such as "consisting essentially of" and "consists essentially of" have the meaning ascribed to them in U.S. patent law, e.g., they allow for elements not explicitly recited, but exclude elements that are found in the prior art or that affect a basic or novel characteristic of the invention. The embodiments of the present invention are disclosed herein or are obvious from and encompassed by, the detailed description. The detailed description is given by way of example but not intended to limit the invention solely to the specific embodiments described.

This invention relates generally to the field of solar cell fabrication and in particular it provides processing techniques making use of inkjet printing techniques to apply processing agents to the surface of a device under fabrication.

BACKGROUND

In order to make solar power a viable alternative to established generating methods such as fossil fuel and nuclear power, it is necessary to bring the manufacturing cost of solar cells down. This has been achieved to some extent in thin film devices by use of large area devices carrying small quantities of silicon, however the manufacturing processes currently formulated for such devices are still complex and lend themselves to farther simplification or streamlining by finding new techniques.

In general, photovoltaic devices have two metal contacts, one of each polarity. In conventional structures one of these metal contacts, usually in a grid formation so as not to shade the semiconductor from too much light, is located on the light receiving or front surface. The second metal contact is located on the rear surface and is the opposite polarity. At the metal/silicon interface, the silicon surface is in general heavily doped above $1 \times 10^{18}$ atoms/cm$^3$ so as to enable low resistance contact between the metal and the silicon.

In a less conventional structure, both metal contacts are applied from the same surface. However a challenge in such a device structure is achieving electrical isolation between the n and p regions, particularly when the respective regions are heavily doped (i.e. n+ and p+) to facilitate low resistance contacts.

SUMMARY OF THE INVENTION

According to a first aspect, a method of forming a contact structure, in a device including a first contact type for contacting an underlying layer of a semiconductor junction, is provided wherein the junction comprises the underlying layer of a semiconductor material of a first dopant polarity, an overlying layer of a semiconductor material oppositely doped to the underlying layer, the method comprising a) forming an masking layer over the overlying layer of semiconductor material, b) forming an opening in the masking layer exposing the semiconductor material, c) forming an opening in the semiconductor material under the opening in the masking layer the opening in the semiconductor material being formed to extend through the overlying semiconductor material layer to expose the underlying semiconductor material layer, and the opening in the semiconductor material also being formed to extend under the edges of the opening in the masking layer to form an undercut region extending around the entire periphery of the opening in the masking layer whereby the undercut region extends entirely across the overlying semiconductor material layer, and d) forming a metal layer extending into the opening in the semiconductor material to contact the underlying semiconductor layer the metal layer being isolated from the overlying semiconductor material layer, whereby the metal does not bridge the semiconductor junction.

The masking layer may be an insulating layer which will be retained as part of the final device structure or may be a temporary layer which is removed after processing.

After the metal layer is formed the undercut region may define a void between the metal layer and the overlying semiconductor material layer in the undercut region to isolate the metal layer from the overlying semiconductor region. Alternately, the insulating layer over the undercut region may be caused to collapse into the opening in the semiconductor material to isolate the overlying semiconductor region from the subsequently formed metal layer. In this later case, the undercut region of the insulating layer may be modified relative to the remainder of the insulating layer, such as by being thinned relative to the remainder of the insulating layer, to promote collapsing into the opening in the semiconductor material. One method of achieving thinning of the undercut region of the insulating layer is by etching the entire insulating layer with an etchant which is flowable into the opening in the semiconductor material whereby the undercut region is simultaneously etched on its upper and lower surfaces. The insulating layer could also be modified by being softened relative to the remainder of the insulating layer to promote collapsing into the opening in the semiconductor material.

According to a second aspect, a method of forming an opening in a masking or insulating layer comprises:

a) forming a layer of masking material;

b) forming openings in the masking material; and c) applying an etchant through the openings in the masking material to etch the openings in the insulation layer.

Another method which can be used to form an opening in a masking or insulating layer is by:

a) diffusing a substance into the insulating layer which promotes preferential etching of the insulating layer, the substance being diffused into the insulating layer in locations where openings are to be formed;

b) etching the insulating layer with an etchant that preferentially etches the insulating material into which the substance has been diffused. The substance may be diffused into the insulating layer by applying a diffusion source to the surface of the insulating layer where diffusion is to take place and heating to drive the diffusion substance into the insulation layer. The diffusion source may be applied by screen printing, inkjet printing or by forming a mask with openings where diffusion is to take place and diffusing the substance through opening s in the mask.

The diffusion substance of a diffusion source may also be diffused into the insulating layer by:

a) depositing a diffusion source onto the surface of the semiconducting material before the insulating layer is formed, the diffusion source being a source of a substance which promotes preferential etching of the insulating layer when diffused into the insulating layer, the diffusion source being deposited onto the insulating layer in locations where openings are to be formed in the insulating layer;

b) forming the insulating layer over the semiconductor material and diffusion source whereby the substance is incorporated into the insulating layer in the locations where the diffusion source was deposited;

c) etching the insulating layer with an etchant that preferentially etches the insulating material into which the substance has been diffused. When the semiconductor material is silicon, the insulating layer may be a silicon based dielectric such as silicon nitride or silicon dioxide and the substance diffused into the insulating layer may be phosphorous. The doped insulating layer material bay be removed with a HF etch. After the insulating layer has been selectively etched, the semiconductor material exposed by the insulating layer etch may then be surface etched, if necessary, to remove a thin layer of surface semiconductor material containing the substance diffused into the insulating material, in which case the etchant for the semiconductor material may be NaOH.

In some embodiments a second contact type may be formed on the same surface of the device as the first contact type, in which case the method may comprise:

a) forming an opening in the insulating layer exposing the overlying semiconductor material layer, and b) forming a metal layer extending into the opening in the insulating layer to contact the overlying semiconductor layer. The step of forming a metal layer for the first and second contact types is preferably the same step in which case the metal associated with each contact type may be subsequently separated by patterning the metal layer or alternatively the metal may be applied by a method that permits patterning as the metal as it is formed such as an inkjet deposition technique. The inkjet deposition might be in one Or more separate steps. The first and second contact types may be formed as two sets of interdigitated contacts on one side of the device. The interdigitated contacts may be formed as sets of finger shaped contacts interconnected by a busbar and the fingers of each set are interdigitated.

Another method of opening masking layers and insulation or dielectric is by ablating the layer using a laser. When an opening is also required in a semiconductor layer, this may also be performed by ablating the semiconducting material using a laser. In some cases the laser ablating of the semiconductor material may be followed by a chemical etch to extend the opening in the semiconductor material under the edges of the opening in the masking layer to form an undercut region extending around the entire periphery of the opening in the masking layer whereby the undercut region extends entirely across the overlying semiconductor material layer.

According to a third aspect, a contact structure, for contacting an underlying layer of a semiconductor junction, is provided wherein the junction comprises the underlying layer of a semiconductor material of a first dopant polarity, an overlying layer of a semiconductor material oppositely doped to the underlying layer, and a first contact type comprises an opening in the semiconductor material extending through the overlying semiconductor material layer to expose the underlying semiconductor material layer, and a metal layer extending into the opening in the semiconductor material to contact the underlying semiconductor layer whereby the metal is separated from the overlying layer such that it does not bridge the semiconductor junction.

The contact structure may include an insulating layer over the overlying layer of semiconductor material, and a opening in the semiconducting layer which is located under an opening in the insulating layer. The opening in the semiconductor material preferably extends under the edges of the opening in the insulation layer to form an undercut region extending around the entire periphery of the opening in the insulating layer, the undercut region extending entirely across the surface of overlying semiconductor material layer in the opening. The undercut region may define a void separating the metal layer from the surface of overlying semiconductor material or alternatively the insulating layer over the undercut region may be deformed into the opening in the semiconductor material to isolate the overlying semiconductor region from the metal layer formed over it. The deformed portion of the insulating layer may be made thinner than the remainder of the insulating layer to promote its collapse into the opening.

Embodiments may also include a second contact type comprising:

a) an opening in the insulating layer exposing the overlying semiconductor material layer, and b) metal layer extending into the opening in the insulating layer to contact the overlying semiconductor material layer. The first and second contact types may be formed as two sets of interdigitated contacts. Each set of contacts may comprise a set of finger shaped contacts interconnected by a busbar and the fingers of each set may then be interdigitated.

According to a fourth aspect a method of processing a semiconductor structure in a manufacturing process comprises selectively placing a processing agent directly onto a surface to be processed in only those locations where processing is required, by moving a substrate carrying the semiconductor structure and a print head relative to one another and depositing the processing agent onto the structure from the print head when the print head is positioned over the locations where processing is required.

Preferably the method comprises placing the substrate on an X-Y table under a fixed print head and operating the X-Y table to progressively move all of the locations requiring processing under the print head.

The above method may be extended further by locating a laser over the X-Y table and operating the laser when locations to be processed are located under the laser, either before or after the depositing of the agent in the respective location, to influence the process, such as by heating the location to be processed to accelerate processing.

The process may be further enhanced by constraining the drops of processing agent providing better positional control over the deposition process. This can be achieved, for example, by adjusting the viscosity of the processing agent, such as by adding an additive to the processing agent, such as a thickener. This can alleviate the need for a hydrophobic surface when inkjet printing. Using this technique allows lines and grooves to be formed directly, by enabling the printing of the processing agent (in this case an etchant) in abutting or slightly overlapping dots without the agent dispersing significantly from the deposited location.

Processing may also be restricted in area by using a processing agent carried in a volatile solvent which commences to evaporate off after deposition such that the active agent is concentrated in a smaller area over time. Initially the agent will be diluted and will not react quickly but as it is concentrated by evaporation the area contacted will diminish and the increased concentration will accelerate the process. Evaporation may also be accelerated by laser heating.

In the case where a small hole is required to be etched, this can be achieved by Inkjet printing a diluted etchant onto a hydrophobic surface layer and using subsequent evaporation of the etchant to reduce the droplet size while simultaneously increasing the etch rate so as to produce a hole through the surface layer of smaller diameter than the original droplet.

Alternatively a hydrophobic surface coating may be applied to the semiconductor structure prior to depositing the processing agent, whereby the processing agent when deposited forms tight droplets which do not spread out on the surface thereby providing better positional control over the deposition process.

The hydrophobic layer may simply be an ultra-thin layer that merely alters the surface characteristics of the structure without inhibiting the process in which case a process might be performed through the ultra-thin hydrophobic layer. However in some cases the hydrophobic layer will present a barrier to the process and it is then used as a mask and an etching step is performed to remove the hydrophobic layer in the locations where farther processing is required. After the further processing the hydrophobic layer may be removed or might in some cases remain as part of the structure for further steps or may be retained in the finished structure.

An example of the case where the hydrophobic layer is ultra thin and processing is performed through the layer, involves etching small holes in a non hydrophobic surface by adding an extremely thin activating layer that is thick enough to make the surface sufficiently hydrophobic for inkjet printing, but thin enough that the etchant can penetrate through pin-holes in the activating layer and thereby etch the surface as desired.

Typically the deposition process will result in dots of processing agent being deposited and in the case of an etching process in a mask material, where the etchant has been deposited from a print head, this will result in a mask in which a series of holes are formed. In some cases it is desirable to form grooves in a mask rather than holes, so that a process in the underlying material can be performed on a strip of the surface. In this case the mask can be formed in two steps by first forming a series of closely spaced holes and then depositing etchant on the spaces between the holes to remove the material between the holes to form grooves in the mask.

On the other hand if the mask is being used to control the formation of a groove in the surface of the underlying material this can be achieved by initially inkjet printing a row of closely spaced droplets of etchant onto a hydrophobic surface layer to produce holes through this surface layer to expose the underlying material, as described above. This allows subsequent etching of the underlying material so as to undercut the surface layer sufficiently to allow the holes in the underlying material to join and form a groove.

While many of the processes made possible by localised printed deposition with an inkjet head are etching processes, other processes are also possible such as the laying down of patterned layers of materials such as insulators or dopant sources without requiring masking. In fact, with an appropriately designed print head, most processing materials could be applied using inkjet printing. In the case of dopant sources, a liquid dopant source can be applied to a semiconductor surface or possibly to a surface of a thin overlying layer through which the dopant is capable of diffusing and the structure heated to drive the dopant into the surface.

One method of heating the dopant source, to drive in the dopants, would be to locally heat the locations at which the dopant source has been applied, immediately after the dopant source has been deposited, using a laser as discussed above.

An inkjet printing method may also be used to produce undercut openings in a surface of a semiconductor structure having a non-semiconductor surface layer such as a dielectric or other insulating layer. This method comprises applying a first etchant which etches the surface layer to open the surface layer at the desired location and then applying a second etchant which etches the semiconductor material and does not etch or does not strongly etch the surface layer (i.e. the second etchant etches the semiconductor material significantly more strongly than it etches the surface layer). The second etchant will open a hole in the semiconductor material under the opening in the surface layer and will etch sideways under the edges of the surface layer to undercut the surface layer.

The undercutting technique described above may be used to provide a structure for a contact to an underlying doped layer of a junction whereby a following metallization step creates a void between the metal layer and the upper walls of the opening in the semiconductor material by virtue of the undercut, such that the metal contacts the underlying doped region in the bottom of the opening but is separated from an upper oppositely doped layer of the junction by the void formed under the edges of the surface layer.

According to a fifth aspect, a processing apparatus comprises supporting means to support a work piece to be processed, an inkjet print head mounted relative to the supporting means, whereby the punt head can be brought into operative juxtaposition with the work piece when the work piece is mounted on the supporting means, process agent supply means in communication with the print head to supply process agent as required, a control unit programmable with a pattern for processing a surface of the work piece, the print head and support means being movable relative to one another under control of the control unit and the control unit being operable to control the relative movement of the print head and the support means to scan the print head over a surface of the work piece to be processed and to control operation of the print head to deposit the agent on the work piece at locations determined by the programmable pattern.

According to a sixth aspect, a method is provided for applying a processing agent to a surface of a semiconductor structure, the method including:

i) placing the structure on a carrier of an inkjet print mechanism where a source of the process agent is connected to a print head of the print mechanism; and ii) scanning the print head relative to the semiconductor structure such that the print head passes over the locations where the process agent is to be applied and operating the print head to apply the process agent when a location to which the process agent is to be applied is positioned under the print head.

Preferably the print mechanism includes an X-Y table that moves the structure being processed in two dimensions under a fixed print head.

In a particularly preferred embodiment the print mechanism includes multiple print heads operable independently or in combination to deposit a plurality of different process agents onto a device being processed during one or more fabrication processes. In one embodiment 8 print heads are provided, one connected to a liquid dielectric layer source such as silicon dioxide, one connected to a liquid n-type spin-on diffusion source such as phosphorus, one connected to a p-type liquid spin-on diffusion source such as boron, one connected to an acid base etchant for etching silicon dioxide, one connected to an alkali etchant such as sodium hydroxide for etching silicon etc, one connected to a liquid with metal ions/particles and one or more connected to sources of, solvents or other solutions for diluting any of the materials in the other heads.

Preferably also the print structure also includes a laser which can be used to perform heating or scribing steps while the structure is being printed with process agent (at an offset location). Preferably the print mechanism includes multiple lasers operable independently or in combination to heat or ablate localised regions of the device being processed or material deposited on device being processed during one or more fabrication processes. In one preferred embodiment two laser heads are provided, one operating at 1.064 micron wavelength light and the other at 0.532 micron wavelength light. Each laser head is switch-able between operating in Q-switched mode or continuous wave operation.

The laser and print head are each operable under control of the control unit to selectively deposit the process agent and to co-operatively expose the work piece to laser illumination (for heating, and/or ablation processes) at locations determined by the programmable pattern.

According to a seventh aspect, a contact structure is provided, for contacting an underlying layer of a semiconductor junction, wherein the junction comprises the underlying layer of a semiconductor material of a first dopant polarity, an overlying layer of a semiconductor material oppositely doped to the underlying layers an insulating layer over the overlying layer of semiconductor material, an opening in the insulating layer exposing the semiconductor material, an opening in the semiconductor material under the opening in the insulating layer extending through the overlying semiconductor material layer to expose the underlying semiconductor material layer, the opening in the semiconductor material extending under the edges of the opening in the insulation layer to form an undercut region extending around the entire periphery of the opening in the insulating layer whereby the undercut extends entirely across the overlying semiconductor material layer, and a metal layer extending into the opening in the semiconductor material to contact the underlying semiconductor layer and defining a void between the metal layer and the overlying semiconductor material layer in the undercut region, whereby the metal does not bridge the semiconductor junction.

BRIEF DESCRIPTION OF THE DRAWINGS

Embodiments of inkjet processing methods will now be described, by way of example, with reference to the accompanying drawings in which.

Figure 1:
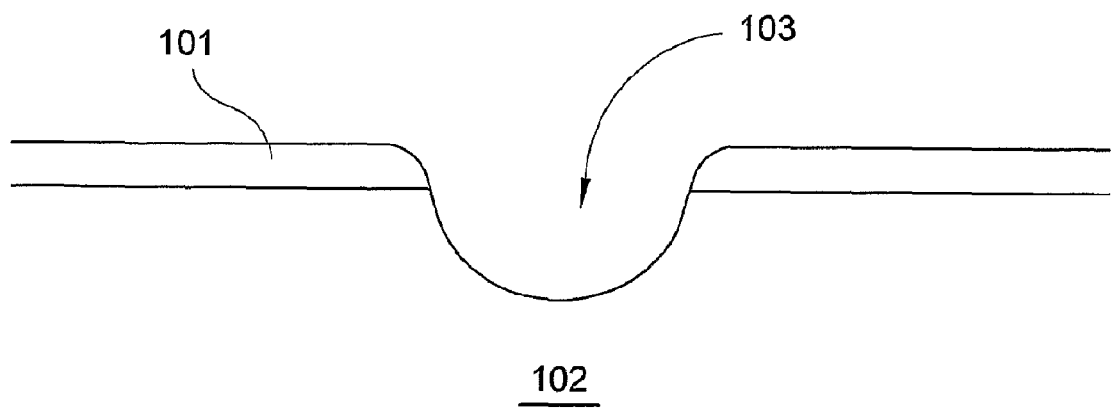
FIG. 1 diagrammatically illustrates a constructional element of a semiconductor device that can be formed by several different processes using inkjet printing techniques.

DETAILED DESCRIPTION OF EMBODIMENTS OF SOLAR CELL STRUCTURES AND METHODS OF FORMING THEM

A new approach is described herein for enabling a metal contact to be applied to a layer or region of semiconductor material buried beneath another layer or region of semiconductor material doped with the opposite polarity. When making contact to the buried layer, achieving electrical isolation from the overlying semiconductor material of opposite polarity is of great importance, particularly in a photovoltaic device. An extension of this approach to contacting buried layers is the formation of metal contacts of both polarities from the same side of a device, while simultaneously providing excellent electrical isolation between the two polarities. This approach to forming contacts to buried layers also makes possible the formation of both polarities of metal contact with a single metal deposition process and it also makes it possible to form contacts to silicon material with a wide range of possible doping concentrations down to values below $1\times10^{16}$ atoms/cm$^3$.

This method of contacting buried layers and forming two polarities of contact on one side of a device is applicable to devices formed on wafers and thin films and a likely future application of the method is to thin wafers or layers of silicon too thin to easily process without breakage such as in the range 10 to 120 microns. Such thin wafers could be bonded such as electrostatically to a supporting structure such as borosilica glass to provide the mechanical support and strength during subsequent device fabrication. Once bonded to such a supporting substrate or superstrate, a range of limitations are then placed on subsequent device processing conditions. These include necessitating formation of both polarities of metal contact from the same side of the device and also being restricted to low temperature processes to avoid contamination of the silicon and also problems from the mismatch in the thermal expansion coefficients between the silicon and the supporting layer. The latter prevents the use of many conventional thermal processes such as diffusion of dopants into the silicon, thermal oxidation of the silicon, and firing of metal contacts above 500 degrees Celsius. In this scenario, the present method of contacting buried layers solves many challenges, by: firstly, facilitating contact to both polarities of silicon from the same side of the device; secondly by facilitating contact to lightly doped silicon material of both polarities; and thirdly, through the use of chemical oxidation to simultaneously passivate exposed silicon surfaces and provide the oxide layer for a metal-insulator-semiconductor (MIS) contact.

Inkjet Printing

While a variety of processing methods can be used to perform this method of contacting buried layers and forming two polarities of contact on one side of a device, inkjet printing is seen as a suitable alternative method for carrying out a range of processes involved in the fabrication of solar cells in general and in particular devices having contacts formed to buried layers and devices having two polarities of contact on one side of a device. These include approaches for forming localised metal contacts through a passivating dielectric layer onto the surface of the semiconductor material; the formation of grooves in the surface of the semiconductor material to facilitate the fabrication of the buried contact solar cell; carrying out edge junction isolation around the perimeter of the semiconductor wafer; facilitating the formation of holes through a surface semiconductor layer of one polarity to facilitate the formation of ohmic contacts to an underlying layer of semiconductor material of the opposite polarity while avoiding shunting to the surface semiconductor layer of the first polarity; the formation of interdigitated contacts of opposite polarity on the same surface of the semiconductor wafer; the formation of textured surfaces for light trapping purposes or reduced surface reflection; the formation of holes or lines through a range of dielectric layers or polymer layers or metal layers or semiconductor layers; for forming localised doped regions of a given polarity through the ink-jet printing of dopant sources; etc.

In many of the processes described above, an appropriate etching solution or solvent is used by the inkjet printer to chemically react with or dissolve the material onto which the solution is inkjet printed. Other non-etching processes are also envisaged such as the inkjet printing of dopant sources onto the semiconductor film.

The material to be etched is often a masking layer, with the printed etchant used to produce holes or lines through the masking layer to expose the underlying layers or semiconductor material for subsequent processing. Examples of materials being etched include silicon dioxide, silicon nitride, titanium dioxide, zinc sulphide, magnesium fluoride, silicon monoxide, silicon oxide, a range of metals including aluminium, and a range of semiconductors including silicon, a range of polymers, etc. In general, the surface to be inkjet printed needs to be hydrophobic, or the solution deposited by the inkjet printer should have a characteristic that resists spreading, so that the etchant solution deposited by the inkjet printer will form individual droplets rather than smearing across the surface thereby losing definition such as is generally the case if the surface is hydrophilic. To achieve hydrophobic surface characteristics, some materials such as silicon need to be treated such as chemically with an appropriate solution so as to transform the surface properties into being hydrophobic instead of hydrophilic. For example, the native oxide that grows on silicon will in general transform it into being a hydrophilic surface, whereas exposure to hydrofluoric acid will transform the silicon surface into being hydrophobic and therefore suitable for inkjet printing.

Additives such as glycerol can also be added to the etchants or solutions to be printed, to modify the surface tension of the droplets formed and therefore aid the printing process and droplet formation on the surface of the material being printed.

Alternatively, inert thickeners can be added to the etchant solutions needing to be printed to increase the viscosity of the solution so that it no longer relies on the presence of a hydrophobic surface for the printed droplet to retain its form/shape as it comes into contact with the surface. The viscosity needs to be high enough so that the droplet when sitting on the surface of the material being printed will retain its three dimensional form rather than smearing across the surface.

A sacrificial or additional layer that has hydrophobic properties can also be deposited onto the surface of the layer or material into which the holes or grooves are to be formed. This sacrificial or additional layer can then be inkjet printed with an appropriate etchant to then expose the underlying material or layer in the regions where etching is required. The sacrificial or additional layer then acts as a mask while the underlying layer or layers or materials are etched and can be removed subsequently if desired.

Figure 2:
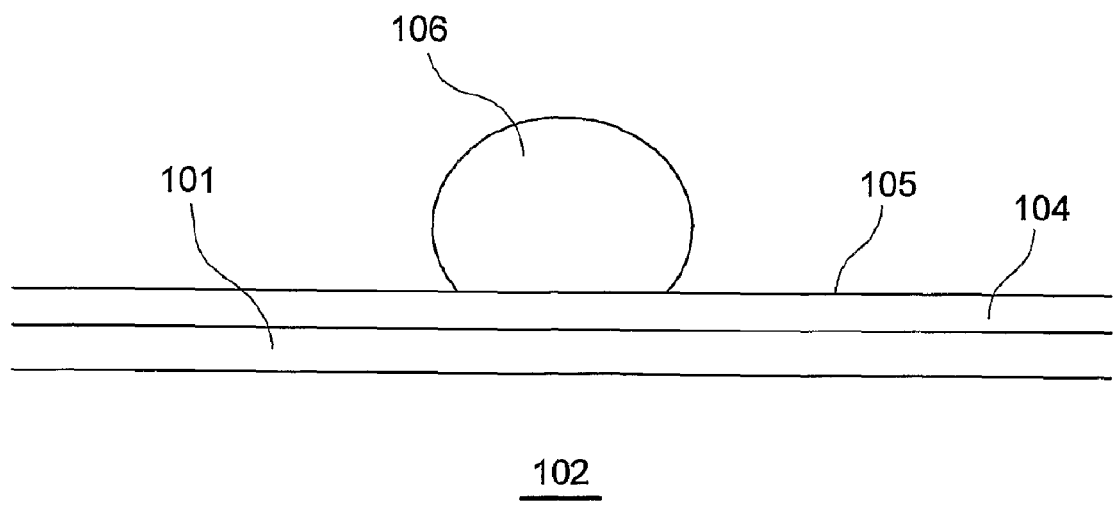
FIG. 2 diagrammatically illustrates the first steps in a first method of forming the element of FIG. 1.
Figure 3:
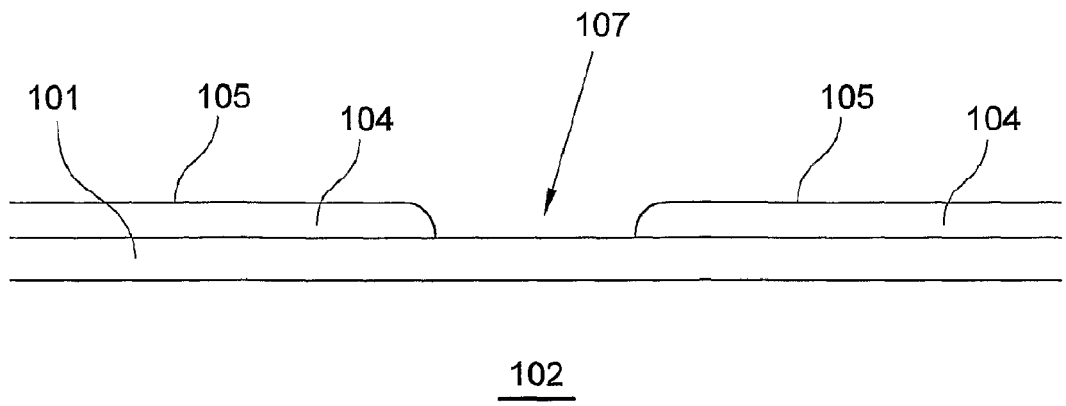
FIG. 3 diagrammatically illustrates the device of FIG. 1 after the steps of FIG. 2 have been completed.
Figure 4:
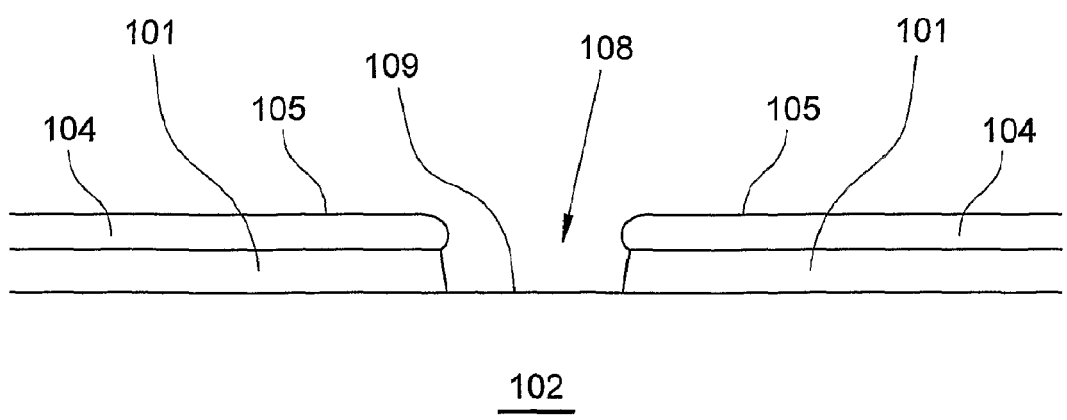
FIG. 4 diagrammatically illustrates the device of FIG. 3 after a further etching step has been completed.

FIG. 1 provides an example of a process where an opening 103 is opened through a silicon dioxide layer 101 and into the underlying silicon material 102 and which may use one or more inkjet printing steps. Referring to FIG. 2 a sacrificial layer of resin 104 such as P150 (white organic resin or "paint"), is deposited onto the silicon dioxide layer 101 and that produces a hydrophobic surface 105. The hydrophobic surface 105 is then inkjet printed with a droplet of sodium hydroxide based etchant 106 to locally etch the P150 material. This etchant 106 will form an opening 107 in the P150 material but leave the silicon dioxide layer 101 unaffected as shown in FIG. 3. An etchant for the silicon dioxide (such as dilute HF) that does not attack the P150, is used to etch an opening 108 through the silicon dioxide layer 101 to expose the underlying silicon 102 as shown in FIG. 4. The sodium hydroxide etchant can then again be used if necessary to both remove the P150 layer while simultaneously etching the silicon surface 109, exposed by the opening 108 to produce the structure of FIG. 1.

In some cases, the contact area between the printed droplet and surfaces to be etched is important. This can often be adjusted for a given droplet size by adding materials such as glycerol to the etchant or solution to be printed so as to alter the contact angle by changing the surface tension of the droplet. In general, adding glycerol or similar will improve the contact angle and therefore reduce the interface area between the droplet and the surface.

Figure 5:
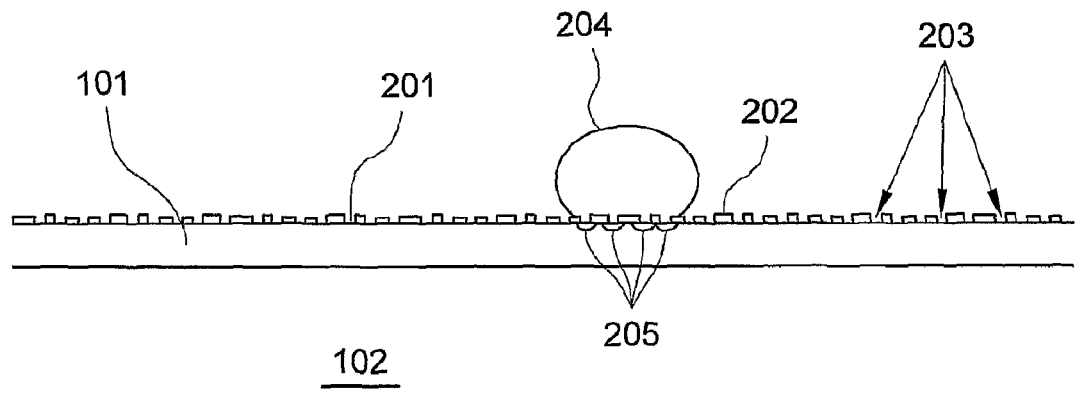
FIG. 5 diagrammatically illustrates the first steps in a second method of forming the element of FIG. 1
Figure 6:
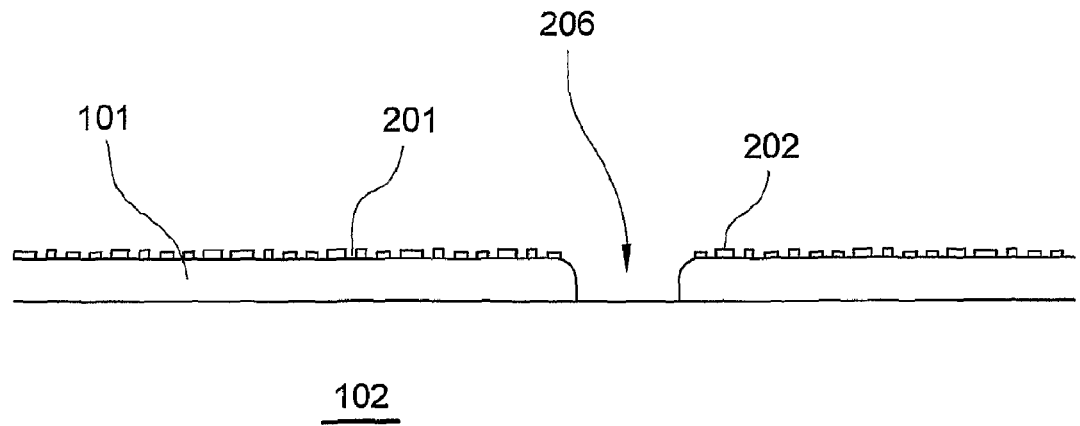
FIG. 6 diagrammatically illustrates the device of FIG. 5 after a anther etching step has been completed.
Figure 7A:
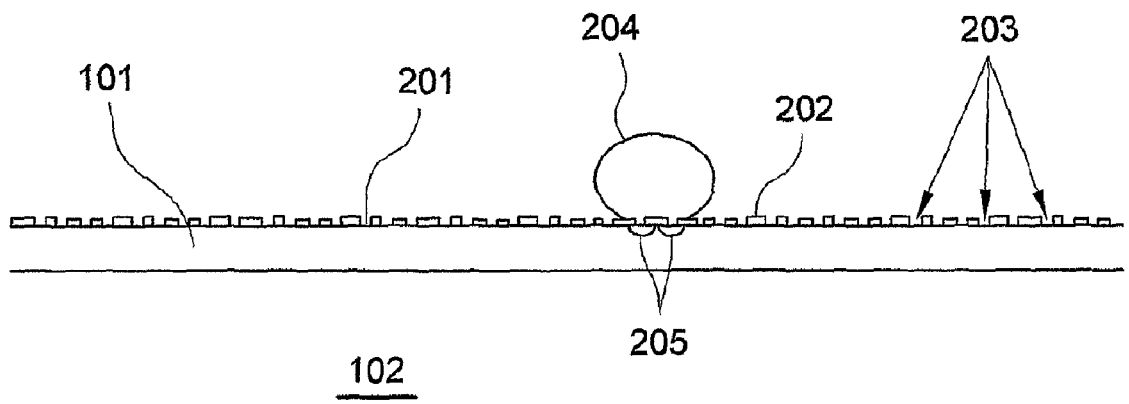
FIG. 7(a) diagrammatically illustrates the first steps in a third method of forming the element of FIG. 1.
Figure 7B:
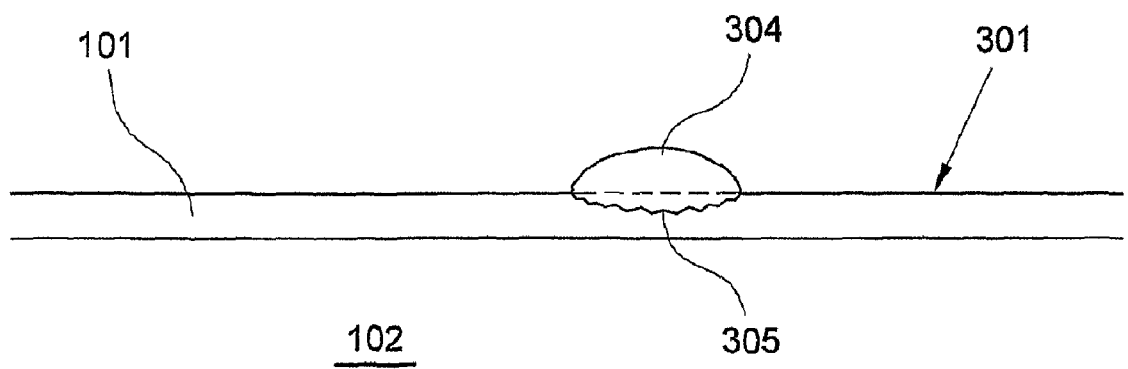
FIG. 7(b) diagrammatically illustrates the device of FIG. 7(a) after partial completion of a further etching step.

Referring to FIG. 5, another approach for inkjet printing an etchant onto a surface 201 that is not sufficiently hydrophobic for the desired process is to deposit a sufficiently thin activating layer 202 that is too thin to avoid a high density of pinholes 203, but thick enough to make the surface much more hydrophobic than the non activated surface. Depending on the activating material being used, the thickness required for the activating layer 202 to give hydrophobic properties may only need to be 10-1000 angstroms. This concept is shown in FIG. 5 where such an activated surface 202 is inlet printed with an etchant 204 that will attack the silicon dioxide layer 101, initially through the pinholes 203, but subsequently openings 205 in the silicon dioxide will be etched sideways immediately adjacent to the pinholes 203 until a larger opening 206 is formed in the silicon dioxide 101 as shown in FIG. 6. This approach can be particularly beneficial when holes which are require to be formed in the silicon dioxide layer 101 are significantly smaller than the droplet diameter of the printed droplet, since the activating layer can make the surface sufficiently hydrophobic so that little of the droplet actually contacts the surface to be etched. By comparing FIGS. 7 (a) and 7 (b) it can be seen how a smaller hole can be formed through the oxide 101 when the surface 201 is made more hydrophobic by adding an activated surface 202 as seen in FIG. 7 (a) compared to the unactivated surface 301 in FIG. 7 (b) which is not as hydrophobic therefore enabling more of the etchant droplet 304 to contact the silicon dioxide layer 101 and therefore etch a hole 305 having a larger area.

Figure 8A:
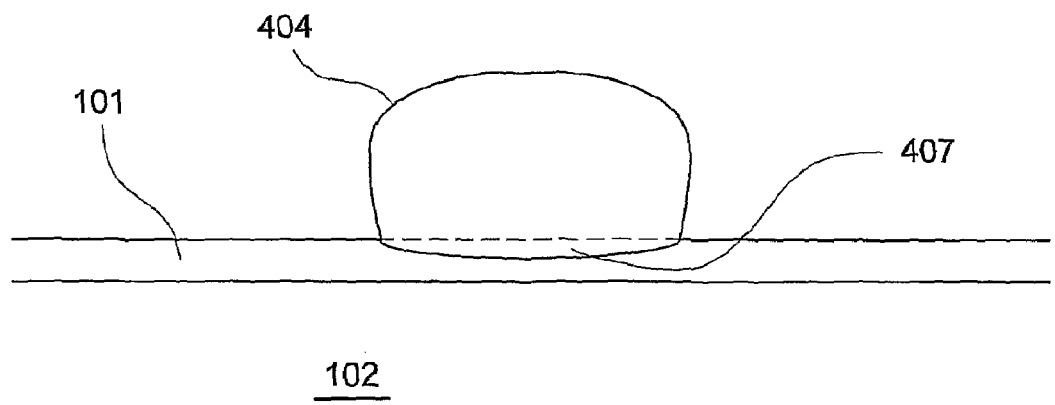
FIG. 8(a) diagrammatically illustrates the first steps in a fourth method of forming the element of FIG. 1.
Figure 8B:
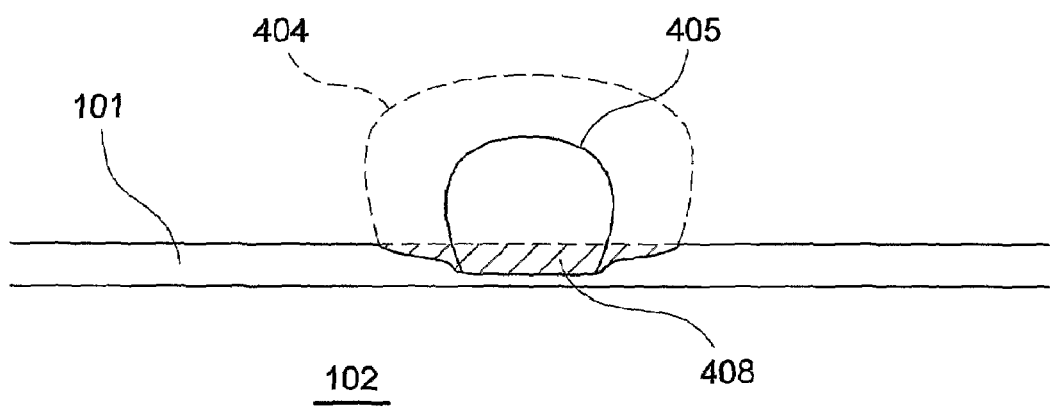
FIG. 8(b) diagrammatically illustrates the device of FIG. 8(a) after partial completion of a further etching step.
Figure 8C:
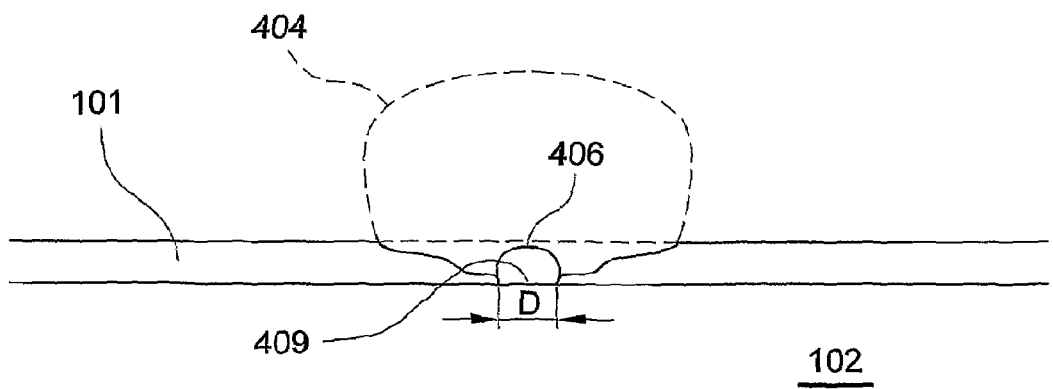
FIG. 8(c) diagrammatically illustrates the device of FIG. 8(b) after completion of the further etching step.

Referring to FIGS. 8 (a), (b) & (c) Another approach for achieving smaller etched holes than the diameter of the smallest possible inkjet printed droplets 404 (see FIG. 8 (a)) is to use a diluted etchant that is able to partially evaporate during the etching process to result in progressively smaller droplets 405, 406 as seen in FIGS. 8 (b) & (c). Using this approach, the etch rate is initially slow immediately after printing due to the high dilution of the etchant in the droplet 404, producing a broad, shallow etched depression 407 as shown in FIG. 8 (a), but then increases as the droplet partially evaporates and the etchant concentration increases causing the etching to be concentrated in a smaller area 208 as shown in FIG. 8 (b) and eventually an even smaller area 409 when the hole through the layer is complete as shown in FIG. 8 (c). This etching process shown in FIGS. 8 (a)-(c) can often be accelerated by heating to speed up both the rate of evaporation and the rate of reaction. As shown in FIG. 8 (c), the diameter "D" of the hole etched in the layer can be significantly less than the diameter of the initial droplet 404.

Referring to FIG. 9 (a) to (f), to produce grooves in the semiconductor material, three approaches can be used based on inlet printing. The first involves producing a line of droplets 450 closely spaced on the surface of the layer 101 to be etched as seen in FIG. 9 (a). As illustrated in FIG. 9 (b) each of these droplets 450 subsequently etches a hole 454 through the dielectric or other layer 101 therefore exposing the semiconductor material 102 underneath. Subsequent etching of the semiconductor material 102 creates holes 455 which undercut the oxide 101 as seen in FIG. 9 (b) and eventually the undercut regions join under the holes 454 in the dielectric layer 101 produce a continuous groove 456 within the semiconductor material 102 running under portions of the dielectric 101 as seen in FIGS. 9 (c) and (d).

The second approach is to print a line of droplets 501 producing closely spaced on the surface of the layer 101 to be etched as seen in FIG. 9 (e). As illustrated in FIG. 9(f) each of these droplets 501 subsequently etches a hole 503 through the dielectric or other layer 101 therefore exposing the semiconductor material 102 underneath. Additional droplets are then printed onto the un-etched portions between the holes to etch away the remaining bridges 104 of dielectric material allowing lines rather than individual holes to be formed through the dielectric layer 101. Grooves can then be subsequently etched into the exposed underlying material 102 if desired.

The third approach is to use thickeners in the etchant solution as described above and to print a series of overlapping droplets 508 so as to produce a continuous printed line on the surface of the material layer 102 to be etched. This then creates an etched line or groove 509 within the dielectric 101 or other layer (as seen from the top in FIG. 9(h)) therefore exposing a line on the surface of the semiconductor material 102. Again, subsequent etching of the semiconductor material will therefore lead to the formation of a groove within the semiconductor material. Due to the range of materials needing to be etched for the range of processes required in solar cell fabrication, a range of etching solutions are therefore required, some of which are alkaline and some of which are acidic in nature. A range of different viscosities is also required depending on the nature of the surface to be printed. It is therefore also beneficial to use inkjet printing heads made from a range of materials such as silicon or carbon or stainless steel for many acidic solutions, but silica or stainless steel or gold plated heads for some alkaline solutions such as sodium hydroxide. The inkjet printing process has to be optimised for each etchant type and also for each different viscosity of solution.

Detailed Examples of the Implementation of Inkjet Printing Processes

1. Localised Metal Contact Formation

The structure of FIG. 10(a) can be produced by initially oxidising a silicon wafer 102 to form the silicon dioxide layer 101 (or simply depositing a silicon dioxide layer 101 onto the surface of the silicon wafer 102) and subsequently treating the surface of the silicon dioxide so as to make it hydrophobic. This can be done either through chemical treatment of the surface or the deposition of a very thin sacrificial layer onto the surface of the silicon dioxide which transforms the surface into being hydrophobic. Alternatively instead of making the surface of the silicon dioxide hydrophobic, additives can be added to the etchant to alter the surface tension of the printed droplets, or a combination of these methods can be used. Droplets of the etching solution are then inkjet printed onto the surface wherever holes are required. The etchant then produces the opening 601 in the silicon dioxide layer as shown in FIG. 10(a), therefore allowing subsequent deposition of a metal contact layer 602 such as by sputtering, evaporation or screen-printing to provide electrical contact to the underlying silicon material 102.

An alternative approach not relying on the use of a hydrophobic surface is to add thickeners to the etching solution to increase its viscosity so that the droplet that is inkjet printed retains its three dimensional shape when coming into contact with the surface of the silicon dioxide layer 101 rather than wetting the surface and smearing across it. In this case, where the surface dielectric is silicon dioxide, an etchant is required that will react with and remove the silicon dioxide. An example of such an etchant is one that contains some hydrofluoric acid. Instead of the use of silicon dioxide, other dielectric layers could also be used such as silicon nitride or titanium dioxide, etc. For different dielectric or surface passivating layers, the composition of the etchant solution will often need to be varied. Another variation to the formation of the structure of FIG. 10(a) is that either n-type or p-type dopants can be diffused into the surface of the silicon material in the regions where the openings in the oxide have been produced to form a heavily doped region 603 under the opening 602 in the silicon dioxide layer 101. This will then allow the metal layer 602 to make good ohmic contact to these diffused regions independently of the substrate doping and its polarity. This structure is shown in FIG. 10(b) and has been demonstrated to achieve very high voltages and efficiencies for silicon solar cells using this structure across the rear surface of the devices. The localised diffusion in these devices needs to be followed by a step that allows for the removal of any diffusion oxide deposited onto the surface of the silicon so as to facilitate subsequent good ohmic contact between the subsequently deposited metal and the underlying doped silicon material. In some cases it is beneficial to increase the metal/silicon interface area or vary the geometry as shown in FIG. 1 and in FIG. 10(c) by etching away some of the silicon 102 to form a well 604 to provide a greater area of interface between the contact metal 602 and the silicon. The metal layer 602 is then either applied to directly contact the silicon 102 or the heavily diffused region 603 can be formed on the surface of the silicon prior to applying the metal contact 602. These structures can use an $n^{++}$ diffused region on a p-type silicon substrate or alternatively a $p^{++}$ diffused region on an n-type silicon substrate.

Figure 10A:
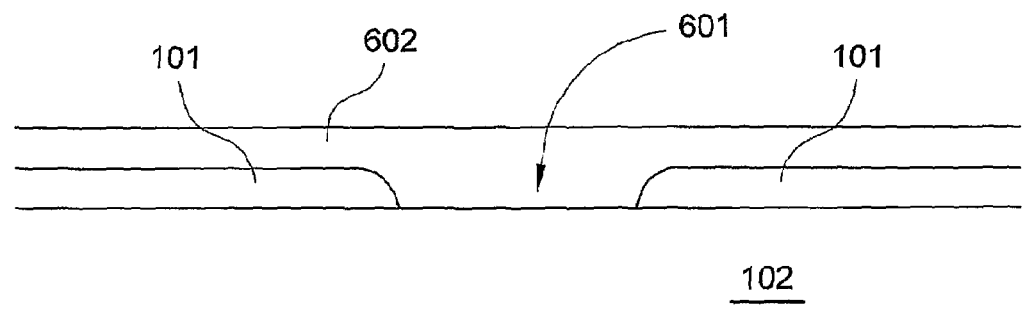
FIG. 10(a) diagrammatically illustrates a contact structure that can be formed using the methods described with reference to FIGS. 2 to 6 as well as FIGS. 7(a) to 7(b) and 8(a) to 8(c)
Figure 10B:
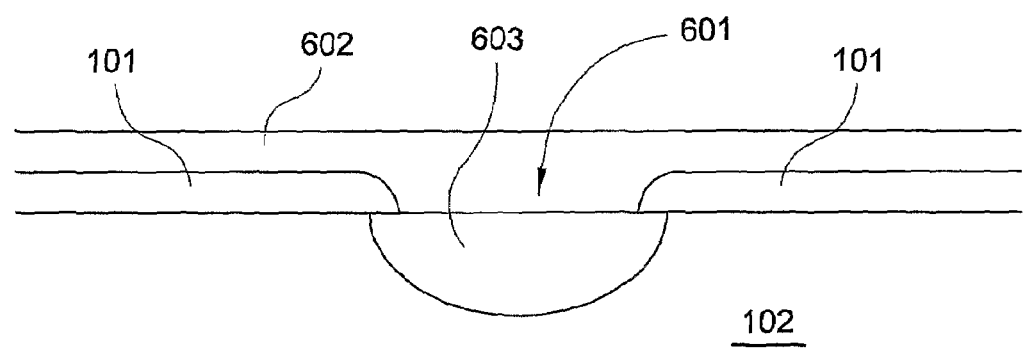
FIG. 10(b) diagrammatically illustrates the contact structure of FIG. 10(a) in which a further step has been performed to add a heavily doped region under the contact before adding the metal layer.
Figure 10C:
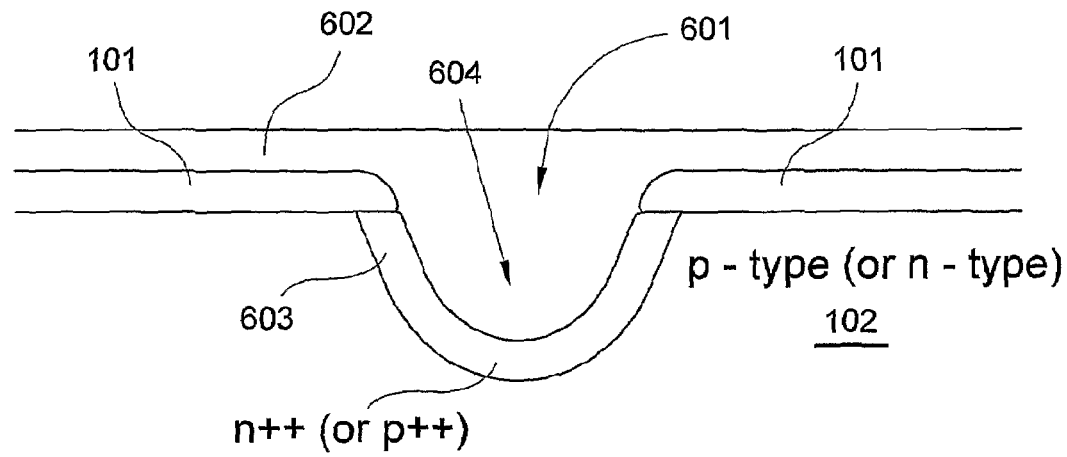
FIG. 10(c) diagrammatically illustrates a variation on the contact structure of FIG. 10(b)

Another variation of the structures of FIGS. 10(a) and (b) is to produce lines rather than holes through the silicon dioxide or other dielectric layer. As described earlier, these lines can be produced by using a higher viscosity etchant that can be printed as a line since it does not rely on the surface tension of the individual droplets and a hydrophobic surface to enable the inkjet printed material to retain its three dimensional form. Alternatively, lines can be produced by printing a row of droplets closely spaced and then subsequently etching as much of the semiconductor material as is necessary to allow the holes to join and produce a groove instead of the well 604 within which the contact is formed. Subsequent localised diffusion of either n- or p-type dopants can again be used with the lines or groves so as to ensure that the subsequently deposited metal will contact highly doped regions of the semiconductor.

An alternative approach to achieving the structure of FIG. 10(b) is to initially apply a phosphorus doped spin-on diffusion source to localised regions of the silicon dioxide layer 101 beneath which localised n-type diffused regions 603 are to be formed. The phosphorus source can be applied in a range of ways such as by inkjet technology or screen-printing. Subsequent heating of either the whole wafer, or just localised regions (such as with a laser) where the dopant source has been deposited, can be used to drive the phosphorus dopants through the silicon dioxide layer 101 and into the surface of the silicon wafer 102 to produce the heavily doped region 603. The residual high phosphorus concentration within the silicon dioxide greatly increases its etch rate such as in hydrofluoric acid, thereby allowing the formation of the opening 601 while incurring minimal etching of the remainder of the undoped silicon dioxide 101. This exposes the surface of the doped region 603 facilitating subsequent metal contact via the deposition of the metal layer 602 as previously described. In this embodiment, the doped regions can be dots or lines and the metal 602 may contact all such doped regions or only some of them depending on the deposition technique used for the metal 602. A particular strength of this approach is the self aligned nature of the contact formation between the metal and the heavily phosphorus doped silicon. The equivalent reverse polarity structure can also be formed by using an appropriate p-type dopant to diffuse through the oxide layer instead of the n-type dopant.

2. Edge Junction Isolation

Figure 11A:
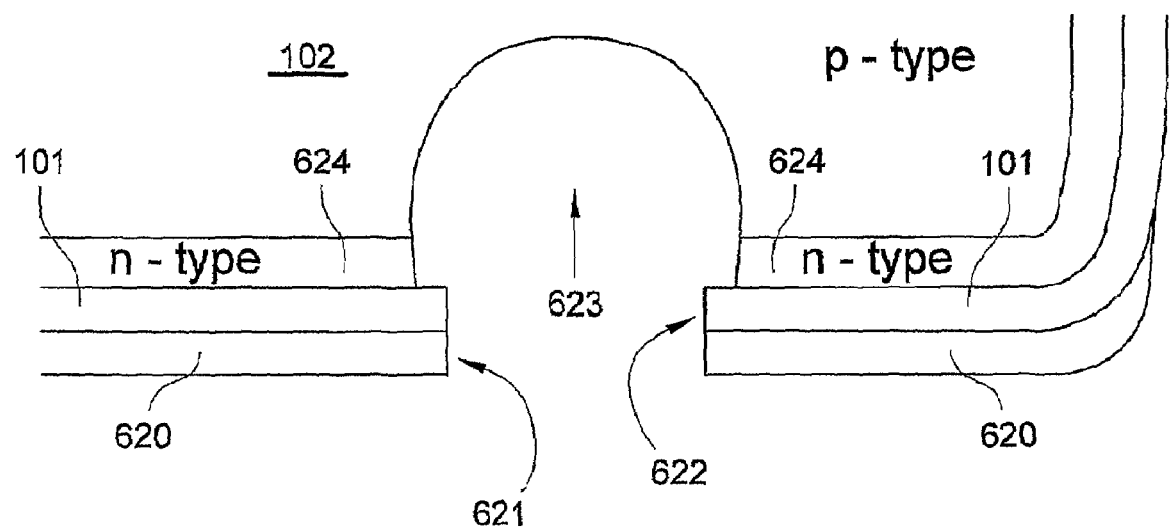
FIG. 11(a) diagrammatically illustrates a side view of an edge isolation structure of a semiconductor device that can be formed by a process using inkjet printing techniques.
Figure 11B:
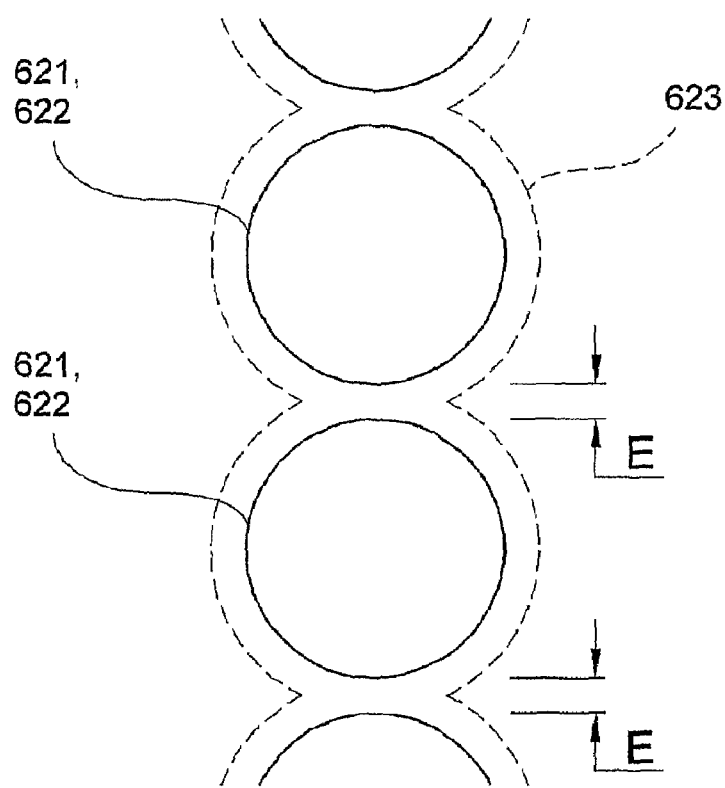
FIG. 11(b) diagrammatically illustrates a bottom view of the structure of FIG. 11(a)

In general, the diffusion of the top surface of a silicon solar cell also results in the unwanted diffusion of the same polarity of dopants down the edge of the wafer and across some of the rear surface to where the opposite polarity metal contact is usually located. This often provides the opportunity for shunting between the two metal contacts of opposite polarity. Almost all commercially manufactured solar cells therefore require extra processing to remove some of the junction in the edge region to prevent or minimise this shunting. Inkjet printing can also be used for achieving edge junction isolation as shown in FIG. 11. In the structure shown, a sacrificial layer 620 of P150 or other suitable layer such as novalac resin has been deposited onto the silicon dioxide surface 101 so as to transform it into being hydrophobic in nature. Inkjet printing can then be used to print an etchant (such as 15% sodium hydroxide) or print a solvent such acetone or glycol for the P150 layer. This etchant or solvent is deposited or printed as individual droplets in a row Tight around the edge of the silicon wafer with the droplets each being typically 50 microns in diameter and spaced on approximately 60 microns centres. Following etching of the P150, a gap "E" of approximately 10 microns is left between the holes 621 in the P150. The silicon dioxide is then etched through the holes 621 in the P150 to form corresponding holes 622 in the silicon dioxide. Placement of this wafer in a sodium hydroxide solution facilitates not only the removal of the sacrificial layer 620 of P150 but also allows the silicon 102 to be etched wherever the holes 622 in the silicon dioxide have been produced. As the silicon etches an undercut will form under the silicon dioxide layer 101 and once the holes in the silicon have been etched to 5-10 microns in depth, the juxtaposed holes will have joined each other to produce a continuous groove 623 around the perimeter of the wafer. Importantly, this achieves the structure of FIG. 11 which produces a gap in the n-type layer 624, therefore providing electrical isolation between the front and rear surfaces of the solar cell. Again, as was the case for the structure of FIG. 10, a range of variations can be used to still achieve the equivalent structure of FIG. 10. For example, if an etchant for the silicon dioxide is used which has been thickened or has a modified surface tension allowing it to be directly printed onto the silicon dioxide, the P150 can be dispensed with all together. In this case, the viscosity of the etchant could also be increased sufficiently to facilitate the printing of a continuous line of etchant rather than printing individual droplets to produce individual holes that subsequently need to be joined through etching of the substrate material.

An alternative approach to creating the openings in the silicon dioxide (or other dielectric) layer 101 without requiring the sacrificial resin layer 620, is to do the equivalent of example 1 above whereby phosphors is deliberately diffused into the silicon dioxide layer 101 so it can be preferentially etched. In this case, any unwanted phosphorus diffusing into the silicon will be automatically removed during the subsequent NaOH etch.

Figure 12A:
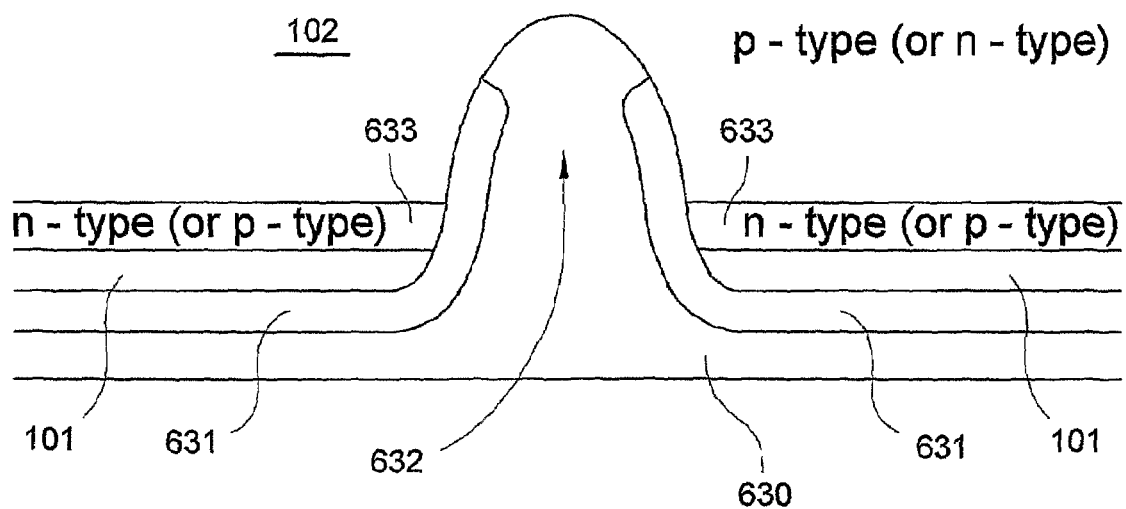
FIG. 12(a) diagrammatically illustrates a contact structure for contacting an underlying semiconductor layer can be formed by a process using inkjet printing techniques.

3. Contact to a Buried Layer of Semiconductor Through Another Semiconductor Layer of Opposite Polarity One important structure that is needed to achieve higher efficiencies than currently achievable in commercial solar cell production is the formation of ohmic contacts to a polarity of semiconductor that is buried beneath a surface layer of opposite polarity as shown in FIG. 12(a). Note that this structure is illustrated as having a p-type substrate and an n-type surface layer however the structure is equally applicable to an n-type substrate and a p-type surface layer. This structure is particularly important as it has contributed to the achievement of the highest ever recorded open circuit voltages for silicon solar cells (in excess of 720 mV under one sun conditions). In particular, the n-type surface layer 633 needs to achieve excellent electrical isolation from the opposite polarity substrate 102. It also needs to have a well passivated surface such as can be achieved through the use of high temperature thermal oxidation 101 or else the use of an appropriately deposited silicon nitride surface layer. The n-type layer 633 may even remain uncontacted as was the case across the rear surface of the silicon solar cells that currently hold the world record for the highest voltages ever achieved for silicon solar cells (S. R. Wenham et alia, "Rear Surface Effects in High Efficiency Silicon Solar Cells", Conference record, 1994 IEEE First World Conference on Photovoltaic Energy Conversion, December 1994, page 1278). This structure is also of particular importance since almost all commercially manufactured solar cells currently require an n-type diffusion to produce the emitter across the front surface of the solar cell and in the same process unavoidably also produce an n-type layer across the rear surface. At present, most manufacturers try and destroy this rear n-type layer at the rear to facilitate ohmic contact formation to the underling p-type substrate. However, better rear surface passivation can be achieved by using localised metal contacts through the n-type layer to the underlying p-type substrate as shown in FIG. 12(a). This leaves most of the rear surface well passivated by the floating junction produced by the n-type surface layer which is in turn well passivated at the silicon surface by the high temperature thermally grown silicon dioxide layer 101. Many manufacturers have attempted to produce this type of structure but have been unsuccessful due to subsequent shunting that has occurred between the n-type layer 633 and the underlying p-type substrate 102.

For example, a common approach has been to screen print aluminium paste in a grid pattern onto the rear surface of a solar cell and then fire the aluminium through the surface a-type layer so as to make contact to the underlying p-type substrate, Unfortunately, even though aluminium is a p-type dopant (valency 3), the silicon doped by the aluminium through this process has not been able to produce a good quality junction with the rear surface n-type layers, therefore leading to subsequent shunting of the p-n junction at the rear of the device. This effectively destroys the rear surface passivation otherwise potentially available through a rear floating junction. In fact, the shunting of the floating junction transforms the rear surface into one that effectively has infinite rear surface recombination velocity, therefore degrading the device voltages and current.

In the embodiment of FIG. 12(a) an organic insulation layer 631 such as novalac resin or P150 is deposited over the silicon dioxide layer 101 and openings are etched where contacts to the p-type layer are to be formed. The openings in the resin can be made by inkjet printing a NaOH solution as discussed above. Having opened the resin the silicon dioxide layer 101 can be etched with hydrofluoric acid also as discussed above. The silicon well 632 is then etched using an etchant that does not attack the resin or P150 layer 631 such as a mixture between nitric acid and hydrofluoric acid. Isolation of the edges of the well 632 is then achieved by reflowing the resin or P150 layer by applying droplets of one of the solvents of the resin such as acetone to the resin at the edges of the well or by exposing it to the vapour of one of its solvents such as acetone causing it to flow into the well 632 (note that this processing would be performed with the substrate flipped so that the well 632 opens upwardly and the P150 flows into the well). Finally the metal 630 is applied to contact the p-type silicon 102 at the base of the well 632.

Figure 12B:
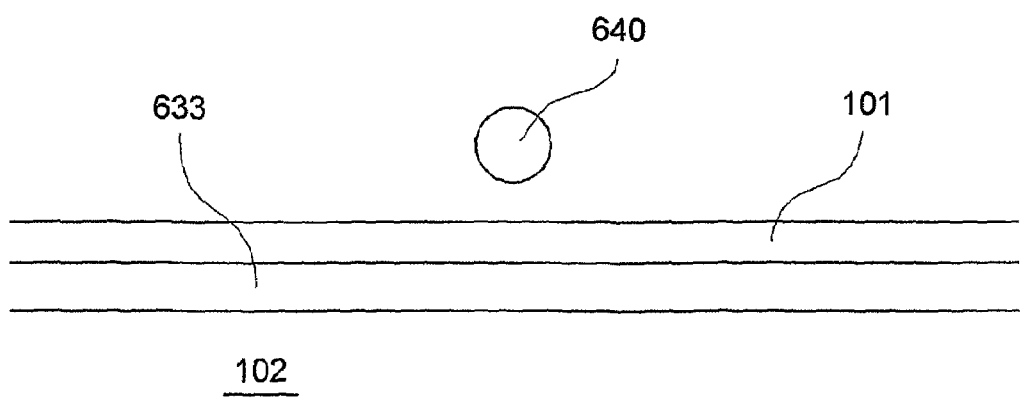
FIG. 12(b) diagrammatically illustrates an of initial step in a method of forming a contact structure which is a variation of the contact structure of FIG. 12(a) formed by a process using inkjet printing techniques.
Figure 12C:
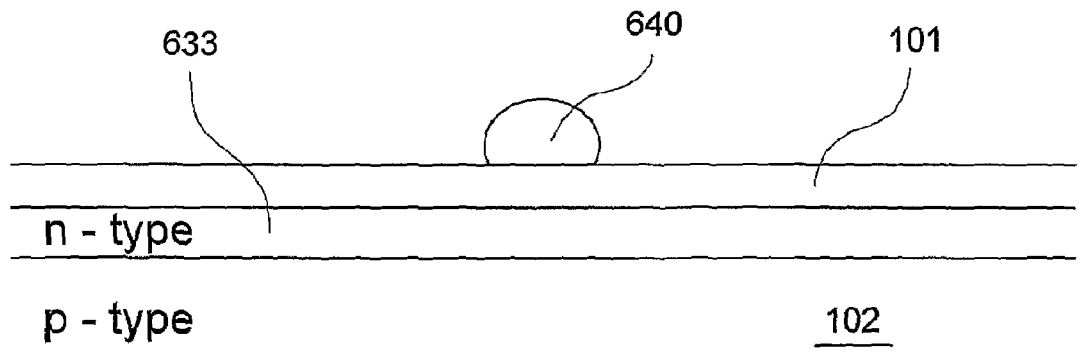
FIG. 12(c) diagrammatically illustrates the step of FIG. 12(b) a moment later.
Figure 12D:
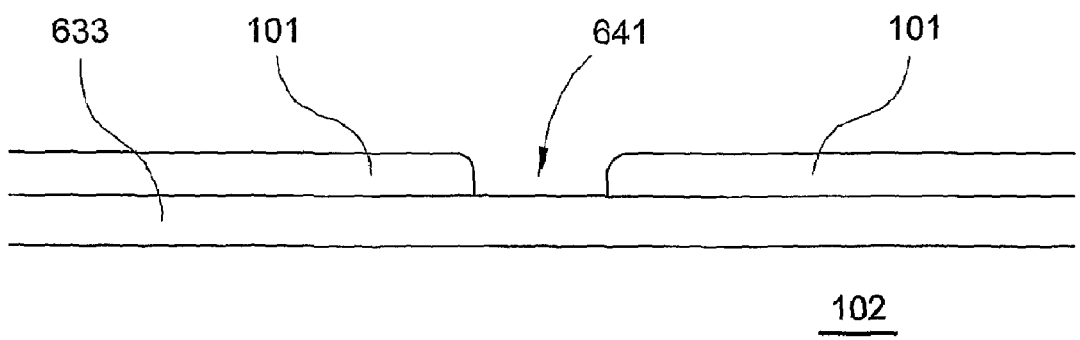
FIG. 12(d) diagrammatically illustrates the partially completed contact structure after the completion of the step of FIG. 12(c)
Figure 12E:
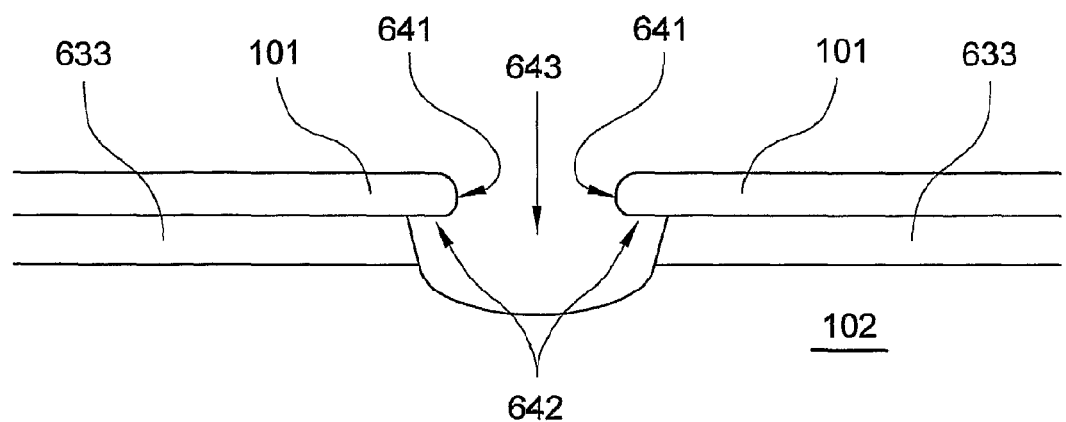
FIG. 12(e) diagrammatically illustrates the partially completed contact structure after the completion of a further etching step.
Figure 12F:
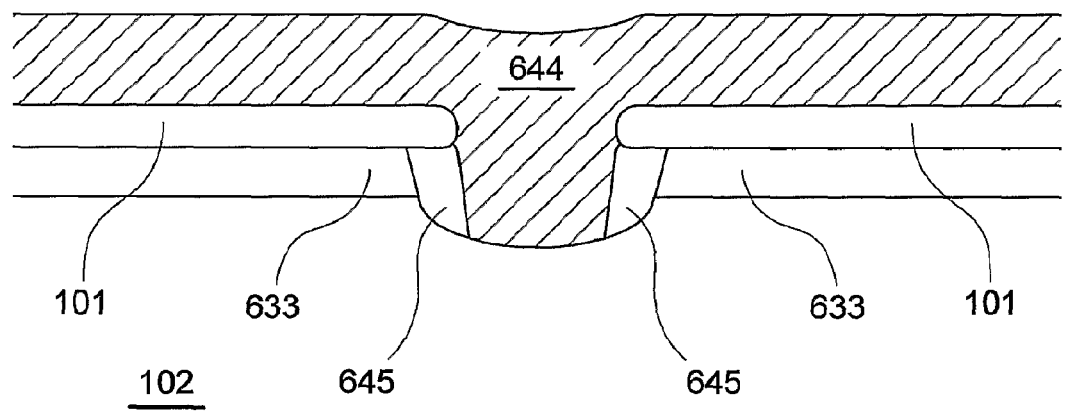
FIG. 12(f) diagrammatically illustrates the contact structure of FIG. 12(e) after a metallization step.

Another way in which the Structure of FIG. 12(a) can be equivalently produced using inkjet printing is shown in the sequence of FIGS. 12(b) through to 12(f). In this case, a droplet 640 of silicon dioxide etchant (or alternative etchant if another dielectric other than silicon dioxide is used) is shown in FIG. 12(b) and is applied by inkjet printing directly to the silicon dioxide layer 101 that is used to passivate the n-type rear surface 633 of a solar cell made from a p-type substrate 102 (it is assumed that the silicon dioxide surface has already been appropriately treated to make it suitably hydrophobic to the etchant being printed). FIG. 12(c) shows the etchant droplet 640 having been applied to the surface of the silicon dioxide layer 101 where the etchant retains its 3-dimensional form rather than smearing across the surface. FIG. 12(d) shows the hole 641 made in the silicon dioxide layer after being etched by the deposited etchant 640. This exposes the surface of the n-type silicon layer 633 in these regions. A range of silicon etches, or a combination of etchants sequentially applied, can be subsequently used (either alkaline-based or acid-based) to produce the type of structure shown in FIG. 12(e) where the silicon dioxide layer 101 (or other dielectric layer or combination of dielectric layers) is deliberately overhanging 642 the edges of the hole 643 etched into the rear surface of the silicon 102. Sufficient etching of the silicon is required to not only expose the underlying p-type substrate 102, but to etch a hole through the n-type surface layer 633 that is larger in diameter than the hole 641 remaining in the silicon dioxide layer 101 so that the exposed n-type silicon 633 is fully shaded/shielded from a "line of sight" deposition (in a direction normal to the rear surface) taking place onto the rear surface. This condition is achieved by deliberately continuing to etch the silicon until creating sufficient overhang 642 in the silicon dioxide layer 101 as shown. The purpose for this is shown in FIG. 12(f) where line of sight deposition of a metal 644 such as aluminium by a process such as by evaporation allows the metal to directly contact the p-type silicon 102 while the overhanging silicon dioxide layer 101 shields and protects the exposed n-type material from receiving any deposition of the metal being evaporated thereby creating a void 645. This facilitates ohmic contact to the p-type material 102 while avoiding any electrical contact to the n-type layer 633. The structure produced by this process achieves a highs shunt resistance between the n- and p-type polarity materials therefore avoiding shunting of this junction. A low temperature sinter typically in the range of 200-400° C. can be subsequently beneficially used to not only improve the ohmic contact between the metal and p-type silicon but also to improve the passivation of the exposed p-n junction in the region underneath the overhanging silicon dioxide layers. The latter helps reduce the junction recombination for the device, therefore improving the solar cell efficiency. In general, the depth of the n-type region 633 at the rear surface of the solar cell will be less than 1 micron, therefore in general requiring etching of the silicon to no greater depth than a few microns. This will typically produce an overhanging ledge for the silicon dioxide of approximately 1-3 microns, although much larger dimensions have been shown to work successfully. The main problems with larger dimensions for the overhanging layer is that longer etching times are required to remove the larger volumes of silicon followed by increased amounts of deposition so as to facilitate the production of a continuous metal layer 644 across the surface of the device as shown in FIG. 12(*f*).

An alternative approach to creating the openings in the silicon dioxide (or other dielectric) layer 101 without requiring the printing/application of the etchant is to do the equivalent of example 1 above whereby phosphorus is deliberately diffused into the silicon dioxide layer 101 so it can be preferentially etched. In this case, any unwanted phosphorus diffusing into the silicon will again be automatically removed during the subsequent NaOH etch.

The phosphorus source is deposited (either by inkjet printing, screen-printing or other) in localised areas onto the silicon dioxide (or silicon nitride) surface and then the wafer is heated so that the phosphorus diffuses into the dielectric layer in those regions. In general the phosphorus will go right through and into the silicon such that a subsequent HF etch will remove the silicon dioxide with high concentrations preferentially over the remainder of the silicon dioxide. This then exposes the silicon surface, and if it is desirable to keep the top region of the silicon that will also have some phosphorus diffused in it then processing is continued, or if it is undesirable for there to be phosphorous in the silicon, a silicon etch such as NaOH is used to remove the small amount of the exposed silicon containing the phosphorus. Another variation on this method is to deposit the phosphorus source in localised areas first and then either grow an oxide layer (during which the phosphorus automatically goes in to the oxide layer) or deposit a silicon nitride layer and then heat the wafer as necessary to diffuse the phosphorous through the dielectric layer.

Another approach for achieving the equivalent structure of FIG. 12(*a*) is to firstly produce the structure of FIG. 12(*e*) but while using a surface passivating layer 646 that becomes sufficiently flexible when sufficiently thin that overhanging portions 647 collapse into the hole as shown in FIG. 12 after undercut etching, to equivalently protect the n-type layer 633 from any subsequent metal deposition. An example of such an appropriate surface passivating layer would be a phosphorus doped polymer such as those used as phosphorus diffusion sources. Such layers can not only be used for producing the surface n-type layers for the devices, but they have also been shown to achieve good quality surface passivation of the exposed silicon surface. Furthermore, such layers can be gradually etched until thin enough to become quite flexible and therefore collapse into the groove as shown in FIG. 12. There are, however, many other such surface passivating layers that can also be used as most materials become quite flexile when etched to thin enough dimensions. The "collapsing" process can also be potentially aided by chemically treating the overhanging layer so as to soften it so as to make it more flexible and hence able to collapse as shown. Another aid for many materials can also be to heat the device which will also act to soften many such overhanging layers including polymers. Encouraging the collapsing process through heating has the added benefit that the collapsed material when coming into contact with the n-type surface will tend to provide better surface passivation of that exposed n-type material and more importantly the exposed p-n junction in that region. The heating can also be beneficial with some materials as it allows some of the collapsed overhanging layer to seal against the n-type layer, therefore facilitating other types of subsequent metallisation processes including electroless plating using solutions. Provided the collapsed overhanging layer adequately seals the region where the n-type material is exposed, the electroless plating solutions do not plate the n-type material and therefore facilitate ohmic contact formation to the p-type material without causing shunting of the p-n junction.

It was mentioned earlier that that collapsing process can also be aided by etching of the overhanging dielectric or passivating layer. It should also be recognised that other materials other than surface passivating layers could be used for the purposes described. For example, a surface passivating layer could have another layer deposited on top which therefore produced the overhanging features and subsequent collapse into the holes or grooves to therefore protect the n-type surface from any subsequent metallisation. It is therefore possible to use two separate materials layers, one to provide surface passivation and the second to provide the electrical insulation that prevents the metal from making electrical contact to both the p-type and n-type materials. Also, when etching of the overhanging layer is required to cause it to collapse into the hole, a beneficial feature of the structure is that a liquid etchant will etch the overhanging region at approximately twice the rate of the non overhanging regions since it etches on both its top and bottom surfaces compared to the rest of the layer in the non-overhanging regions where etching only takes place on one surface. This also adds to the robustness of this technology and its repeatability.

In all of the structures described herein, similar structures with all polarities reversed also works well, e.g. for the example above, a similar device can be made with an n-type wafer and a p-type diffused surfaces.

4. Chemically Etched Grooves for Buried Contact Solar Cells

Figure 14:
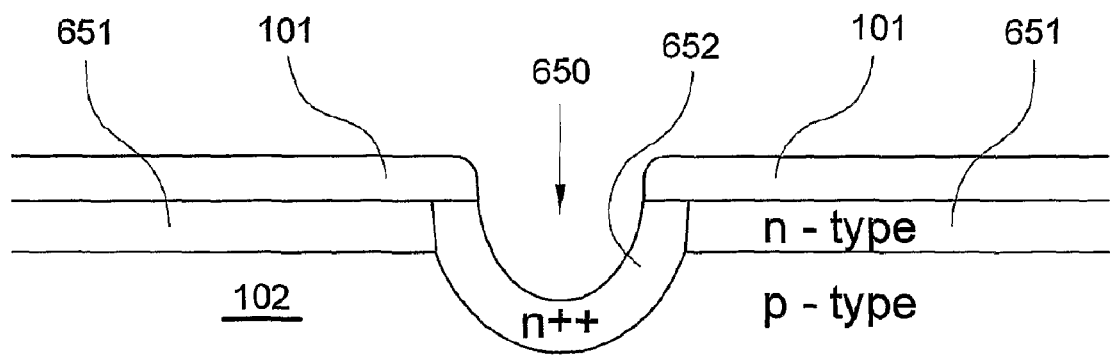
FIG. 14 diagrammatically illustrates a precursor to a buried contact solar cell contact structure formed by a process using inkjet printing techniques.

The structure of FIG. 14 has been demonstrated in the past by using a laser to cut the groove 650 through the dielectric layer 101 and into the silicon substrate 102 penetrating also through the n-type surface layer 651. Following such laser scribing, chemical etching is commonly used to remove the laser damage followed by a heavy phosphorus diffusion to produce the n++ region 652 within the walls of the groove 651 as shown. However, despite the inclusion of such a damage removal etch, residual laser damage inevitably remains with defects penetrating from the groove walls into the p-type substrate material 102.

Inkjet printing can also be used to produce similar types of structures to those produces with a laser, but without the damage caused by the laser scribing step. A p-type wafer 102 is initially diffused with phosphorus to produce an n-type surface region 652, followed by the growth or deposition of the dielectric layer 101 which could be formed of one of a range of materials such as silicon dioxide or silicon nitride, etc (or could be several layers of such materials formed over one another). For inkjet printing, the dielectric layer surface, if not already hydrophobic, may be chemically treated or coated so as to make it hydrophobic and therefore suitable for inkjet printing. Each groove is then produced by initially inkjet printing a row of individual droplets of etchant for the dielectric layer with only a small space between droplets. The typical droplet size is about 50 microns in diameter, with the spacing therefore chosen to be slightly greater at about 60 microns to allow each droplet to independently form on the dielectric surface without interfering with each other as described above with reference to FIGS. 9(*a*) to 9(*d*). Droplet sizes could of course potentially be up to an order of magnitude larger or smaller in size, but with the spacing between them appropriately adjusted so as the droplets on the dielectric surface are as closely spaced as possible but so as to not interfere with each other. Following hole formation in the dielectric, a silicon etchant such as sodium hydroxide, or even an acid-based etching solution, is used to etch the silicon surface wherever it is exposed by the holes in the dielectric. This initially produces rows of holes in the silicon, but with the holes subsequently joining after sufficient etching so as to produce a continuous groove once the individual holes are large enough to overlap. These chemically etched grooves in general have less damage and defects compared to those produced by laser or mechanical scribing. After groove formation groove wall doping and metallisation are preformed using one of the methods previously discussed.

Another approach to buried contact formation, using a process incorporating inkjet printing, is to coat the dielectric layer 101, which in general is also a silicon surface passivating layer, with another layer that provides the hydrophobic qualities suitable for inkjet printing in the manner described above. This additional layer can either be a sacrificial layer that is later removed or else a transparent one that does not absorb the light that would otherwise pass through to the underlying solar cell (or if on the rear surface could even be a reflecting material to reflect light back into the solar cell). The dielectric layer shown or an additional layer deposited on top for inkjet printing could also act as an antireflection coating if chosen to have the right thickness and refractive index. Such materials that would make a good antireflection layer include silicon nitride, titanium dioxide, silicon monoxide, cerium oxide, etc. Alternatively, an antireflection coating can be deposited after the groove formation by relying on the fact that the deposited material within the groove will have reduced thickness compared to the material on the top surface therefore enabling the silicon groove walls to be subsequently exposed preferentially to the silicon top surface through etching of the antireflection coating material. This allows subsequent metal deposition or plating into the grooves so as to contact the n++ material 652 shown but without making metal contact to the n-type material 651 across the top surface of the solar cell.

Yet another approach for producing the grooves as shown in FIG. 14 is to inkjet print an etchant material of high viscosity that is able to retain its 3-dimensional form without relying on the presence of a hydrophobic surface. In this case, it is feasible to inkjet print a continuous line of the etchant, as described above with reference to FIGS. 9(*g*) and 9(*h*), rather than relying on individual droplets spaced apart. Such a continuous line of etchant will then etch a continuous line in the dielectric layer and therefore enable direct chemical etching of the silicon material in the form of a groove 509 as shown in FIG. 9(*h*).

Yet another approach for creating the openings in the silicon dioxide (or other dielectric) layer 101 to facilitate groove formation, is to do the equivalent of example 1 above whereby phosphorus is deliberately diffused into the silicon dioxide layer 101 so it pan be preferentially etched wherever underlying grooves or holes are desired. In this case, any unwanted phosphorus diffusing into the silicon will be automatically removed during the subsequent NaOH etch.

Figure 15:
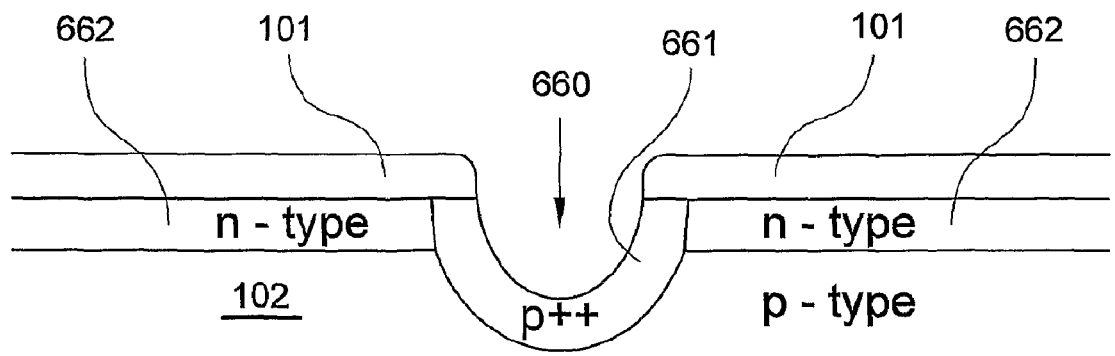
FIG. 15 diagrammatically illustrates a floating junction structure of a solar cell formed by a process using inkjet printing techniques.

This type of structure can be equally well applied to the rear surface of a solar cell as illustrated in FIG. 15 to produce grooves 660 for the rear contact metallisation. In this case, it would be more usual to diffuse the groove walls with the opposite polarity of dopant, namely (for a p-type substrate) a valency 3 element such as boron to form a $p^{++}$ region 661 on the walls of the groove 660. This could be done with or without the n-type surface layer 662 that is commonly formed on the rear surface during the phosphorus diffusion of the front surface of the wafer. This is another approach for producing a floating junction across the rear surface of the solar cell and potentially offers all the advantages of the structure described in example 3 above. In the past, this structure has been produced using laser scribing but with the problem that the damage resulting from the laser scribing process has caused subsequent shunting of the p-n junction near the mouth of the grooves. The problems of shunting of this floating junction have also been discussed in example 3 above. The chemically etched grooves 660 produced in conjunction with the inkjet printing of the etchant, do not produce the same problems as the laser scribed grooves. In this case, defects and damage to the silicon do not result and therefore the p-n junction shown in FIG. 15 retains a very high shunt resistance and produces a floating junction of superior quality compared to those produced using laser scribing.

The other advantage of the structures illustrated in FIGS. 14 and 15 is that electroless or electroplating can be used whereby the metal is only deposited where the silicon surface is exposed which in this case is within the grooves. By metallising only the grooved regions makes it possible to produce a grid pattern for the metal contact on both the front and rear surfaces so as to produce a bifacial solar cell. This allows light to enter both surfaces.

Figure 16:
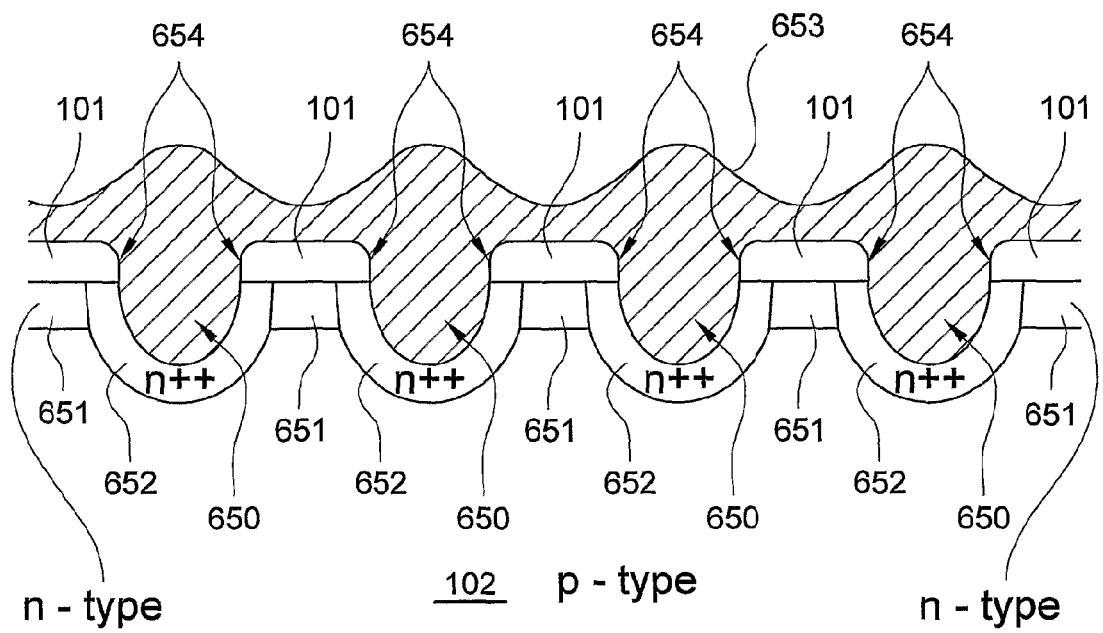
FIG. 16 diagrammatically illustrates a variation on the structures of FIGS. 14 & 15, formed by a process using inkjet printing techniques.

Another variation for the rear surface implementation of the structure of 15 is that a rear reflector can also be used to reduce the amount of light able to escape from the rear surface. The rear reflector can be achieved by depositing a layer such as P150 (white organic resin or "paint") on top of the dielectric layer similar to the structure shown in FIG. 12(*a*). Alternatively, a metal layer such as aluminium can be deposited onto the dielectric layer to act as a rear reflector. It is even feasible in this type of structure formation to use the metal layer as the one to be inkjet printed and subsequently etched and therefore subsequently used to provide the masking while etching the grooves within the silicon. In this case, the metal would also then be used as forming part of the rear metal contact and also to act as a rear reflector. A variation of the structures in FIGS. 14 and 15 can also be produced where each hole 650 is not sufficiently etched to cause them to join and form grooves. As seen in FIG. 16 (transverse view to FIG. 14), in this case a continuous conductor can still be formed by applying sufficient metal 653 over the holes 650 (such as with sufficient electro-plating or electroless plating). In this case the $n^{++}$ regions 652 forming the hole walls are still heavily doped while the top surface 651 is lightly doped. The equivalent structure can also be used for the rear surface described above with reference to FIG. 15.

5. Interdigitated Contacts of Opposite Polarity

Figure 13:
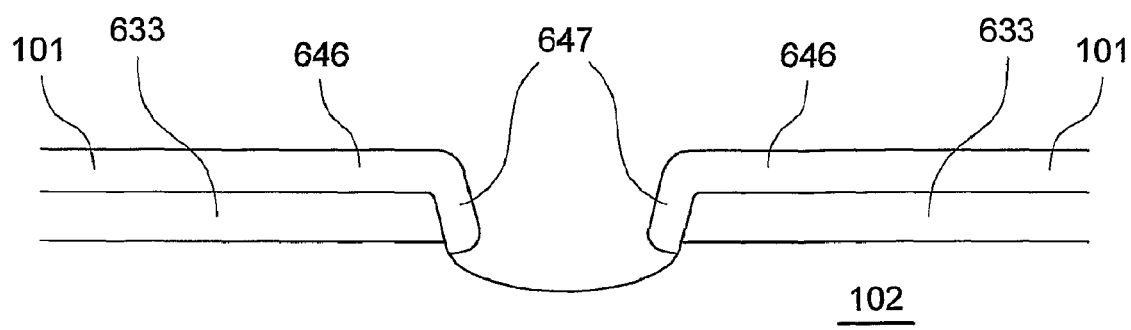
FIG. 13 diagrammatically illustrates the effect of initial steps in a farther method of forming a contact structure which is a variation of the contact structure of FIG. 12(a) formed by a process using inkjet printing techniques.
Figure 17:
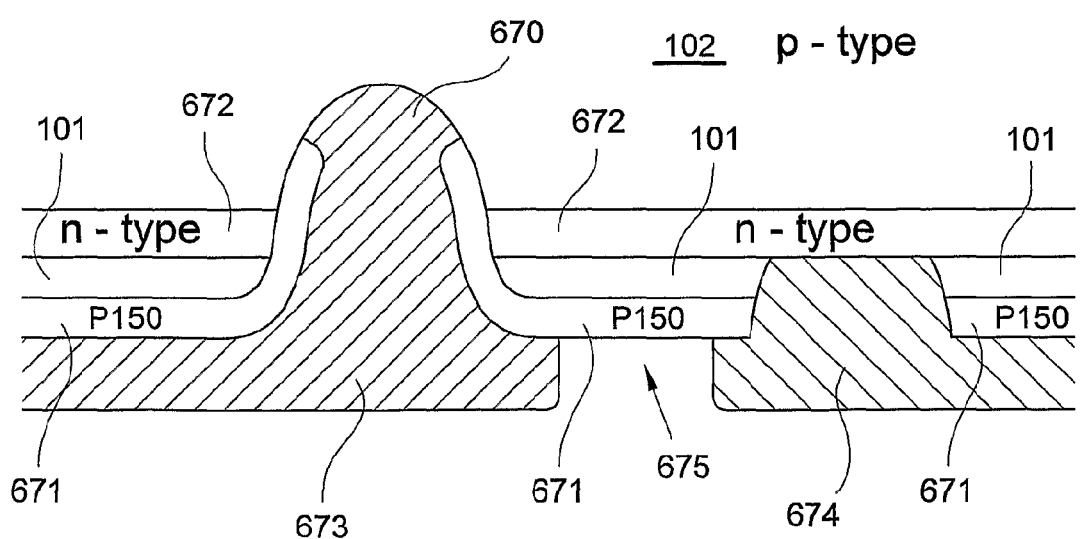
FIG. 17 diagrammatically illustrates a p-type and an n-type contact structure of a solar cell formed by a process using inkjet printing techniques.
Figure 18:
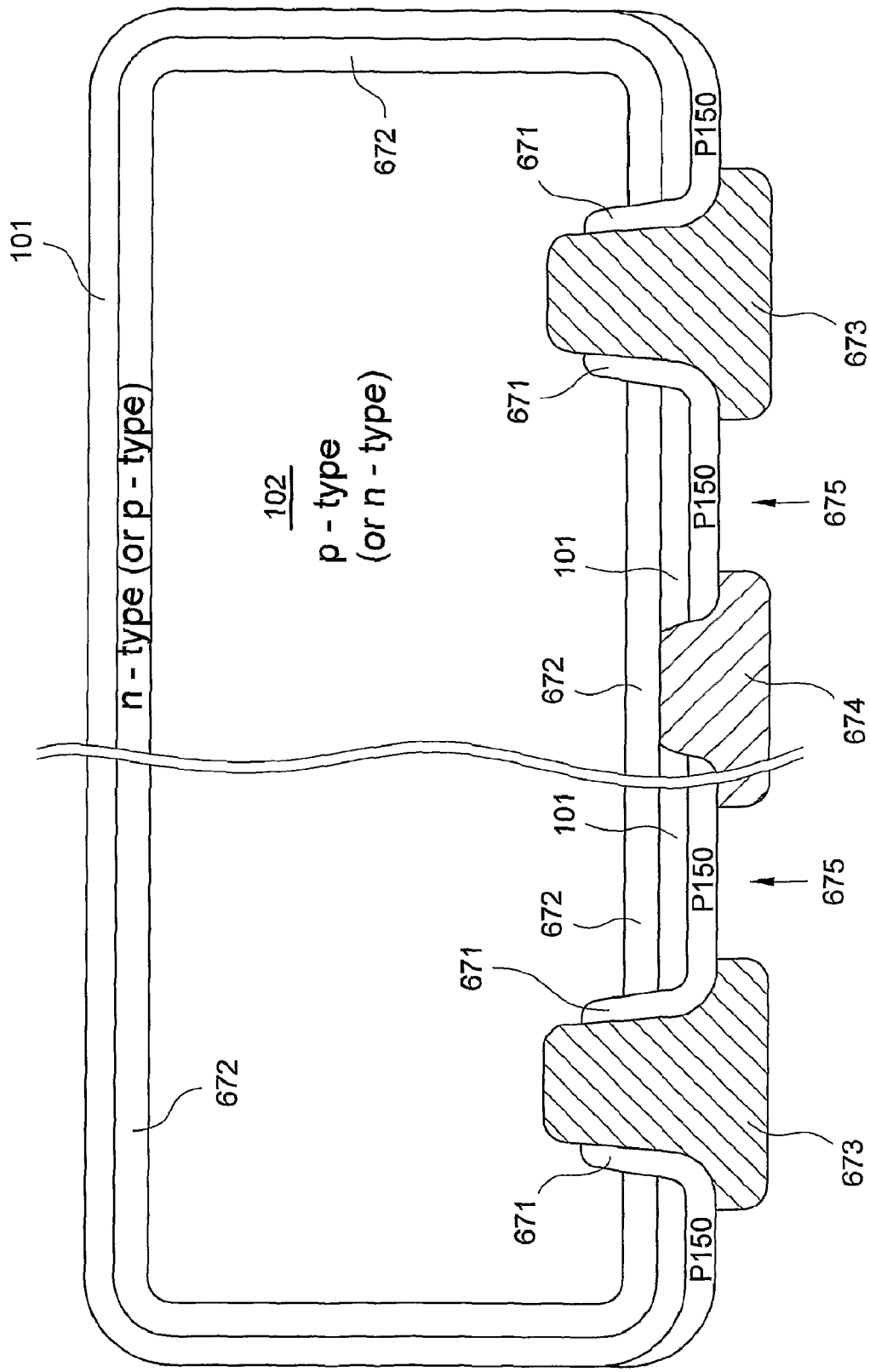
FIG. 18 shows in more detail the structure of FIG. 17 showing that the same structure can be used for either substrate polarity.

In the example that will now be described, inkjet printing of an etchant is used to produce the structure shown in FIG. 17 using the same types of processes and techniques described for examples 1-4 above. In this case, grooves or holes 670 in the silicon are used to make ohmic contact through to the buried p-type substrate 102 while separate inkjet printing processing is used to produce openings in the P150 layer 671 and silicon dioxide layer 101 to facilitate separate ohmic contact to be made to the surface n-type layer 672. Metallisation can then be added to separately form the p-type contact 673 and the n-type contact 674 or a metal layer can be formed and then etched with chemicals or ablated/melted, such as with a laser, to form the openings 675 separating the p-type and n-type contacts. If the p-type and n-type metallisation are formed separately these may be formed by an inkjet printing process. These two separate processes therefore lead to metal contacts being formed to both polarities of the silicon and therefore represent contacts of opposite polarity. These can be produced on the same side of the silicon wafer as shown, therefore requiring no metal contacts to be located on the opposite surface of the solar cell. This can be beneficial if the substrate has sufficiently long minority diffusion lengths so as to only require a rear junction (as shown in FIG. 17) for carrier collection. In this case, the absence of metal contacts on the front surface avoids any metal shading on the light receiving surface. In this cell structure, it is also preferable to use thinner substrates to allow improved carrier collection probabilities for light absorbed near the top surface of the solar cell. The thinner substrates are also preferable for economic purposes with the trend in the industry being to gradually use thinner and thinner substrates. FIG. 18 shows a more detailed implementation of this structure for either polarity of substrate. It also shows the P150 layer 671 being used on the rear surface to act as a rear reflector and also the mechanism to provide good shunt resistance between the n-type substrate and the surface p-type layer described above with reference to FIG. 12(a) or 13. This structure of FIG. 18 has the potential to achieve particularly high efficiencies provided the substrate minority carrier diffusion lengths are significantly greater than the wafer thickness. The high efficiency features of this structure include zero front surface metal shading loss, lightly diffused surfaces to reduce surface recombination and avoid any regions of low collection probability for generated carriers, well passivated front and rear surfaces, good shunt resistances by avoiding the need for edge junction isolation and by achieving good electrical isolation between n- and p-type polarities, low metal/silicon interface area to minimise the contribution to the device dark saturation current, the achievement of minority carrier diffusion lengths in the bulk much greater than the wafer thickness, the use of a rear reflector to aid light trapping, low resistive losses through selecting the n- and p-type doping concentrations appropriately and if necessary providing additional dopants directly beneath the metal contacts to further reduce contact resistance (not shown). Also not shown in the drawings for clarity, is the use of textured surfaces for light trapping and for reducing front surface reflection in conjunction with an anti-reflection coating, etc.

Figure 19:
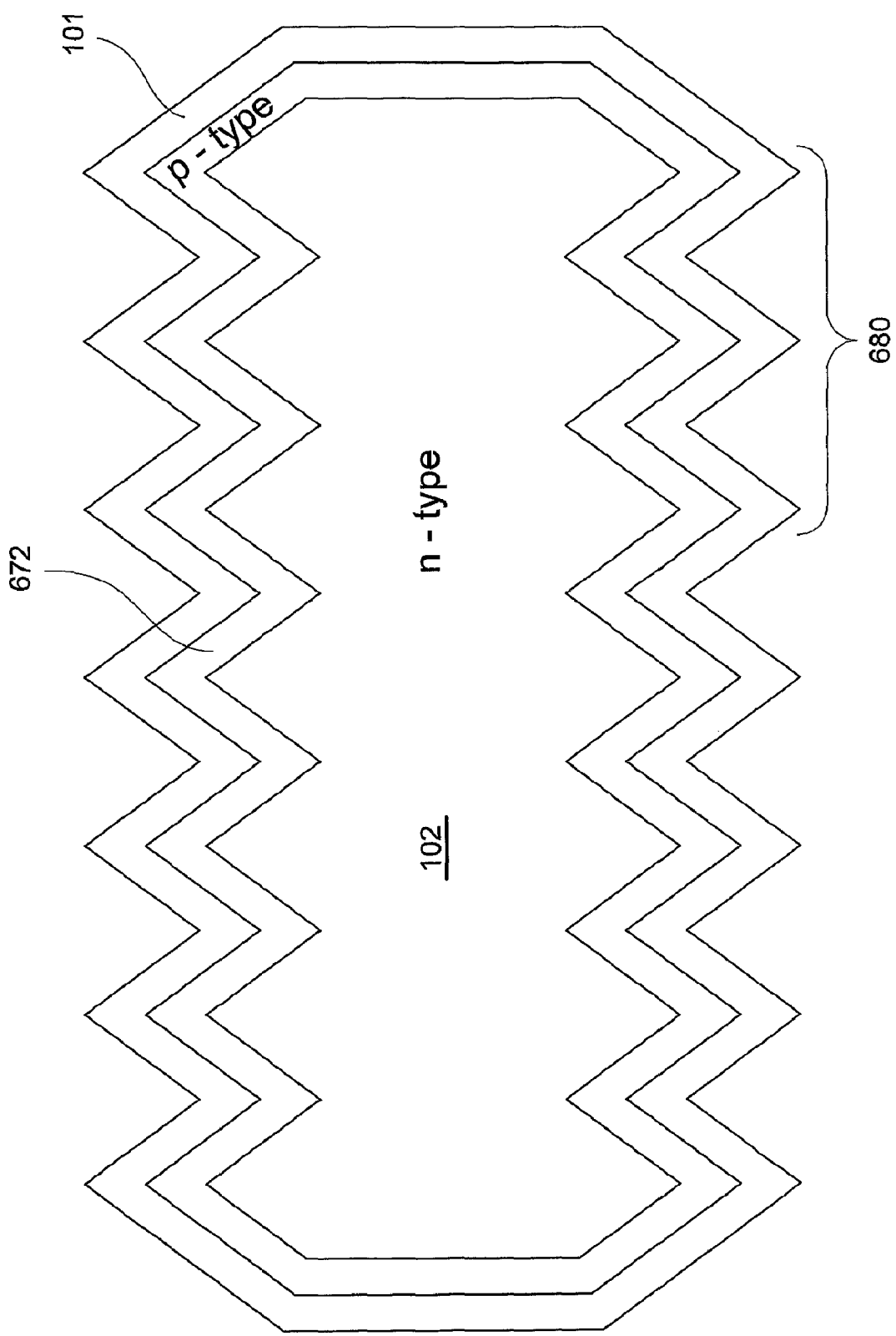
FIG. 19 shows a textured precursor to a solar cell that might be used to simplify manufacture in developing countries.

A potentially important use for this structure is to facilitate solar cell manufacturing in places like developing countries where cleanliness is poor and technical expertise often lacking. This particular technology overcomes these problems by having the solar cell manufacturer purchase wafers, as shown in FIG. 19, already textured 680, diffused 672 and oxidised 101. In this implementation of the technology, only one high temperature process is required to produce the wafer of FIG. 19, involving simultaneously forming the p+ surface region by diffusing boron or equivalent into the wafer surface regions 672, while simultaneously oxidising the surface in the same thermal process to provide good surface passivation with the silicon dioxide layer 101 as shown. Prior to carrying out this thermal process, the saw damage is removed and the surfaces textured 680 as required. These wafers can then be sold for manufacturing into solar cells, with no further high temperature processes required (i.e. nothing above 300 degrees Celsius) and therefore no mechanism for destroying the potential for high minority carrier lifetimes and good quality surface passivation achieved in the structure of FIG. 19. In addition, through the use of inkjet printing, contact formation can be achieved to both polarities by etching openings through the silicon dioxide and, where necessary, through the p+ layer. By using inkjet printing based processes to facilitate all of the cell finishing processes, these can be performed without the use of sophisticated equipment that requires significant technical expertise for its operation and maintenance. Consequently, it becomes feasible in regions such as developing countries to do the remaining processing that requires relatively low cost and unsophisticated equipment that is typical of equipment already found in such developing countries. This is not possible with commercial cell technologies, currently in use around the world, which require high temperature diffusions and oxidations and high temperature metal sintering, such as for the dominant cell technology, namely the conventional screen printed solar cell.

6. Texturing and Sculpturing of Solar Cell Surfaces Using Inkjet Printing in Conjunction with Chemical Etches The structure of FIG. 20 has been previously demonstrated using photolithography to provide linear openings 690, 691 in surfaces of a silicon dioxide 101 coated silicon substrate 102 to facilitate subsequent etching of the silicon in all regions where the silicon dioxide has been removed. For a <100> orientation wafer, if an anisotropic etch such as diluted sodium hydroxide or diluted potassium hydroxide is used, etching will continue reasonably rapidly until the <111> planes are exposed. This is carried out on both the front and rear surfaces, with the openings 690, 691 oriented perpendicularly to one another, as shown so as to enable the grooves on the opposing surfaces to be perpendicular to each other. This is done to retain strength in the wafer but also to enhance light trapping so that light can be repeatedly totally internally reflected at the front and rear surfaces by avoiding the presence of parallel <111> planes on the front and rear surfaces. Referring to FIG. 21, inkjet printing can also be used to produce the structure of FIG. 20. Similar techniques as those previously described can be used to enable a line of dots/droplets of silicon dioxide etchant to be inkjet printed. The sequential dots 694 within a particular line 695 need to be spaced at a spacing "F" from each other which is less that the spacing "G" between them and the juxtaposed dots 692 in adjacent lines 693. This facilitates grooves formed in the silicon under holes formed by the dots within a particular line 693, 695 joining up to produce a continuous groove 690 prior to adjacent grooves joining. This is shown schematically in FIG. 21 where 50 micron diameter droplets are typically printed in rows 639, 695 where the centre to centre spacing "F" is typically 60 microns between droplets 692, 694 within a row and the centre to centre spacing "G" is typically 70 microns between adjacent rows 693, 695 of droplets. The net result is that grooves are formed as shown in FIG. 20 with a spacing between the edges of adjacent grooves being separated by approximately 10 microns of silicon dioxide protected wafer surface.

Figure 20:
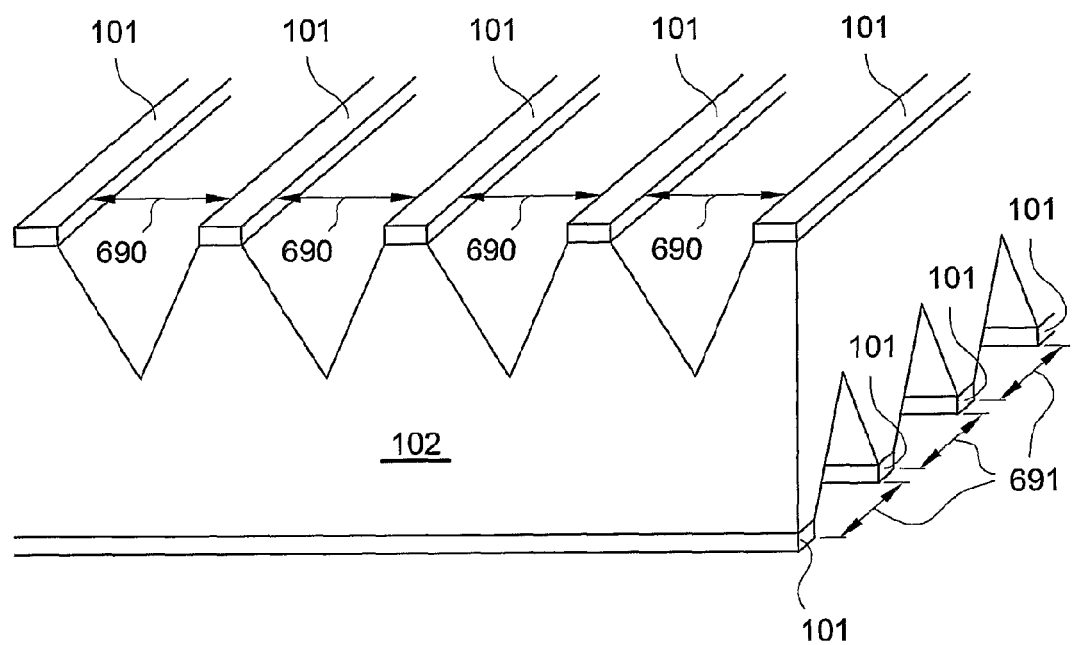
FIG. 20 shows a bi-facial textured substrate that can be formed by a process using inkjet printing techniques.
Figure 21:
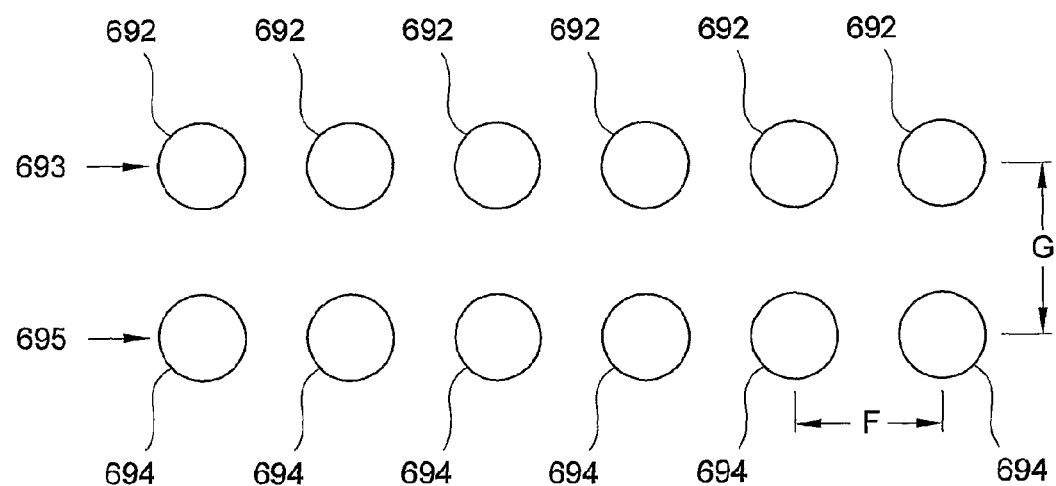
FIG. 21 diagrammatically illustrates a dot pattern used in a process to form the structure of FIG. 20.

The structure of FIG. 20 also has benefits when using material of short minority carrier diffusion length. Firstly, it retains significant strength even when the wafer is made quite thin due to the strength provided by the perpendicular groove structure. Furthermore, the formation of these macrogrooves on both surfaces, removes a large volume of the substrate material, thereby reducing the volume of material able to contribute to the device dark saturation current. The penalty through removing substrate material is often reduced absorption of light although in this case, the excellent light trapping provided by this structure enhances absorption sufficiently to more than compensate for the reduced material volume. Another important feature of this structure in relation to using low quality substrates is that the front and rear grooves if properly dimensioned and processed can be formed so as to intersect forming holes that link the front and rear surfaces. The subsequent phosphorus diffusion of the wafer surfaces therefore facilitates the linking of the front and rear diffused regions through these holes. If the grooves are spaced approximately 60 microns apart, these holes through the wafer from front to rear can therefore also be spaced typically 60 microns apart. This is adequately close to facilitate locating all metal contacts on the rear without incurring significant losses since carriers collected by the front junction can be transported to the rear via these holes which are sufficiently closely spaced to minimize resistive losses. Also, the natural formation of front and rear junctions in this structure greatly increases the collection probability for carriers generated within the substrate, particularly when low lifetime material is being used. Provided minority carrier diffusion lengths are in the vicinity of half the wafer thickness, the structure shown in FIG. 20 provides relatively high collection probabilities for all carriers generated throughout the volume of silicon material. The polarities for wafers and diffusion can also be reversed relative to those described above.

Another feature of the structure of FIG. 20 is that the inkjet printing step controls the location of the grooves. Therefore, in locations where metal contacts are required, grooves can be shifted in location or even omitted, by locally modifying the printing pattern, to provide flat surfaces (after etching) to facilitate easier formation of metal contacting.

7. Crinkle Cut Structure Through Inkjet Printing

Figure 22:
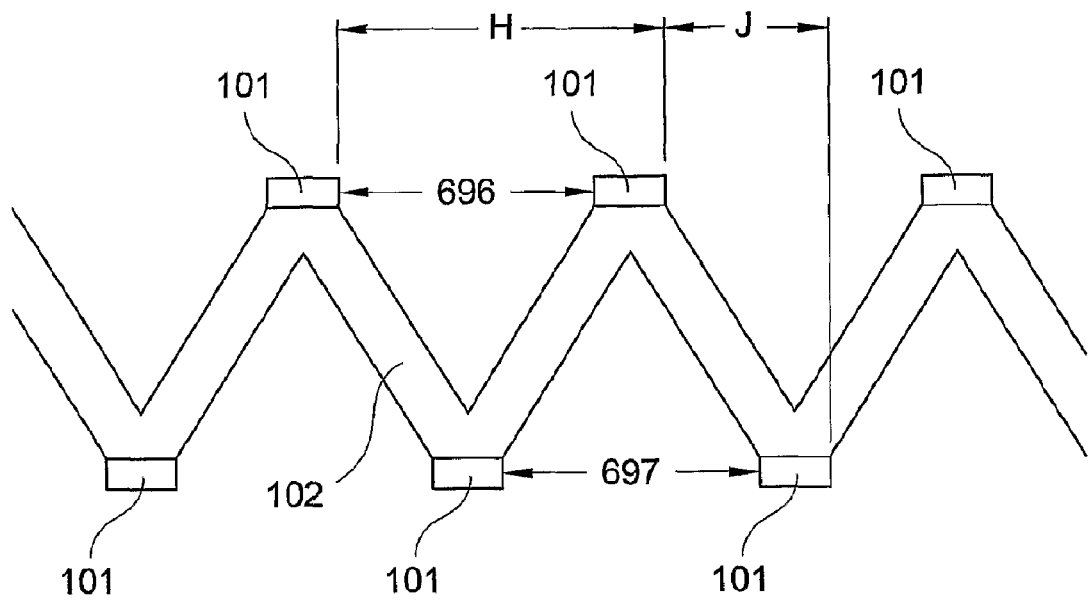
FIG. 22 diagrammatically illustrates a variation on the structure of FIG. 20.

A variation of the structure of FIG. 20 is that shown in FIG. 22 where the front and rear grooves 696, 697 are parallel to each other but offset from each other by a spacing "J" which is half the groove spacing "H" as shown to prevent the front and rear grooves from intersecting. By appropriately choosing the groove spacing relative to the wafer thickness, the remaining silicon material thickness after formation of the front and rear grooves can be made any desired thickness. It is easy to adjust the inkjet printing parameters to make the droplets significantly larger than the 40 micron diameter droplets used in some of the previously described embodiments. Again, the inkjet printed pattern can be adjusted so as to retain some regions of flat surface for metal contacting as desired. In addition, the pattern can be varied so as to produce ribs in the direction perpendicular to the front and rear grooves for the purpose of strengthening the wafer which is otherwise vulnerable to breakage along the grooves. These ribs can simply be formed by allowing breaks in the grooves formed on either the front or rear surfaces or both. These breaks remain non-etched regions which form the strengthening ribs, each with a width of approximately the length of the respective break in the grooves.

8. Inkjet Printing of Liquid Diffusion Sources

Figure 23A:
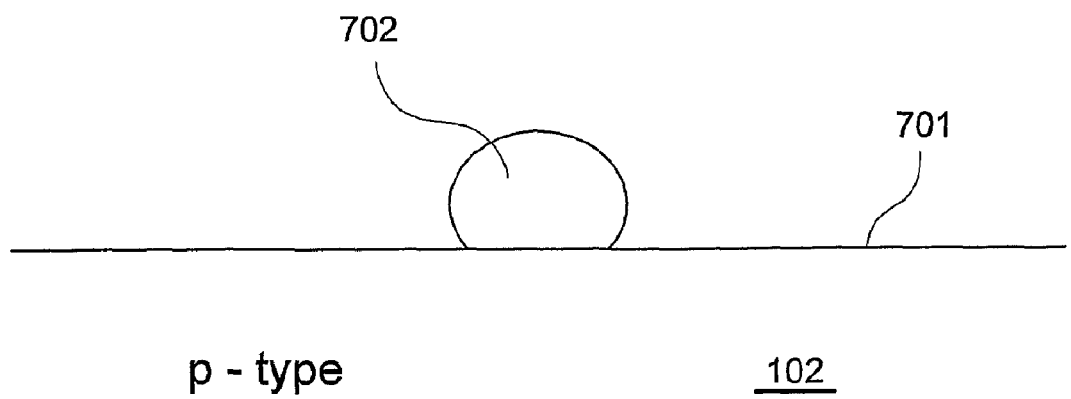
FIG. 23(a) diagrammatically illustrates an inkjet droplet of a diffusion source after being deposited onto a hydrophobic surface.
Figure 23B:
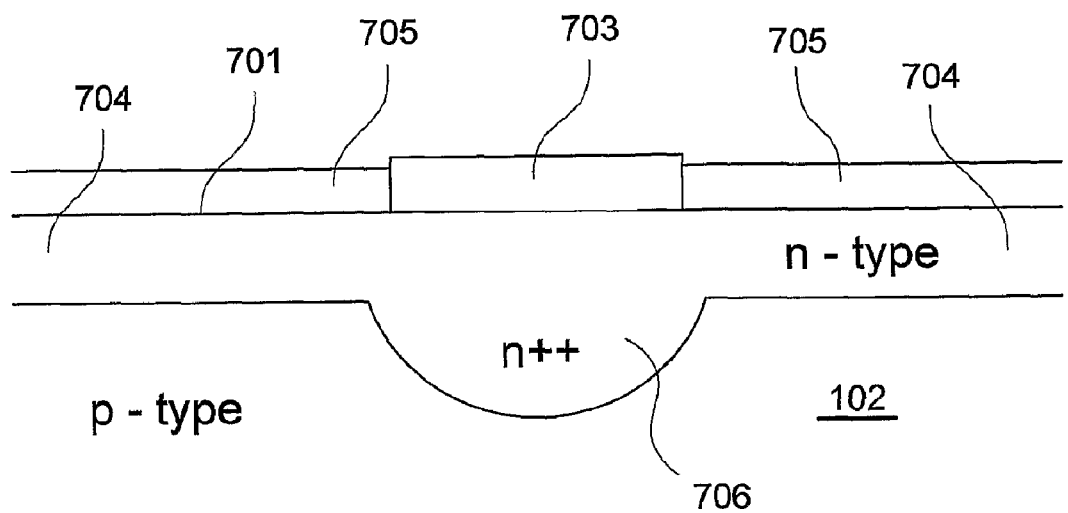
FIG. 23(b) diagrammatically illustrates the structure resulting after heat treatment of the substrate and diffusion source illustrated in FIG. 23(a)

A bare silicon surface, 701 of a substrate 102, can be made hydrophobic by appropriately chemically creating it such as emersion in hydrofluoric acid. By subsequently inkjet printing a droplet 702 of liquid "spin-on" diffusion source as shown in FIG. 23(a), onto this surface 701 and then heating the surface to temperatures in the vicinity of 900° C. following drying of the liquid diffusion source at approximately 100-200° C., the structure of FIG. 23 (b) is produced. This is because the silicon is heavily diffused with phosphorus in a region 706 under the point of direct contact between the dried spin-on (phosphorus glass) diffusion source 703 and the silicon surface 701. The remainder of the region 704 on the exposed silicon surface 701 is still lightly diffused with phosphorus as phosphorus is transported in the gaseous phase from its deposited source 703 to the remainder of the wafer surface. During the light n-type surface diffusion as shown a thin silicon dioxide layer 705 is also grown on these regions as shown. It is feasible using the right etching conditions to then remove the phosphorus glass 703 over the heavily phosphorus doped region 706 while retaining some of the passivating thermally grown silicon dioxide layer 705 that can act not only to passivate the lightly diffused n-type surface region, but also to potentially mask these regions from electroless plating solutions that can directly plate to the exposed n++ material in the heavily phosphorus doped region 706.

Figure 24A:
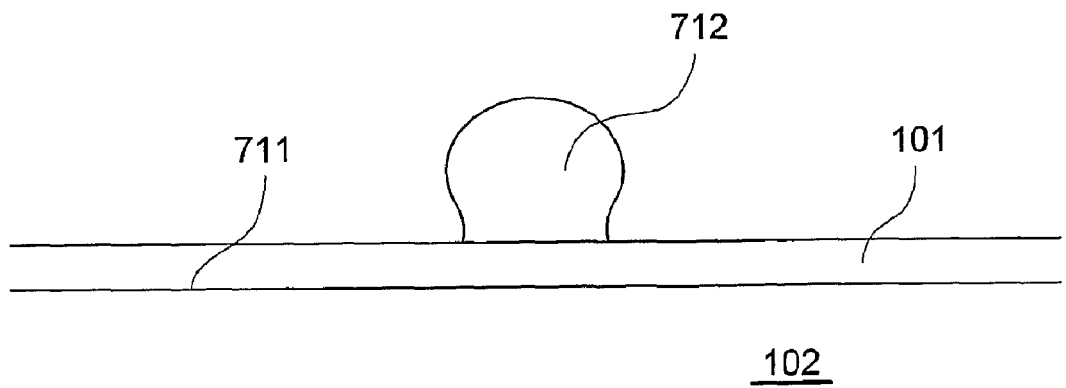
FIG. 24(a) diagrammatically illustrates an inkjet droplet of a diffusion source after being deposited onto a dielectric coated surface of a semiconductor.
Figure 24B:
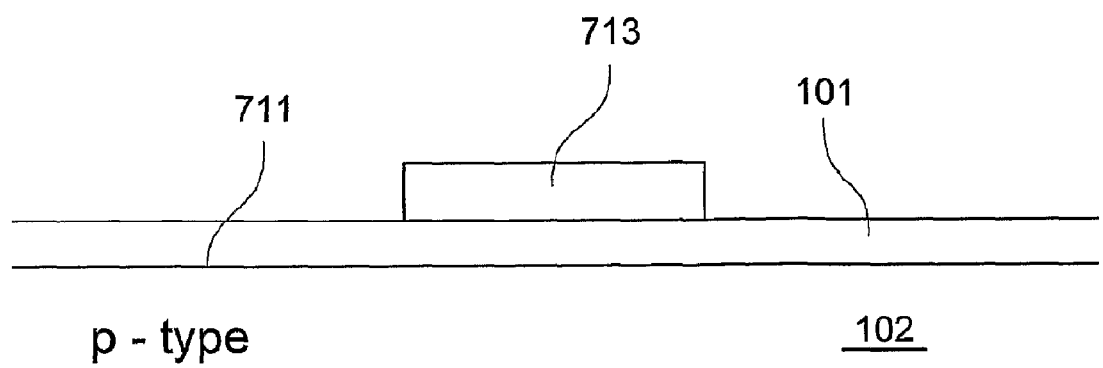
FIG. 24(b) diagrammatically illustrates the structure resulting after drying the substrate and diffusion source illustrated in FIG. 24(a)
Figure 24C:
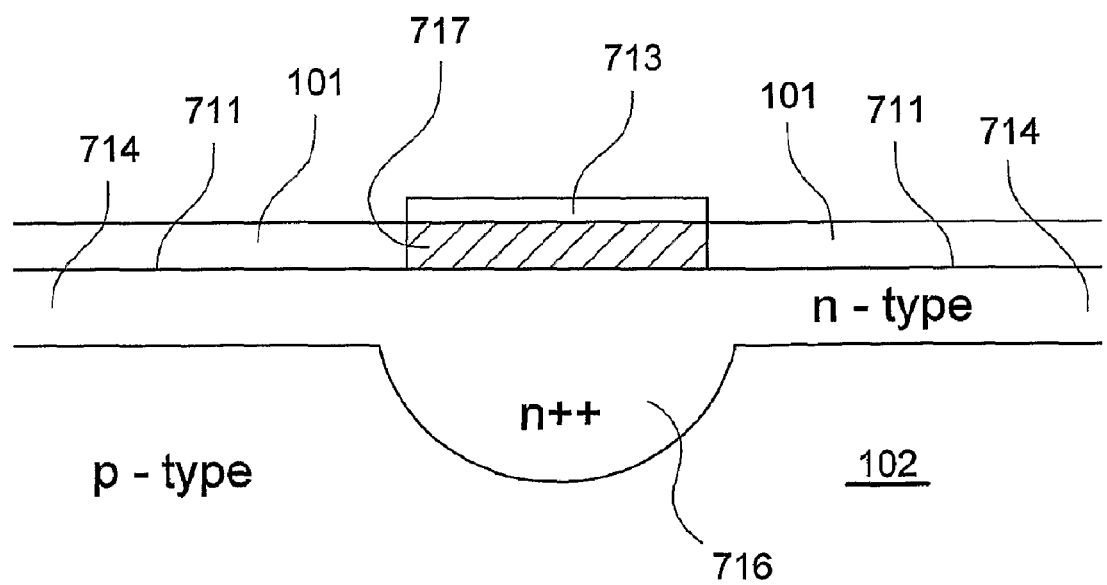
FIG. 24(c) diagrammatically illustrates the structure resulting after heat treatment of the substrate and dried diffusion source illustrated in FIG. 23(b)

However, this outcome can also be achieved by starting with the structure as shown in FIG. 24(a) in which a silicon dioxide layer 101 is formed over the surface 711 of a substrate 102 prior to inkjet printing of the liquid diffusion source 712. Following drying of the liquid "spin-on" diffusion source 712 to form a phosphorus glass diffusion source 713, the structure of FIG. 24(b) is produced. Subsequent high temperature processing typically in excess of 900° C. facilitates the phosphorus being driven through the silicon dioxide layer and into the surface of the p-type wafer to form a heavily phosphorus doped silicon region 716 and a heavily phosphorus doped silicon dioxide region 717 as shown in FIG. 24(c). A lightly diffused n-type surface region 714 may also be formed, but depending on the thickness of the silicon dioxide layer 101 used and the temperature of the diffusion and its duration, this diffused region can be avoided. In general, the thickness of the silicon dioxide layer 101 in this structure is in the range 20-2000 Å immediately following growth, but this thickness is subsequently reduced during processing, particularly during the phosphorus glass removal and also during plating of the n-type region depending on the plating solution used.

Figure 24D:
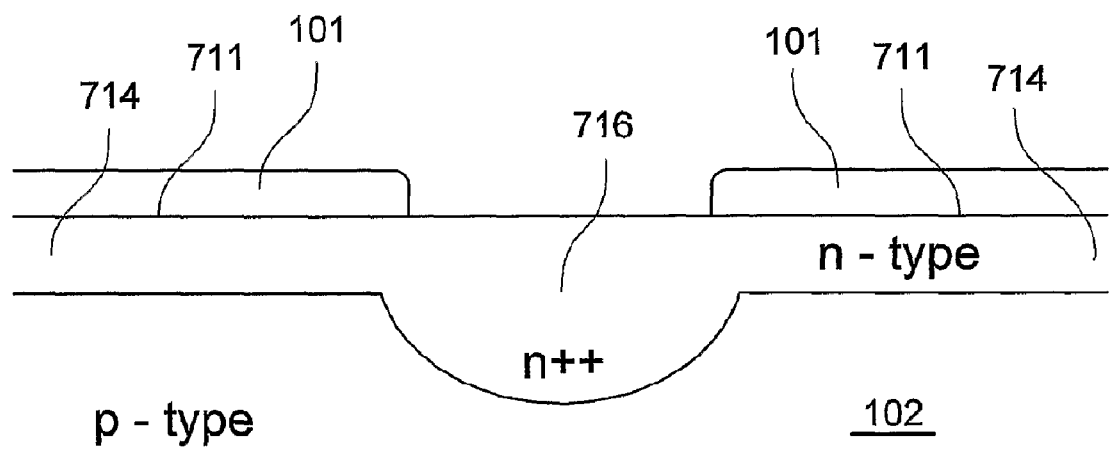
FIG. 24(d) diagrammatically illustrates the structure of FIG. 24(c) after etching the dopant source and heavily doped dielectric region.
Figure 24E:
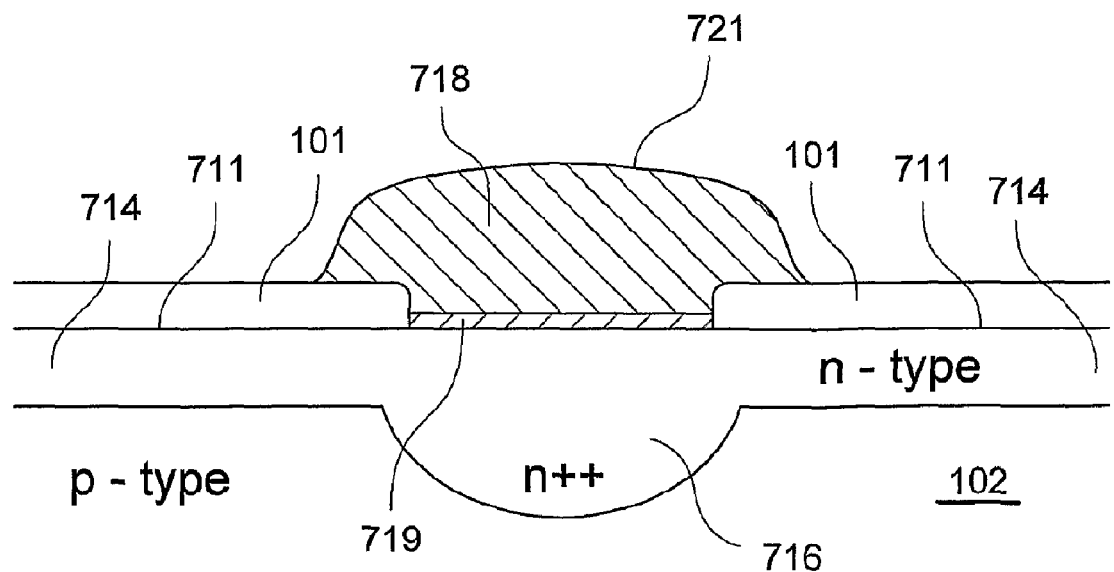
FIG. 24(e) diagrammatically illustrates the structure of FIG. 24(d) after metal plating.

Importantly though, the structure shown in FIG. 24(c) makes it feasible to preferentially remove the phosphorus glass 713 and underlying heavily phosphorus doped silicon dioxide layer 717. This is because the chemical properties of the silicon dioxide layer are drastically changed by the high concentration of phosphorus, making it possible to preferentially etch it at a much faster rate than normal silicon dioxide. For example, dilute hydrofluoric acid can be used to quite rapidly etch away the phosphorus glass 713 and heavily phosphorus doped silicon dioxide 717 while etching away relatively little of the silicon dioxide layer 101 that covers the remainder of the surface 711 of the silicon wafer 102. Following such an etch, the structure of FIG. 24(d) is produced with the $n^{++}$ region 716 exposed while the lightly phosphorus diffused surface region 714 remains passivated and protected by the thermally grown silicon dioxide layer 101. This structure can then be metallised such as by electroless plating as shown in FIG. 24(e) where the metal contact 721 is automatically plated where the surface of the heavily phosphorus diffused silicon region 716 is exposed as shown. Typical metal plating 721 includes an initial flash of nickel 719 such as through electrolessly deposited nickel, followed by a much thicker layer of electrolessly plated copper 718. This structure has many advantages including a lightly phosphorus diffused surface region 714 that is well passivated by the silicon dioxide layer 101, low metal/silicon interface area, low contact resistance between the metal and the silicon through the use of a heavily phosphorus doped region 716, good conductivity in the metal 721 through the use of electrolessly plated copper 718, and a self-aligned metallisation scheme whereby the metal contact 721 is automatically located where the heavily phosphorus doped region 716 (n++ layer) has been formed.

This approach of inkjet printing of the liquid diffusion sources to the specific locations where the surface diffusion is required makes it feasible to fabricate a whole range of semiconductor device structures previously difficult to fabricate. For example, in addition to those described in FIGS. 22 and 23 above, it is feasible to inkjet print opposite polarity liquid dopant sources in adjacent regions on the same surface of the wafer or to simply provide doped regions wherever desired on either surface and of either polarity.

Figure 9A:
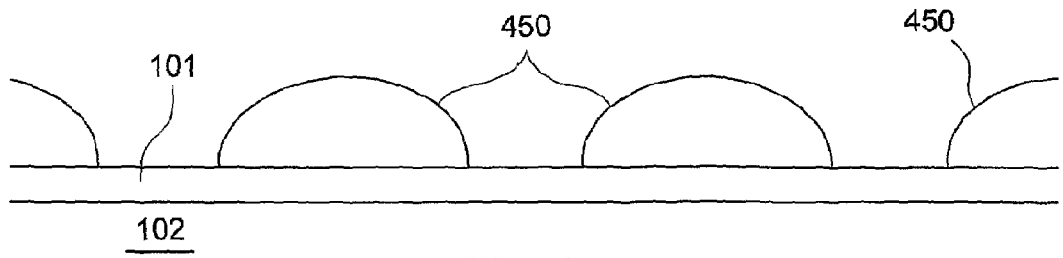
FIG. 9(a) diagrammatically illustrates printing droplets of etchant onto a dielectric surface of a structure in a first method of grooving a substrate.
Figure 9B:
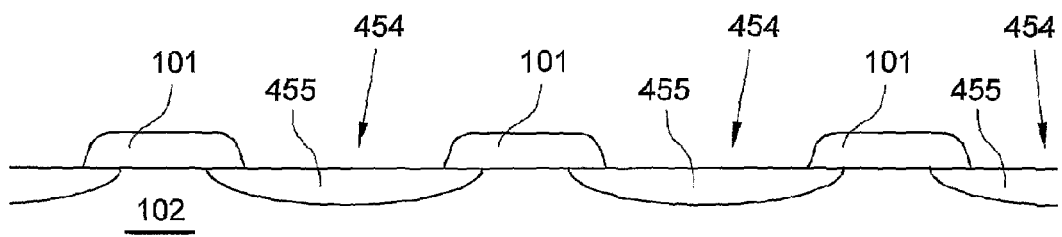
FIG. 9(b) diagrammatically illustrates the structure of FIG. 9(a) after partial etching of the substrate.
Figure 9C:
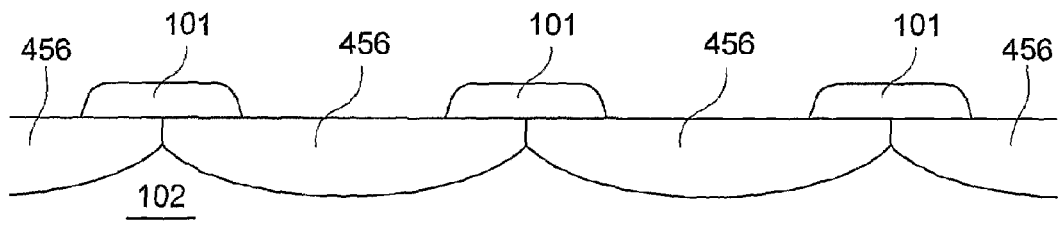
FIG. 9(c) diagrammatically illustrates the structure of FIGS. 9(a) and 9(b) after complete etching of the substrate.
Figure 9D:
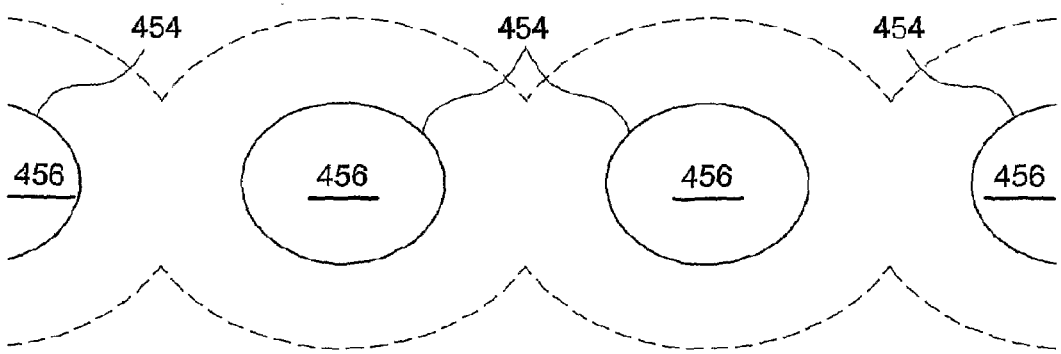
FIG. 9(d) diagrammatically illustrates the structure of FIG. 9(c) viewed from the top.
Figure 9E:
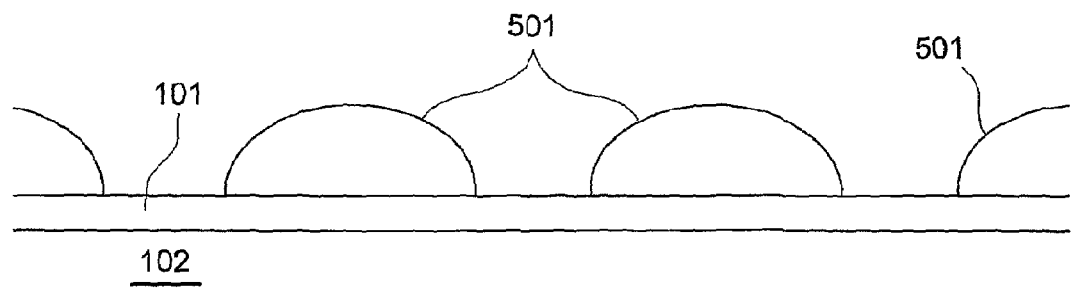
FIG. 9(e) diagrammatically illustrates printing droplets of etchant onto a dielectric surface of a structure in a second method of grooving a substrate.
Figure 9F:
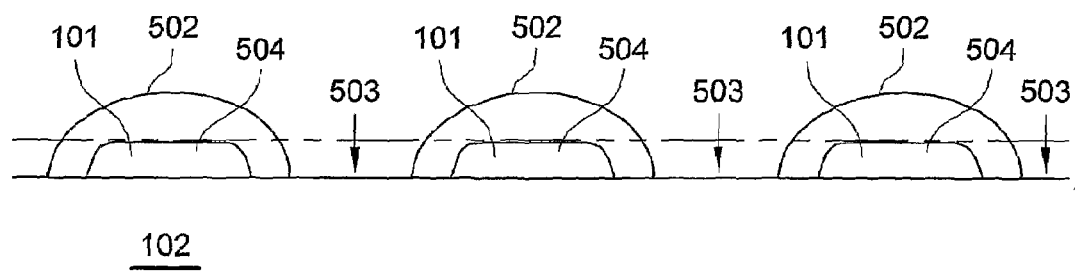
FIG. 9(f) diagrammatically illustrates printing further droplets of etchant onto the structure of FIG. 9(e) after completion of the first etch.
Figure 9G:
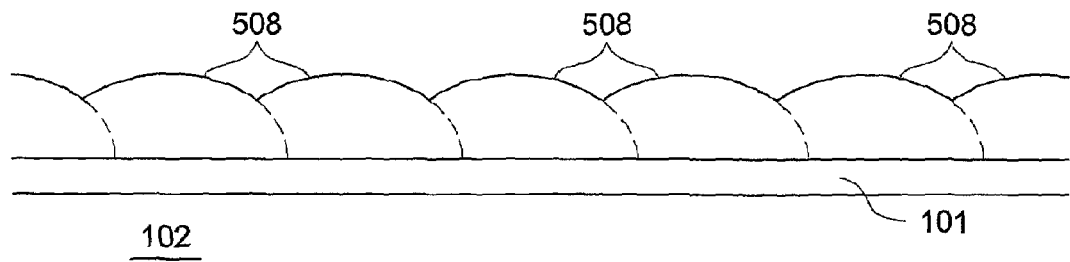
FIG. 9(g) diagrammatically illustrates printing droplets of etchant onto a dielectric surface of a structure in an overlapping pattern in a third method of grooving a substrate.
Figure 9H:
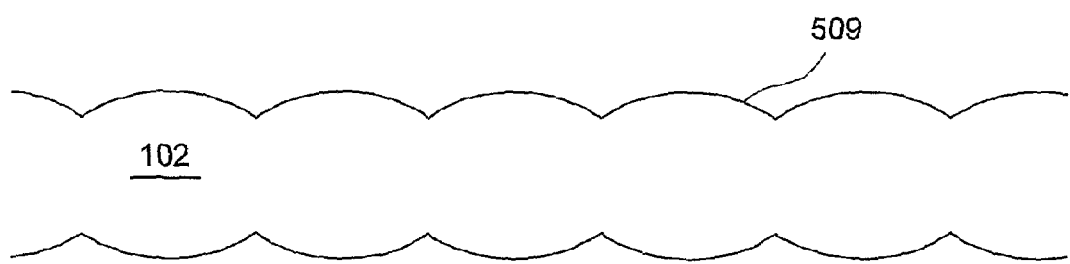
FIG. 9(h) diagrammatically illustrates a top view of the structure of FIG. 9(g) after etching of the dielectric layer.

Another feature of the metallisation scheme shown in FIG. 16 is that it can use inkjet printing to provide a row of droplets such as droplets 501 of FIG. 9(a) which do not need to join.

The subsequent row of holes 654 created in the silicon dioxide layer 101 allow electrolessly plated metal regions to be formed which will automatically join provided the row of holes are sufficiently closely spaced to each other. The typical spacing between droplets (and subsequent holes 654 in the silicon dioxide layer 101) is in the range of 5-15 microns and it is relatively straight forward during plating to have the adjacent holes join via the metal plating across the surface of the silicon dioxide layer 101 to the adjacent plated region in a similar fashion to the arrangement shown in FIG. 16.

An example of a process that can be performed using an inkjet printing technique is the application of a patterned dielectric layer using one of the available dielectric materials that can be applied as a liquid. Following the deposition of such a dielectric material by inkjet printing, some heating of the material will normally be required (as discussed above) so as to give the dielectric layer its desired properties. Although a variety of heating methods would be applicable, one that is particularly attractive is the use of a laser operating in conjunction with the inkjet print head to perform both tasks substantially simultaneously. Examples of dielectric layers that can be applied in this way include silicon dioxide, titanium dioxide, various polymers, etc, or even multiple layers of different dielectrics can be used. For example, a dielectric layer such as liquid spin-on silicon dioxide can be inkjet printed so as to protect the n-type silicon, or alternatively an equivalent structure can be produced by coating the entire surface with dielectric such as silicon dioxide, and then inkjet printing a suitable etchant for the dielectric layer (such as dilute HF), everywhere the dielectric layer is to be removed.

Figure 25:
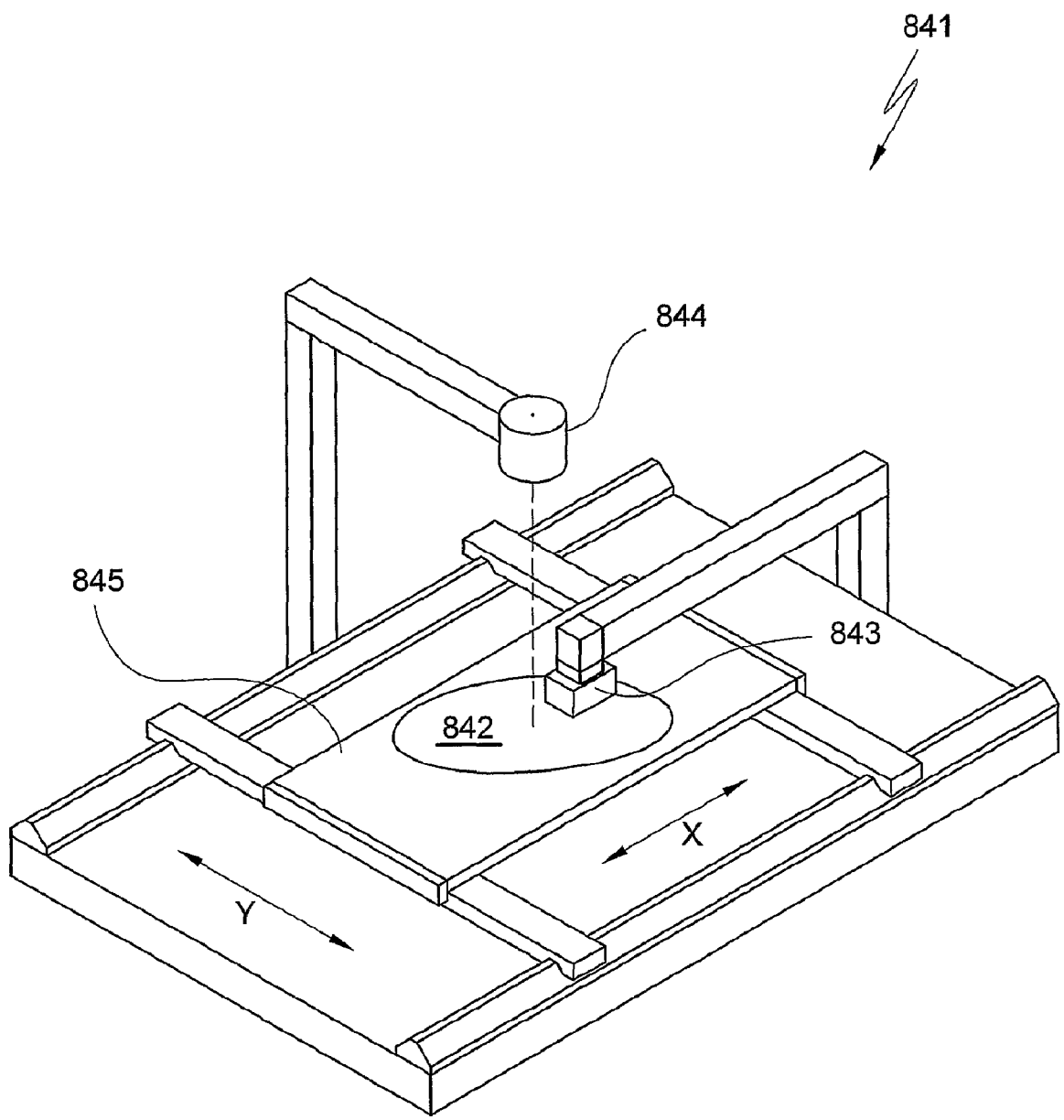
FIG. 25 illustrates an X-Y table with an inkjet print head and a laser scribing tool.

When implementing manufacturing processes based on the use of inkjet printing of processing agents (such as dielectrics in the above example), a particularly powerful tool is an X-Y table 841 illustrated in FIG. 25 having a travelling carrier 845 (that holds the substrate 842 on which the solar cell is being formed), combined with both inkjet printing heads 843 and laser scribing head or heads 844. This allows the substrate 842 to be moved in the 'X' and 'Y' directions under the stationary laser W44 and the stationary print head or heads 843 allowing heat to be applied by the laser 844 wherever desired in conjunction with the inkjet printing of the processing agent (e.g. the liquid dielectric material). This facilitates localized heating of the process agent (while simplifying alignment issues), and in the case of doped dielectric material or other dopant sources, permits laser doping from the process agent, localized ablation of the process agent if desired, and heat treating or ablation of silicon in the regions not coated by the dielectric. In this tool, the laser 844 could be one having a range of wavelengths and could be either Q-switched or continuous depending on the desired outcomes.

Figure 26:
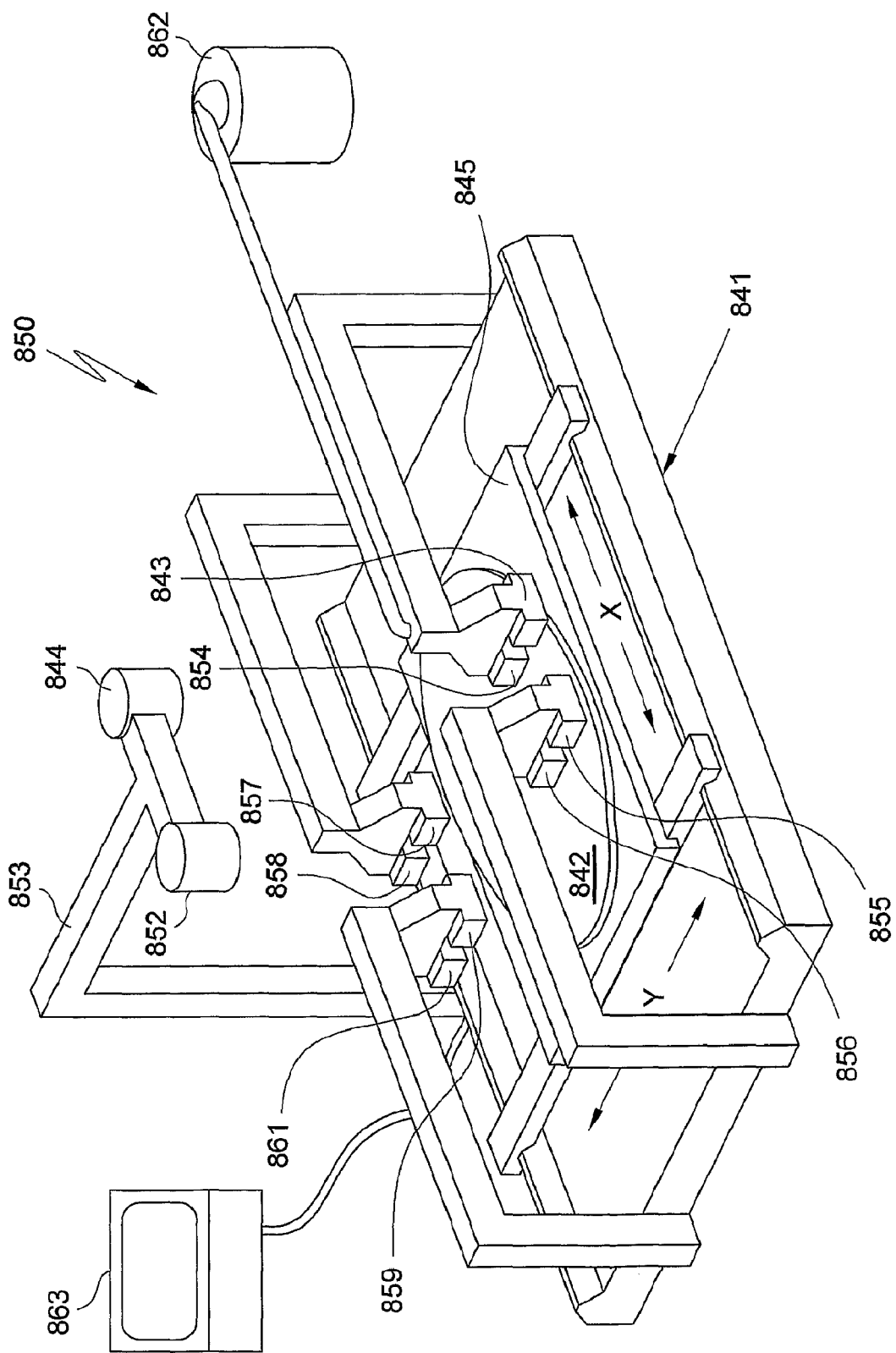
FIG. 26 illustrates an X-Y table with multiple inkjet print heads and multiple laser scribing tools.

The inkjet printing and laser heating system, described above with reference to FIG. 25, is simplified for clarity and only illustrates one print head and laser, however referring to FIG. 26, preferred inkjet printing and laser heating systems will typically have two laser heads 844, 852, one operating at 1.064 micron wavelength light and the other at 0.532 micron wavelength light, Both heads are switch-able between operating in Q-switched mode or continuous wave operation. In addition the system has typically 8 or more inkjet printing heads 843, 854, 855, 856, 857, 858, 859, 861, one connected to a liquid dielectric layer source 862 such as silicon dioxide, one connected to a liquid n-type spin-on diffusion source such as phosphorus (remaining sources not shown for clarity), one connected to a p-type liquid spin-on diffusion source such as boron, one connected to a source of an acid based etchant for etching silicon dioxide, one connected to a source of an alkali etchant such as sodium hydroxide for etching silicon etc, one connected to a source of a liquid with metal ions/particles and one or more connected to a source of solvents or other solutions for diluting any of the materials in the other 5 heads. The X-Y table, print heads and lasers are controlled by a control unit 863, typically a computer with suitable interfaces, whereby the control unit holds a pattern to be processed and operates the X-Y table to locate the device under the various heads and then operates the heads to perform the required process. Note that in FIG. 26 the various heads are shown spaced apart for ease of illustration but in practice they may be closely spaced to reduce the size requirement for the X-Y table and reduce the movement of the work piece.

The typical functions that can be performed by the laser heads include: drying or firing any of the liquid sources deposited by the inkjet printing heads (usually on continuous wave mode); silicon ablation or machining (q-switched mode) with deeper structures formed using the high powered longer wavelength laser; diffusing dopants into localised areas of the silicon from an overlying dopant source; redistribution (ie "driving in") of dopants within the silicon in localised regions; ablation or damaging of overlying dielectric layers using shorter wavelength lasers on Q-switched mode; oxidation of the silicon surface in localised areas by localised heating on continuous wave operation; etc. The inkjet heads are able to: perform localised printing of liquid diffusion sources of either polarity to precise locations ready for subsequent laser drying and diffusion into the wafer or dielectric layer; deposit dielectric layers in localised regions to either mask the underlying region from subsequent processes, to passivate the underlying material, or to electrically isolate the underlying material from subsequently deposited conductive material such as metal, etc; print etchants to create openings in specific locations in either a surface dielectric layer, surface metal layer or a hole within the semiconductor itself, print a liquid containing metal ions that can for instance be printed onto the junction region of two juxtaposed n and p-type regions and then subsequently heated with the laser to drive the metal ions into the junction region and therefore deliberately short out the junction to provide electrical contact; or even print solvents to dilute or clean any of the other liquid sources already deposited onto the wafer; etc.

Importantly, the system described above has an X-Y table 841 that holds the wafer 842 being processed on a movable carrier 845 and is able to precisely locate any point on the wafer 842 beneath any one of the print heads 843, 854, 855, 856, 857, 858, 859, 861 or laser heads 844, 852 for processing. All of the laser and inkjet printing heads are precisely located with respect to each other such that all of the above described processes can for instance be carried out on the same wafer 842 that is moved by the X-Y table 841 to each appropriate location while retaining its position fixed with respect to the carrier of the X-Y table 841. This provides a wide range of processing options for forming device structures.

The inkjet printing and laser tools described above avoids the alignment issues normally faced when using processes that rely on photolithographic masks for example.

9. Example of Devices with Contacts to Buried Layers

Figure 27:
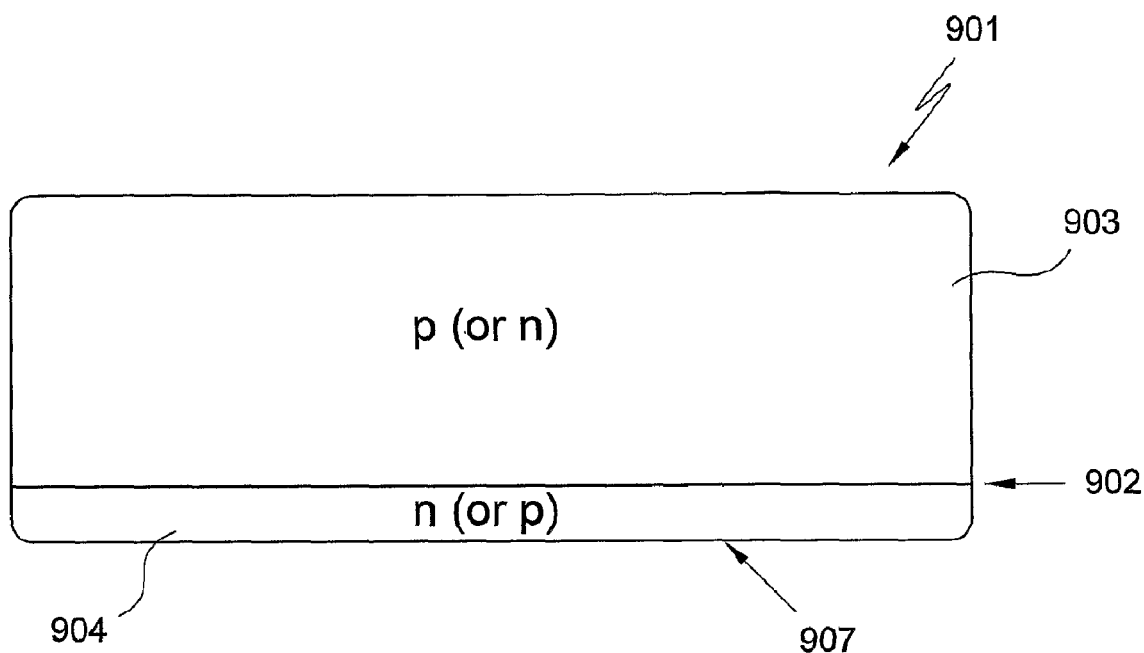
FIG. 27 illustrates a silicon wafer with the p-n junction towards the rear surface, prior to applying a contact.
Figure 28:
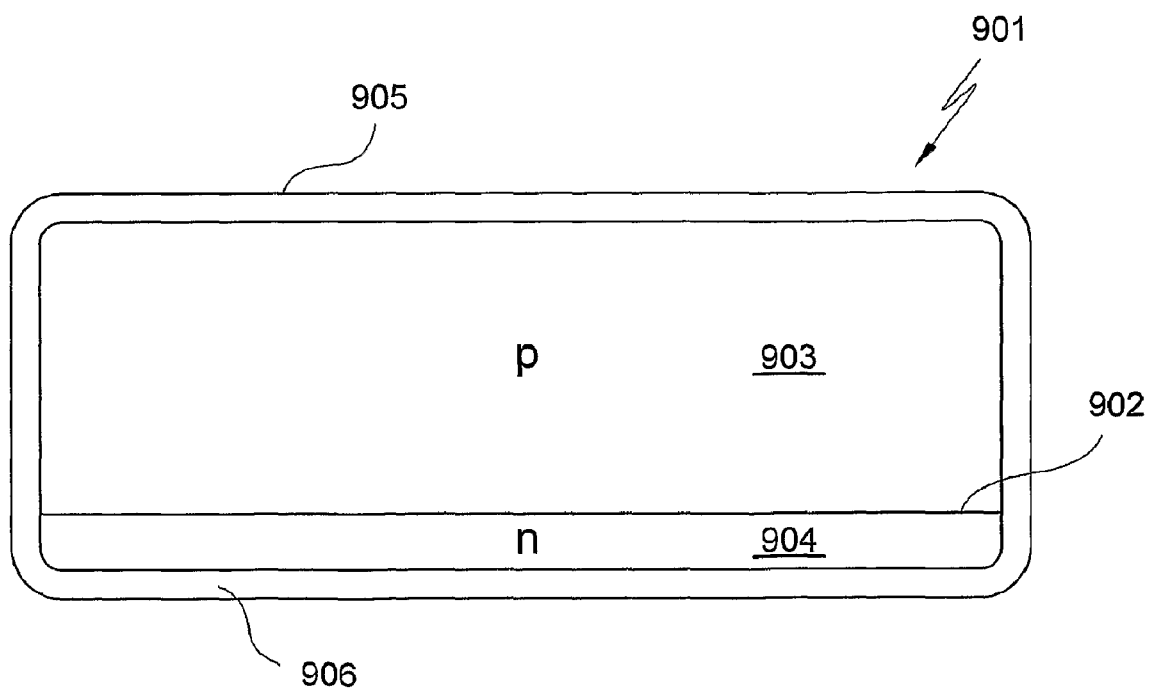
FIG. 28 illustrates shows the wafer of FIG. 27 with the front and rear surfaces passivated.

A process for contacting buried layers is described below with reference to FIGS. 27 to 40 of the accompanying drawings. FIG. 27 shows a silicon wafer 901 with the p-n junction 902 towards the rear surface 907. The bulk 903 of the wafer 901 may be doped p-type or n-type but for this example will be p-type and the rear surface region 904 will be oppositely doped (i.e. may be n-type or p-type but in this case will be n-type). FIG. 28 shows the wafer 901 of FIG. 27 with the front and rear surfaces passivated with one or multiple dielectric layers 905, 906 such as silicon dioxide or silicon nitride. Such dielectric layers will often also act as an antireflection coating for the front or light receiving surface and can provide masking to protect the silicon surface such as from metal deposition or even contamination during processing. Dielectric layer thicknesses can vary anywhere from 10 nm to many microns and still be suitable for use in this method.

Figure 29:
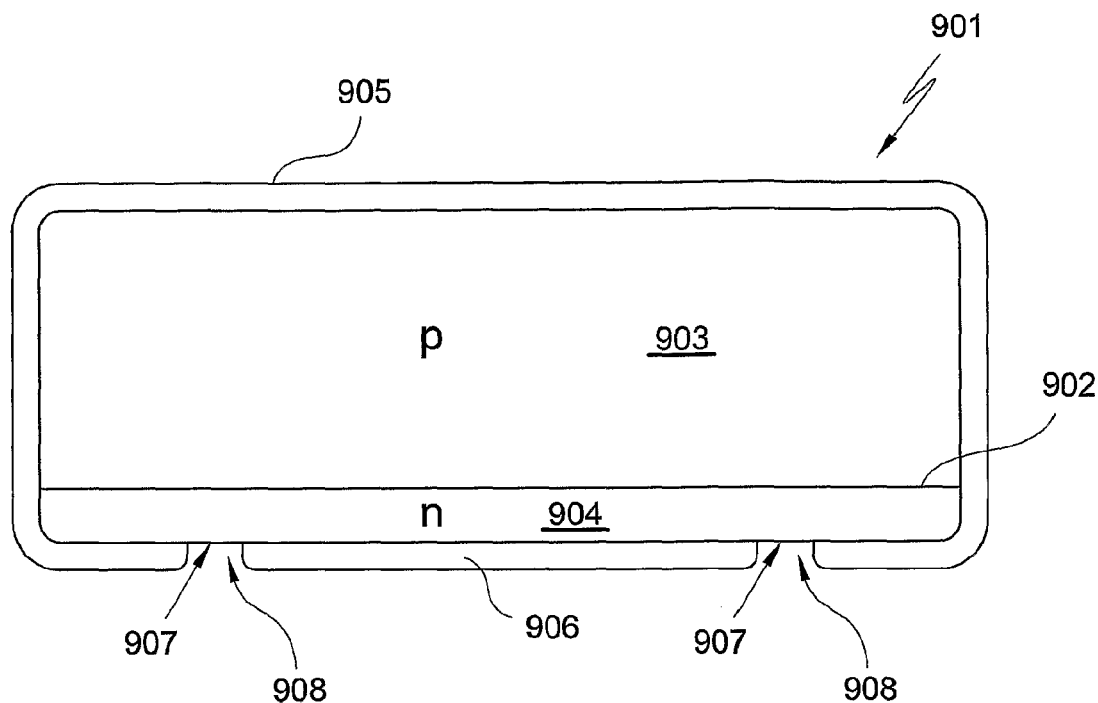
FIG. 29 illustrates the wafer from FIG. 28 with openings in the dielectric layer to expose the silicon surface.

FIG. 29 shows the wafer of FIG. 28 with openings 908, either holes or lines or some other pattern, in the dielectric layer so as to expose the silicon surface 907. Such openings can be created by laser ablation, inkjet printing of suitable chemicals, lithography based approaches, mechanical abrasion, etc. Typical widths for the openings can fall anywhere within the range of 1 micron to 1 mm for the techniques described, with all widths being suitable for use in the formation of contacts to buried semiconductor layers. Other techniques that exploit pin-hole openings in the dielectric layer can even achieve openings as small as 10 nm which are also suitable for use in the formation of contacts to buried semiconductor layers.

Figure 30:
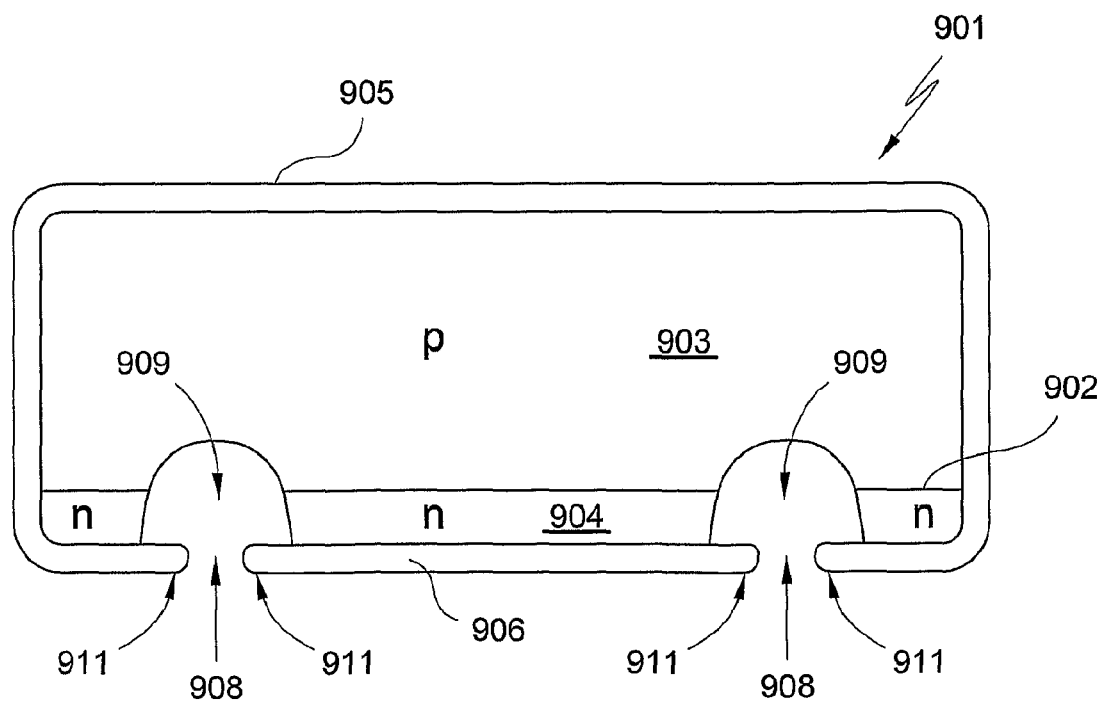
FIG. 30 illustrates the wafer of FIG. 29 following etching of the exposed silicon regions creating an overhanging dielectric layer at the edges of the holes formed.

FIG. 30 shows the wafer of FIG. 29 following formation of openings 909 in the silicon by etching of the exposed silicon regions to remove the n-type silicon 904 to expose the p-type silicon 903 while simultaneously creating the overhanging portions 911 of the dielectric layer 906 at the edges of the holes or grooves 908 formed in the dielectric. Etching of the silicon can be done using a range of chemical etches and solutions such as sodium hydroxide or an acid etch that includes chemicals such as nitric acid or potassium permanganate that oxidise the silicon surface as well as ones such as hydrofluoric acid that etches the oxidised silicon. Other approaches can also be used to etch the silicon as described while still creating the overhanging dielectric regions, such as plasma etching of the silicon. Typical dimensions of the holes or grooves can have depths anywhere from 0.1 to 100 microns, with corresponding overhangs in the dielectric layer ranging also from 0.1 to 100 microns. Of importance in contacting the buried semiconductor polarity, the depth of the hole or groove has to be great enough to exceed the junction depth from the rear surface to ensure the buried semiconductor material is exposed. Furthermore, sufficient overhang in the dielectric layer needs to be achieved so that during subsequent line-of sight deposition of the metal, the exposed silicon material from the surface layer of semiconductor material (of opposite polarity to that being contacted at the base of the hole or well) is shielded by the overhanging dielectric to give electrical isolation between the two polarities.

Figure 31:
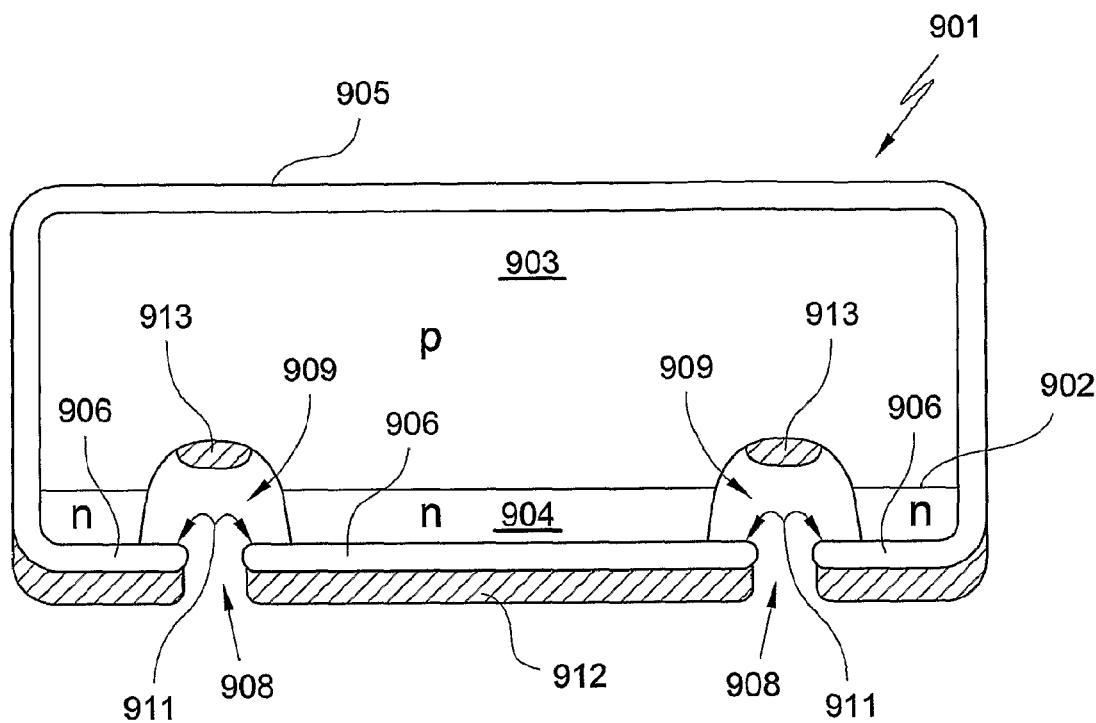
FIG. 31 illustrates shows the structure of FIG. 30 following the deposition of a metal using a line-of sight approach.

FIG. 31 shows the structure of FIG. 30 following the deposition of a layer 912 of metal such as aluminium onto the surface of the dielectric layer 906 using an approach that is approximately line-of sight such as vacuum evaporation, sputtering, e-beam deposition, plasma spraying etc to form metal contacts 913 to the p-type material 903 in the openings in the silicon material. This allows the overhanging dielectric to shade the surface n-type region within the hole or groove as shown as well as shield the rear surface n-type material also from the metal deposition. This ensures the metal only contacts the buried p-type material and not the n-type material, therefore achieving electrical isolation between the two polarities. It should be noted that the role performed by the overhanging dielectric could have equally well been performed by many other layers of material (both conducting and non-conducting) that could have been deposited in place of the dielectric layer.

Figure 32:
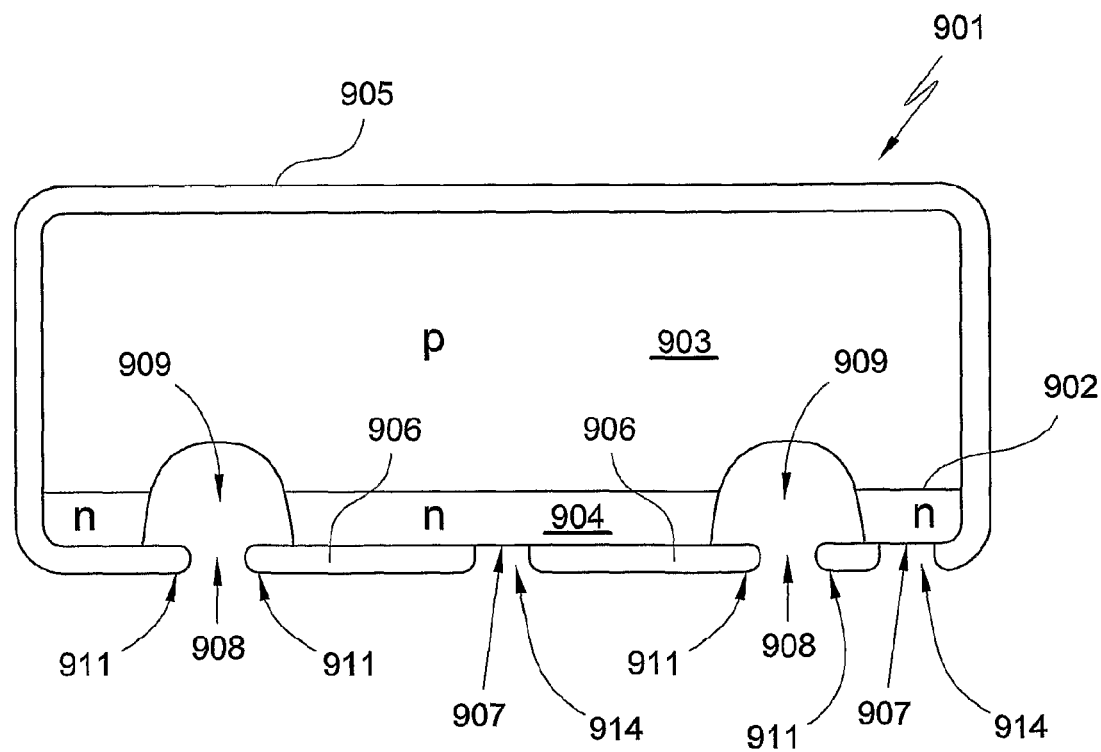
FIG. 32 illustrates a variation of the structure from FIG. 30 in which a second set of openings are created in the dielectric layer to expose localised areas of the n-type silicon surface.
Figure 33:
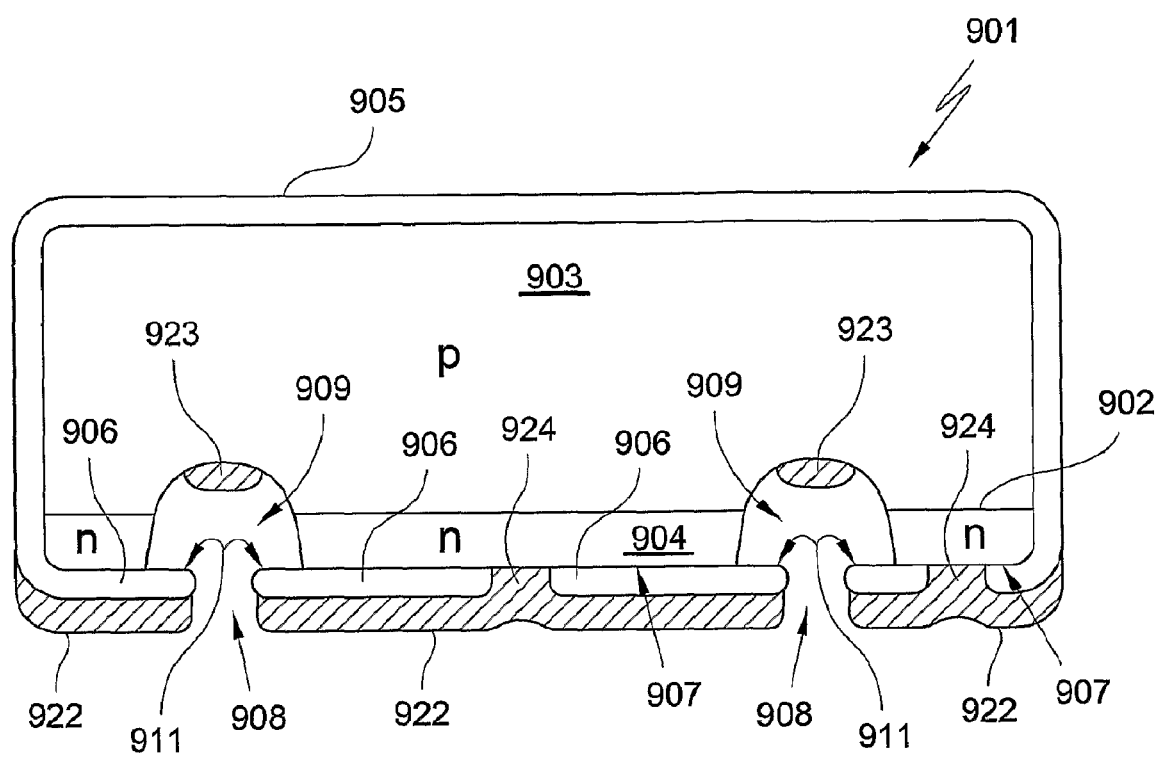
FIG. 33 illustrates the structure from FIG. 32 after metal deposition forms contacts to both polarities of silicon simultaneously.
Figure 34:
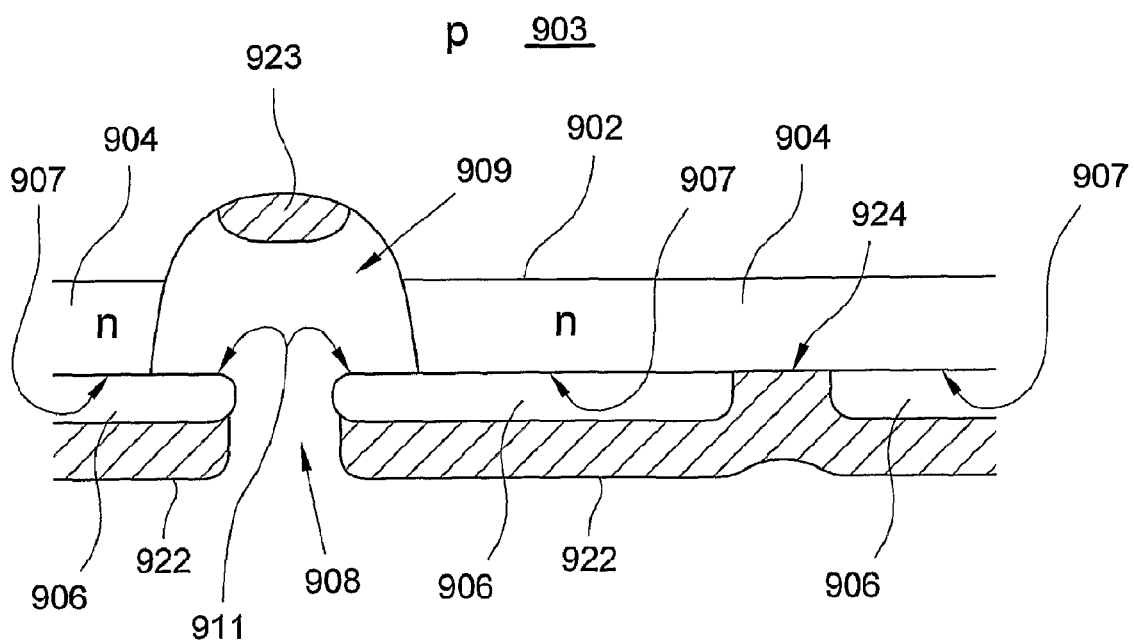
FIG. 34 illustrates an enlargement of the metal contacts to the p-type region shown in FIG. 33
Figure 35:
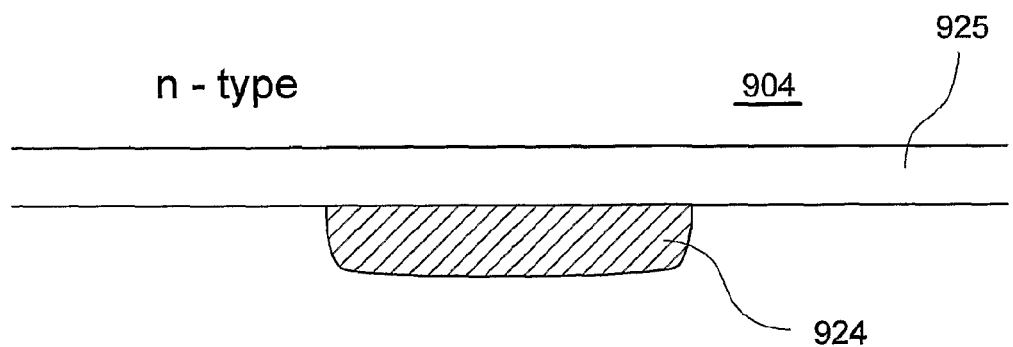
FIG. 35 illustrates an MIS contact comprising a very thin silicon dioxide layer between the metal and the silicon.
Figure 36:
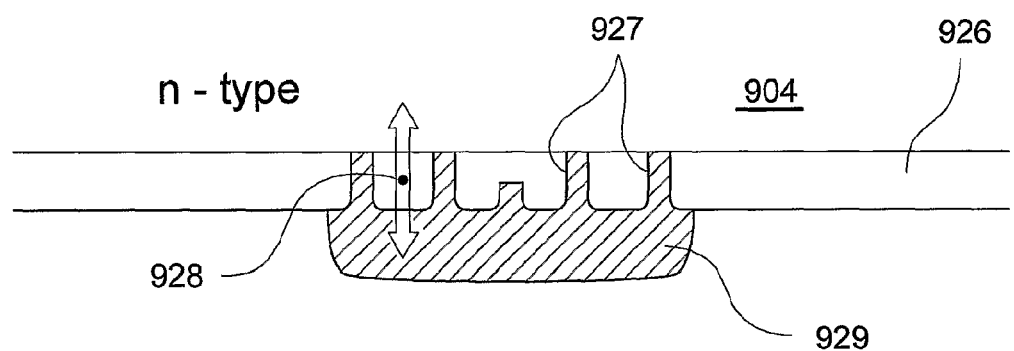
FIG. 36 illustrates an MIS/pin-hole contact that uses an interfacial oxide layer of the right thickness for MIS contacts, and also susceptible to large numbers of pin-holes allowing metal to directly contact the silicon surface in isolated locations.

FIG. 32 shows a variation of the structure of FIG. 30 whereby a second set of openings 914 are created in the dielectric layer 906 so as to expose localised areas of the n-type silicon surface 907. Again the openings can be created using the techniques described above. The structure of FIG. 32 facilitates forming a contact 923 to the p-type silicon and a contact 924 to then-type silicon simultaneously during the metal deposition 922 as shown in FIG. 33. An enlargement of the metal contacts is shown in FIG. 34. A possible weakness in this structure is the ability of the metal used to simultaneously contact both the n and p-type silicon with low contact resistance, the effectiveness of which will depend on various factors including the metal used, the doping concentration in the silicon at the metal/silicon interface and any subsequent thermal processes performed. Often, a metal that will form a good low resistance contact to one polarity of doped silicon will form a rectifying junction to the opposite polarity of silicon. For example, Aluminium is a relatively low work function metal that will make quite good ohmic contact to p-type silicon that is doped at or above $3 \times 10^{16}$ atoms/cm$^3$, but will form a Shottky barrier when deposited onto p-type silicon doped at only $1 \times 10^{16}$ atoms/cm$^3$ or below or n-type silicon. Contact between the aluminium and n-type silicon can in general be improved (lower contact resistance) through the inclusion of a very thin silicon dioxide layer 925 between the metal 924 and the silicon 904 to form an MIS contact as shown in FIG. 35. This is because the low work function of the metal causes bending in the conduction band at the semiconductor surface so as to effectively enhance the n-type doping, with electrons then able to tunnel through the thin interface oxide by quantum mechanical tunnelling. Oxide layers in the range of 5 to 25 angstroms are suitable for this type of MIS contact as also are a range of other dielectric types of similar thicknesses. The use of appropriate silicon dioxide layers at the metal/silicon interface is also advantageous to facilitate low resistance contacts simultaneously to both polarities of silicon. Referring to FIG. 36 this is done by deliberately forming MIS/pin-hole contacts that use an interfacial oxide layer 926 that is not only the right thickness for contacts which use the MIS mechanism 928, but also deliberately susceptible to large numbers of pin-holes that allow the overlying metal 929, such as aluminium, to penetrate through forming fingers of metal 927 to make direct contact to the silicon surface in isolated locations. This latter effect can be enhanced through a low temperature treatment in the range of 100 to 500 degrees and for a period of time ranging from 30 seconds to several hours depending on the pinhole density desired and the preferred size of each pin-hole. Each pin-hole will tend to grow with increasing time and increasing temperature as will also the density of pinholes through which the metal makes contact to the silicon, therefore producing the structure.

Figure 37:
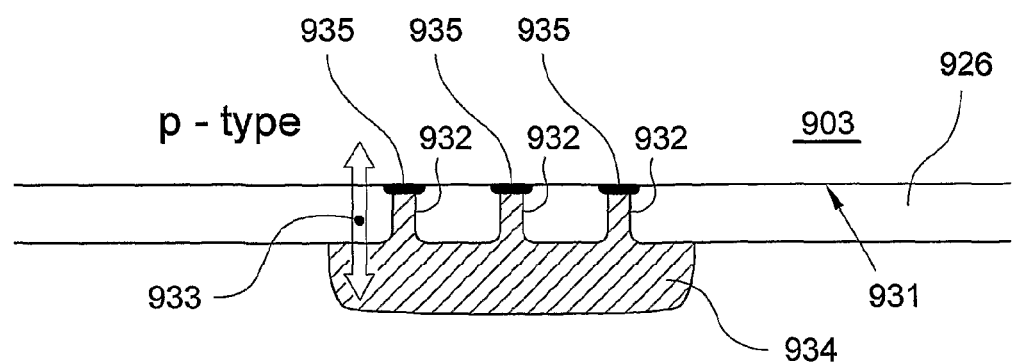
FIG. 37 illustrates an MIS/pin-hole contact to a p-type region showing epitaxial growth of silicon at the metal silicon boundary.
Figure 38:
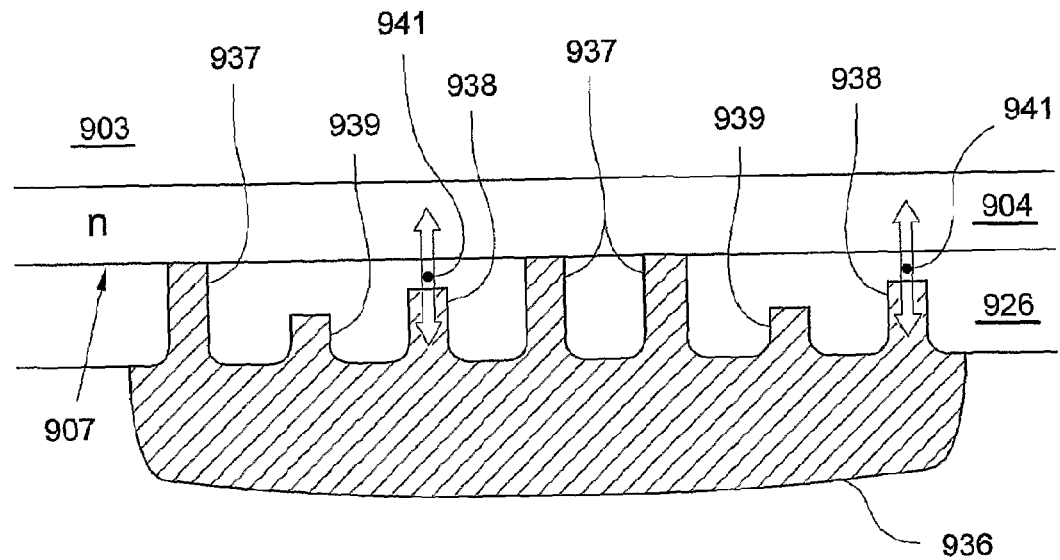
FIG. 38 illustrates different depths of penetration of aluminium through a thicker oxide layer to form pin hole and MIS contacts.
Figure 39:
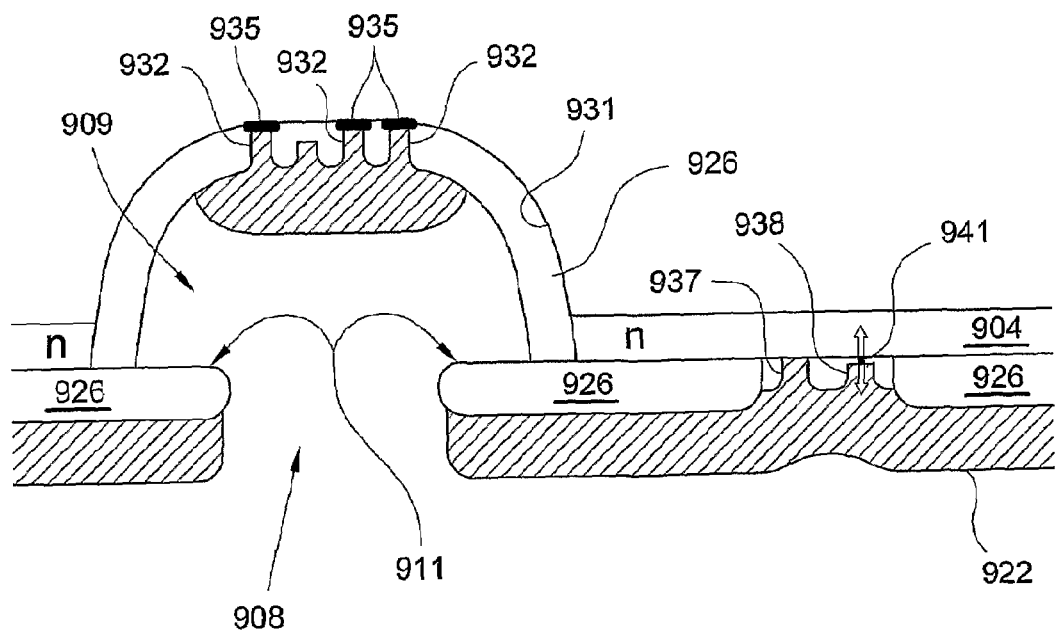
FIG. 39 illustrates low resistance contacts to both n and p-type surfaces formed simultaneously using only one oxide growth process and one metal deposition for both polarities.
Figure 40:
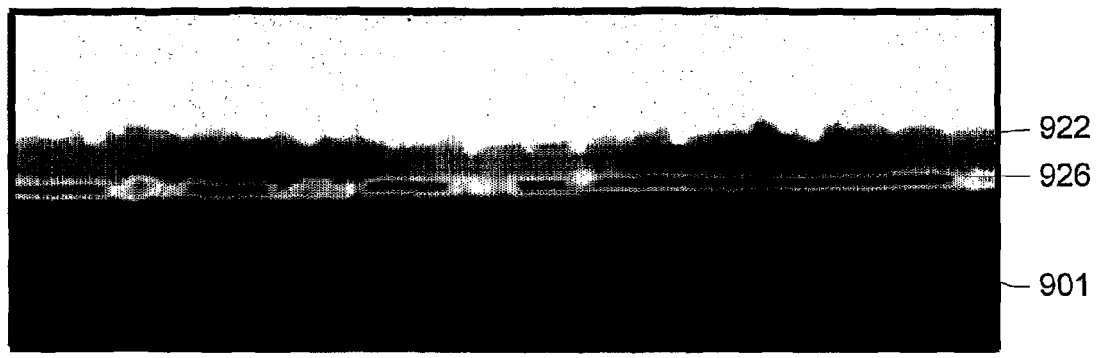
FIG. 40 photographically illustrates an MIS contact formed through the vacuum evaporation of aluminium onto a silicon dioxide coated silicon wafer.

Using the described approach of MIS/pin-hole contact formation, the same oxide layer and metal is able to simultaneously make contact to both n and p-type silicon. For example, if the silicon dioxide layer is grown chemically at 80 degrees to a thickness of about 15 angstroms on both the exposed n-type and p-type regions and aluminium deposited onto both, a thermal treatment at 300 degrees Celsius for 10 minutes allows the aluminium to reduce localised pin-hole regions of the silicon dioxide layer to facilitate direct contact to the silicon while the remaining regions without pin-holes retain the MIS structure. Referring to FIG. 37, for p-type silicon surfaces 931, the MIS part of the structure 933 produces a rectifying junction which is then bypassed by the direct contact between the aluminium 934 and silicon 903 via the fingers of metal 923 in the pin-holes in the oxide 926. These pin-hole regions therefore facilitate low resistance contact between the aluminium and the p-type silicon. The latter is also aided by the growth of solid phase epitaxial of silicon material 935 from the reduced silicon dioxide material onto the p-type silicon surface 931. This further lowers the contact resistance, particularly to lightly doped p-type surfaces (doped to below $1 \times 10^{17}$ atoms/cm$^3$) since the solid phase epitaxially grown material 935 at the interface between the silicon 903 and the aluminium fingers 932 is doped with aluminium which is itself a p-type dopant. Where the same structure is applied to the n-type silicon surface 907, the direct contact between the aluminium fingers and the silicon, with or without the solid-phase epitaxially grown p-type material 935 (see FIG. 37) at the interface, tends to form a rectifying junction that is equivalent to a high resistance contact. This high resistance (or rectifying junction) is bypassed by the MIS contact 928 that exists in parallel as shown in FIG. 36. Referring to FIG. 38, substantially thicker oxides (or dielectric layers) normally too thick for use in MIS structures (up to several thousand angstroms) can also be advantageously used. The reason for this is that the metal (e.g. aluminium) fingers 937, 938, 939 will penetrate to different depths through the oxide layer. Even though some of the area shown in FIG. 38 retains an oxide thickness too great to contribute to the ohmic contact (i.e. remains unsuitable as an MIS contact), other areas can be seen where the aluminium fingers 937 have penetrated to the silicon surface 907 for direct contact while still other areas show metal fingers 938 which have achieved almost complete penetration where the thin remaining oxide between the metal and the silicon is within the right range of thickness so as the facilitate the formation of an ohmic (low resistance) MIS contact 941 in that localised area. In these cases, the MIS structure 941 with the low work function metal facilitates the formation of a low resistance contact to the n-type surface 907 as described earlier. It is important to note that low resistance contacts to both n and p-type surfaces can be formed simultaneously using only one oxide growth process and one metal deposition 922, 934 for both polarities. This applies even to lowly doped surfaces well below $1 \times 10^{17}$ atoms/cm$^3$. The juxtaposed contacts formed this way are shown in FIG. 39. FIG. 40 shows an actual structure where the deposited metal was aluminium and the pin-hole contacts make up about 10% of the area with the MIS structure comprising the other 90%. The structure of FIG. 40 is a Metal-Insulator-Semiconductor (MIS) Contact formed through the vacuum evaporation of aluminium (top layer with white top surface) onto a silicon dioxide coated silicon wafer. The silicon wafer 901 is the lower dark area while the thin oxide 926 is sandwiched between the wafer 901 and the aluminium layer 922 with gaps through the oxide layer where the aluminium has penetrated through to the wafer surface. Following heat treatment, random reduction of the SiO2 by the overlying Al allowed this direct contact between the Al and the silicon surface in localised areas. The width of the section shown is approximately 1 micron indicating a pinhole density of approximately 10-20 per square micron.

10. Rear Surface Passivation Using a Floating Junction in Non-Contacted Regions

Figure 41:
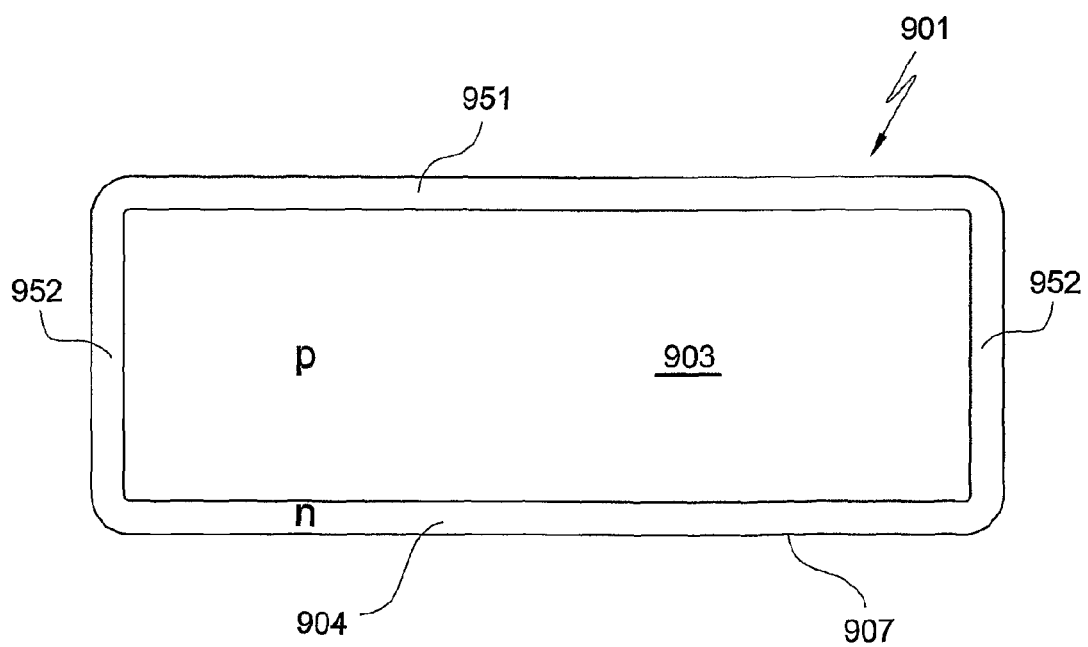
FIG. 41 illustrates a p-type wafer with front and rear surfaces diffused to form an n-type layer as is commonly the result with most commercial phosphorus diffusion processes.
Figure 42:
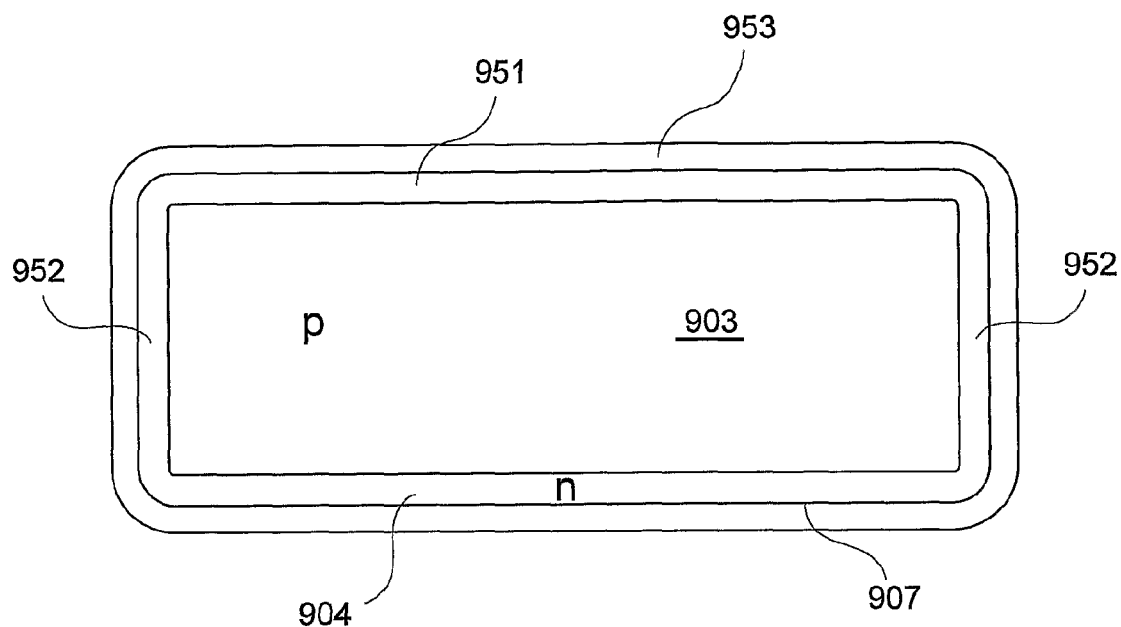
FIG. 42 illustrates the wafer of FIG. 41 subsequently coated with a dielectric layer that acts as an antireflection coating for the light receiving surface while passivating the exposed silicon surfaces.
Figure 43:
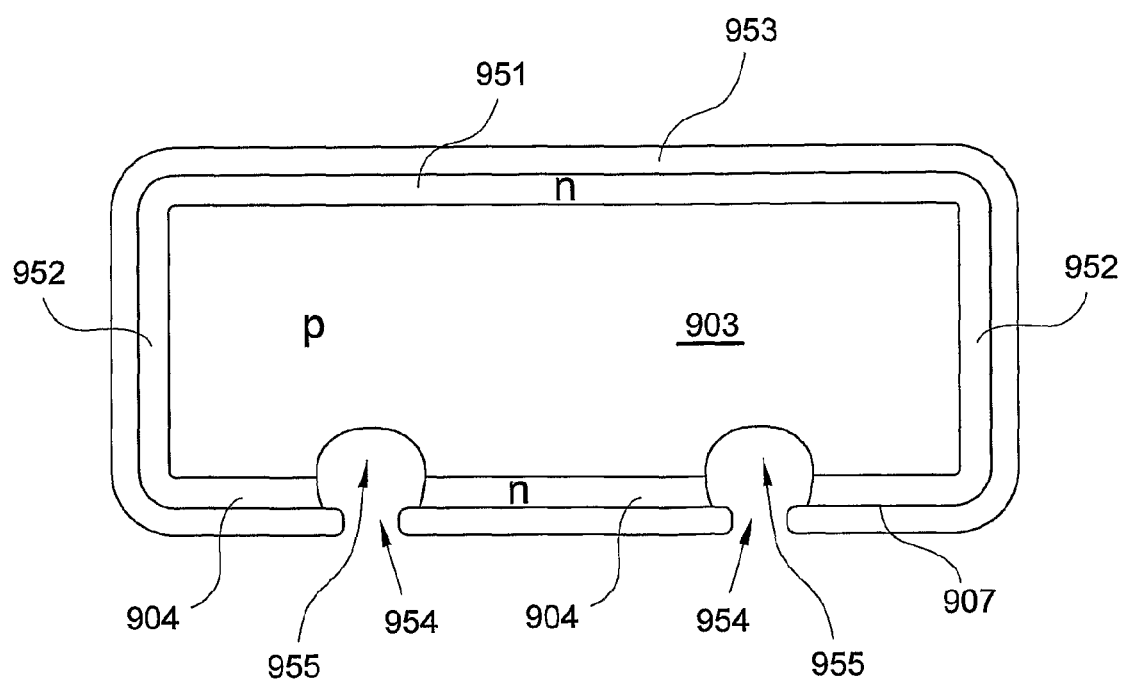
FIG. 43 illustrates the wafer of FIG. 42 after the rear surface has been etched to expose p-type silicon for contacts.
Figure 44:
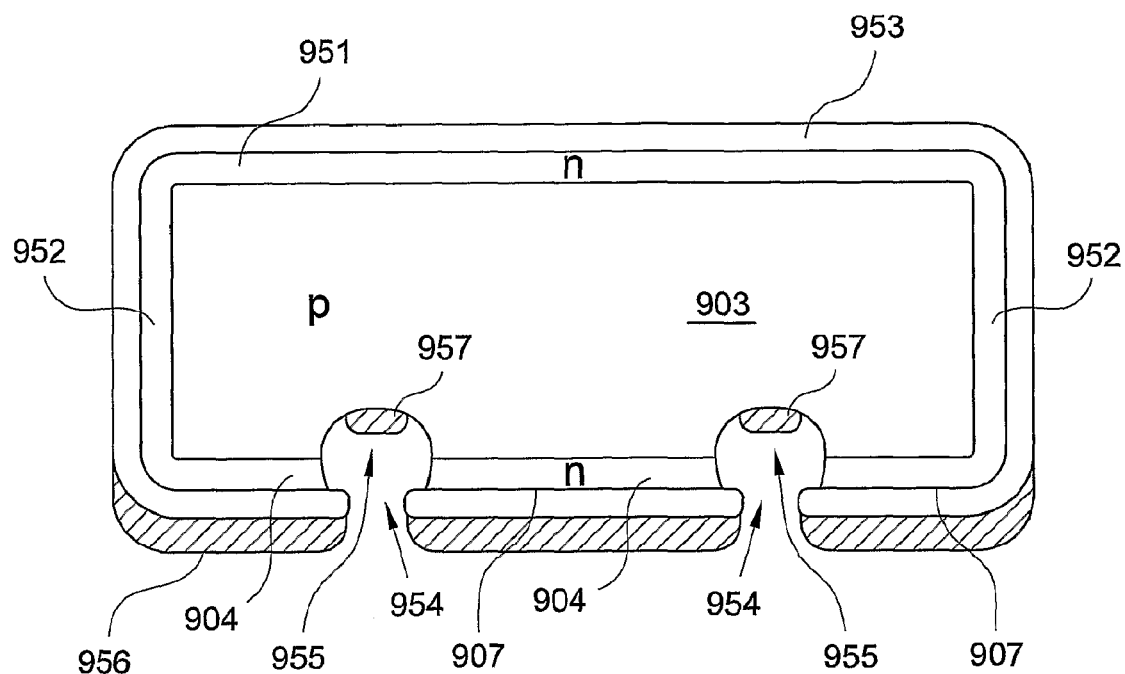
FIG. 44 illustrates the wafer of FIG. 43 after deposition of metal using a line of sight process such that metal in the opening only contacts the p-type silicon.
Figure 45:
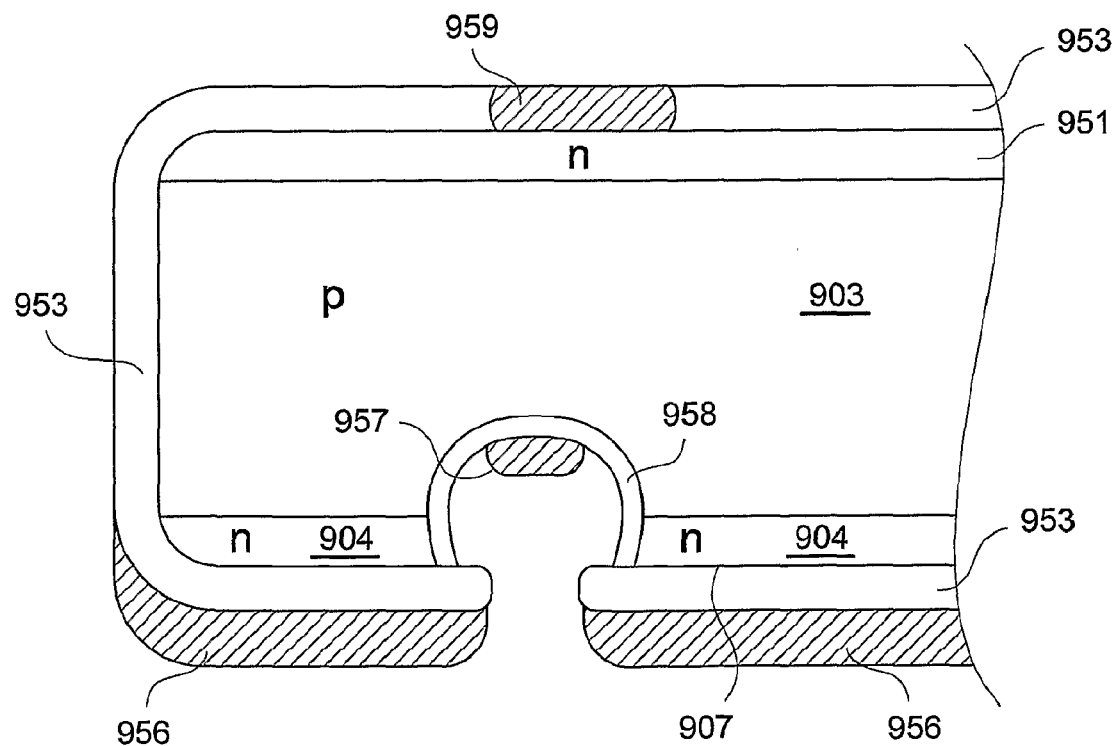
FIG. 45 illustrates the wafer of FIG. 44 after a front metal contact is screen-printed and showing an optional oxide formed on the p-type surface before the metal p-type contact was deposited.
Figure 46:
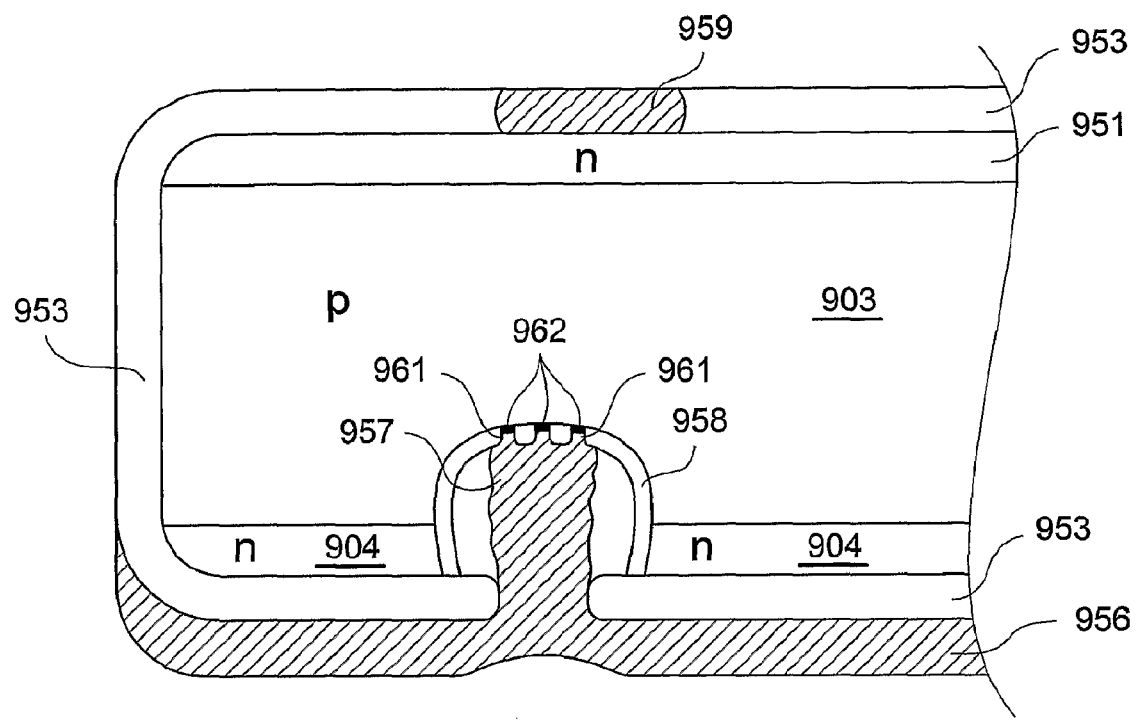
FIG. 46 illustrates an alternative p-type contact arrangement to that of FIG. 45 where the p-type contact is via holes rather than grooves and the metal is deposited with a thickness greater than the hole depth to join up with the aluminium deposited across the silicon nitride on the rear surface.
Figure 47:
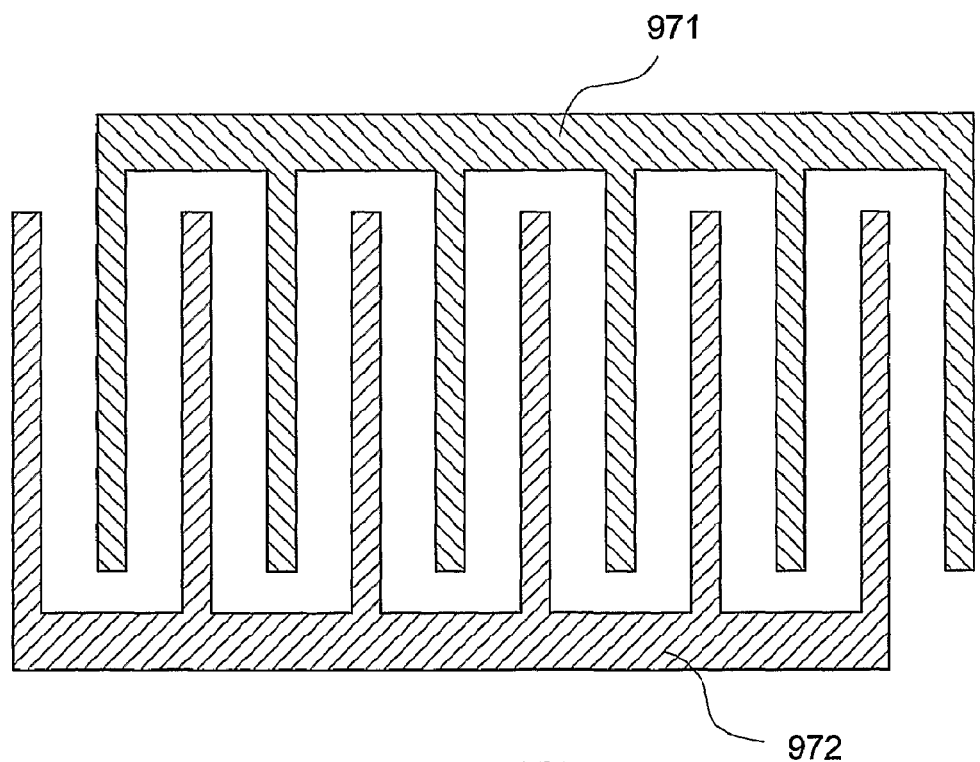
FIG. 47 illustrates a pattern of interdigitated contacts formed on one surface.

Referring to FIGS. 412 to 47, most commercial phosphorus diffusion processes when using p-type wafers 901 lead to both the front surface region 951 and rear surface region 904 as well as the side surface regions 952 being diffused to form an n-type layer, as shown in FIG. 41. The sheet resistivities for such phosphorus diffusions normally lie within the range 40 to 1000 depending on the metal contacting scheme being used. FIG. 42 shows the wafer subsequently coated with a dielectric layer 953 such as silicon nitride that will normally act as an antireflection coating for the light receiving surface while simultaneously passivating the exposed silicon surfaces. To apply the p-type metal contact to the rear, the methods described above can be used to pattern the dielectric layer with openings 954, and etch the exposed n-type silicon to produce openings 955 in the silicon exposing the p-type wafer providing the structure of FIG. 43, and then deposit a metal layer 956 such as aluminium through an approximate line of sight deposition process to produce the structure of FIG. 44 where the metal only contacts the p-type silicon inside the openings 955 to form the contact layers 957. Depending on the resistivity of the wafer, the metal 956 can be sintered to reduce the contact resistance. If however the doping in the p-type wafer is too low to make good ohmic contact, a thin oxide layer 958 can be grown over the exposed p-type silicon prior to forming the metal layer 956, 957 so that during the sintering of the aluminium, the reduction of the silicon dioxide provides a silicon source for the aluminium that facilitates solid phase epitaxial growth of heavily p-type doped silicon onto the p-type wafer surface when it becomes exposed through the pinholes at the interface with the metal (not shown but see previous drawings and description). This prevents the formation of a Schottky barrier, facilitating a low resistance contact. Importantly, this approach only allows the aluminium to contact the p-type material. Depending on the type of front metal contact 959 being used, the front metal contact can be applied before or after the rear metal contact. For example, if the front metal contact is screen-printed silver, a suitable opening in the dielectric layer 953 can be formed by etching and the contact can be printed after the chemical etch to expose the p-type surface and produce the overhanging dielectric layer. Firing of the front metal contact 959 then simultaneously produces the oxide on the p-type surface onto which the aluminium was deposited as shown in FIG. 45. Subsequent heating facilitates reduction of the oxide and contact to the p-type silicon as previously described to provide metal fingers 961 and solid-phase epitaxially grown p-type material 962. In this scenario, the p-type contact is formed in a grid pattern, with the connecting busbar at the end of the metal fingers. Alternatively, the p-type contact can be via holes rather than grooves with the aluminium deposited with a thickness greater than the hole depth so that the aluminium 597 is able to join up with the aluminium 956 deposited across the silicon nitride on the rear surface, while avoiding any contact to the n-type layer at the rear as shown in FIG. 46. A high resistance (shunt resistance) between the p-type contact and the rear n-type layer is essential for the rear floating junction to effectively passivate the rear surface. Also in this structure, the n-type layer 951, 952 that also forms down the edges of the wafer (See FIG. 44) can be optionally removed.

11. Interdigitated Rear Contacts for n or p-Type Wafers

This example is similar to the above example except that a separate second set of openings is made in the dielectric layer. For example, for p-type wafers with n-type diffused surfaces, the methods previously described with reference to FIGS. 27 to 39 are used in conjunction with the first set of openings 908 to expose and make contact to the p-type wafer material while a second set of openings 914 in the dielectric are used to expose the n-type silicon surface. This latter set of openings can take the form a comb-like pattern 971 on the rear surface, interleaved with a similar pattern 972 formed for the p-type contact so as to produce the interdigitated contact shown in FIG. 47. The order with which the two sets of openings in the dielectric layer will be formed will best be determined by the approach being used for producing the openings. For example, if laser ablation is being used, the p-type openings are best formed first because of the need to form the overhang through etching. The second set of openings is then subsequently formed by laser ablating the dielectric to expose the n-type surface with no etching required in general. If on the other hand a resist layer is being patterned with say the inkjet printing of chemicals to then facilitate patterning of the underlying dielectric, the shallow n-type openings are best formed first so that these are then protected by another resist layer that subsequently facilitates the formation of the p-type contact opening as previously described. In either case, once the two polarities of openings have been created to expose both polarities of silicon surface, chemical oxidation of the surfaces followed by aluminium deposition and sintering facilitates ohmic contact to both polarities while providing reasonable passivation of the exposed junction regions underneath the overhang. The following is an example of such a processing sequence using protective resist layers for patterning the silicon dioxide dielectric:

(i) Texture wafer surfaces
(ii) Phosphorus diffusion of front and rear surfaces plus thermal oxidation in steam to give about 2,000 angstroms oxide thickness
(iii) Apply resist coating to the wafer rear by spin-on or spraying process
(iv) inkjet print appropriate chemicals to produce openings in the resist layer wherever the n-type metal contacts are to be applied
(v) Submerge wafer in hydrofluoric acid to etch openings in the silicon dioxide to expose the n-type surface wherever the resist openings have been formed, followed by chemical clean to remove resist
(vi) Apply new resist layer over rear surface of wafer
(vii) Pattern the resist layer as above where p-type contacts are required
(viii) Chemical treatment including HF dip to form pattern in dielectric followed by acid etch (oxidising agent plus weak HF) to expose n-type material and produce overhanging dielectric followed by clean to remove resist followed by chemical oxidation of the exposed silicon surfaces such as in concentrated sulphuric acid with either hydrogen peroxide or potassium permanganate at about 80 degrees Celsius
(ix) Deposit aluminium onto the rear such as by sputtering or evaporation or plasma spraying
(x) Sinter metal contacts at 300 degrees for 10 minutes
(xi) Optional electroless or electroplating of metals such as nickel and copper can be used to build up the metal to greater thicknesses and make it solderable. In this case, the aluminium surfaces plate while the chemically grown oxide and the dielectric layers protect the remainder of the surface from the plated metals 12. Interdigitated Rear Contacts for Thin Silicon Wafers Bonded to a Supporting Substrate or Superstrate.

The trend in the industry is to thinner and thinner wafers both for economical reasons and to facilitate the achievement of higher efficiencies with lower quality substrate material. Once silicon wafers are below about 100 microns thickness, processing the wafers is particularly challenging without unacceptably high breakage rates. An alternative is to bond the thin silicon wafers (in the range of 5 to 100 microns thickness) to a supporting substrate or superstrate such as low cost low purity silicon or thermally matched glass such as borosilica glass or some other thermally matched material to the silicon. To allow the devices to subsequently be processed, both polarities of metal contact need to be able to be applied from the same surface of the wafer while thermal processes need to be kept to low temperatures to avoid both contamination from the supporting material and avoid problems with mismatch in thermal expansion coefficients. The methods previously described herein are ideal for this situation with all the metal contacting being able to be done well below 400 degrees and from a single side of the wafer. The initial surface cleaning, diffusion and dielectric formation/deposition need to be done prior to bonding the silicon wafer to the supporting material, with all subsequent processing taking place with the supporting layer connected. It is also feasible to bond a thicker wafer to the supporting material and then subsequently thin the wafer chemically or mechanically. When contacts are formed on one surface they can be interdigitated as shown in FIG. 47.

13. Contacts for Thin-Film Silicon on a Supporting Material

This example is almost identical to 12 above except that the silicon is formed by deposition directly onto a supporting substrate or superstrate such as by evaporation or PECVD or sputtering etc as is also the dielectric layer or layers. In this case the junction or junctions are formed as part of the deposition process and then the contacts applied as described in 3 above. Depending on the deposition process used, the deposited silicon may be amorphous and therefore require a crystallising step.

14. Contact to any Buried Layer in a Stack

Figure 48:
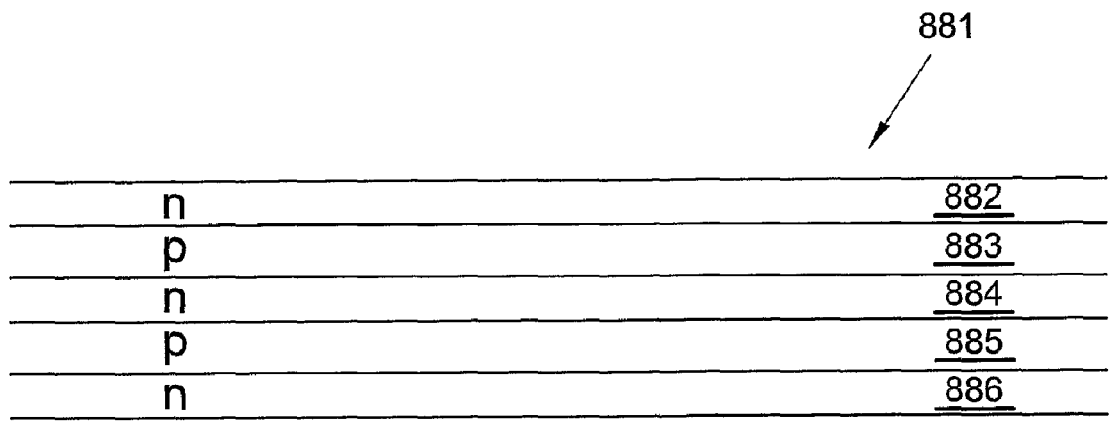
FIG. 48 illustrates a silicon wafer with four p-n junctions (n-p-n-p-n), prior to applying a contact.
Figure 49:
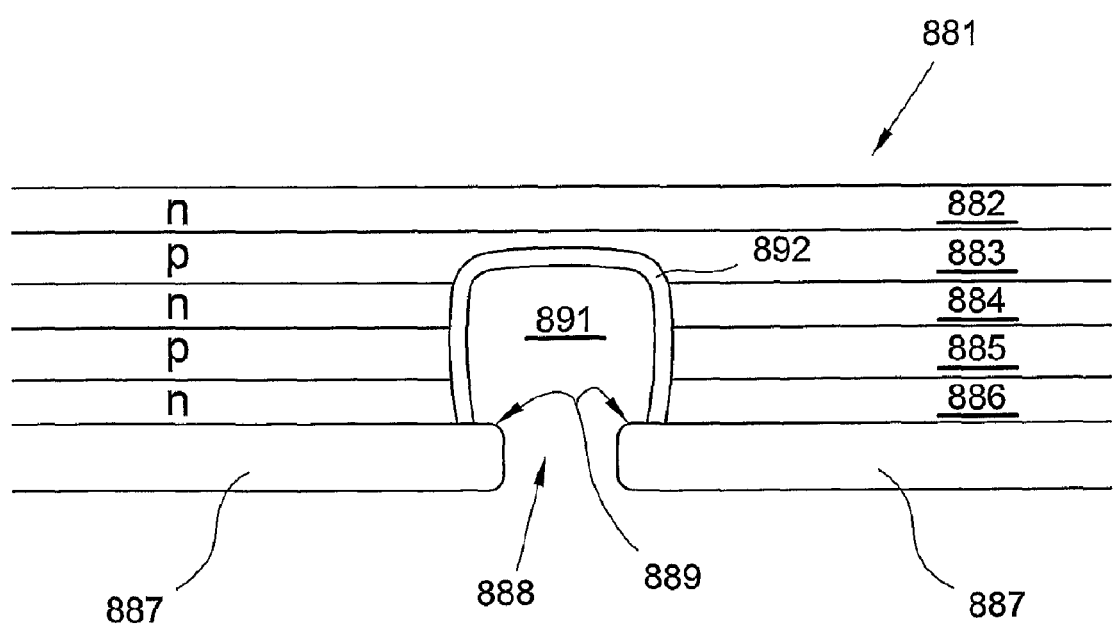
FIG. 49 illustrates the junction stack of FIG. 48 after applying a surface dielectric, forming an opening to expose a fourth (buried) layer and applying a dielectric inside the opening.
Figure 50:
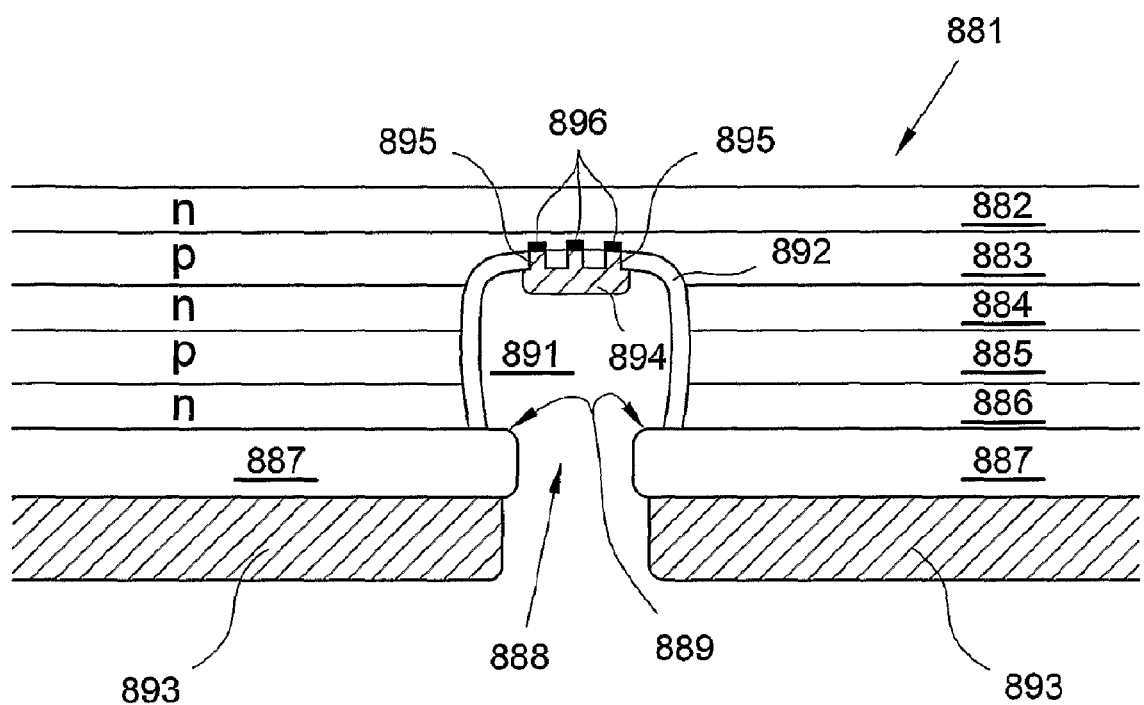
FIG. 50 illustrates the structure of FIG. 49 after metal has been applied to the first opening.
Figure 51:
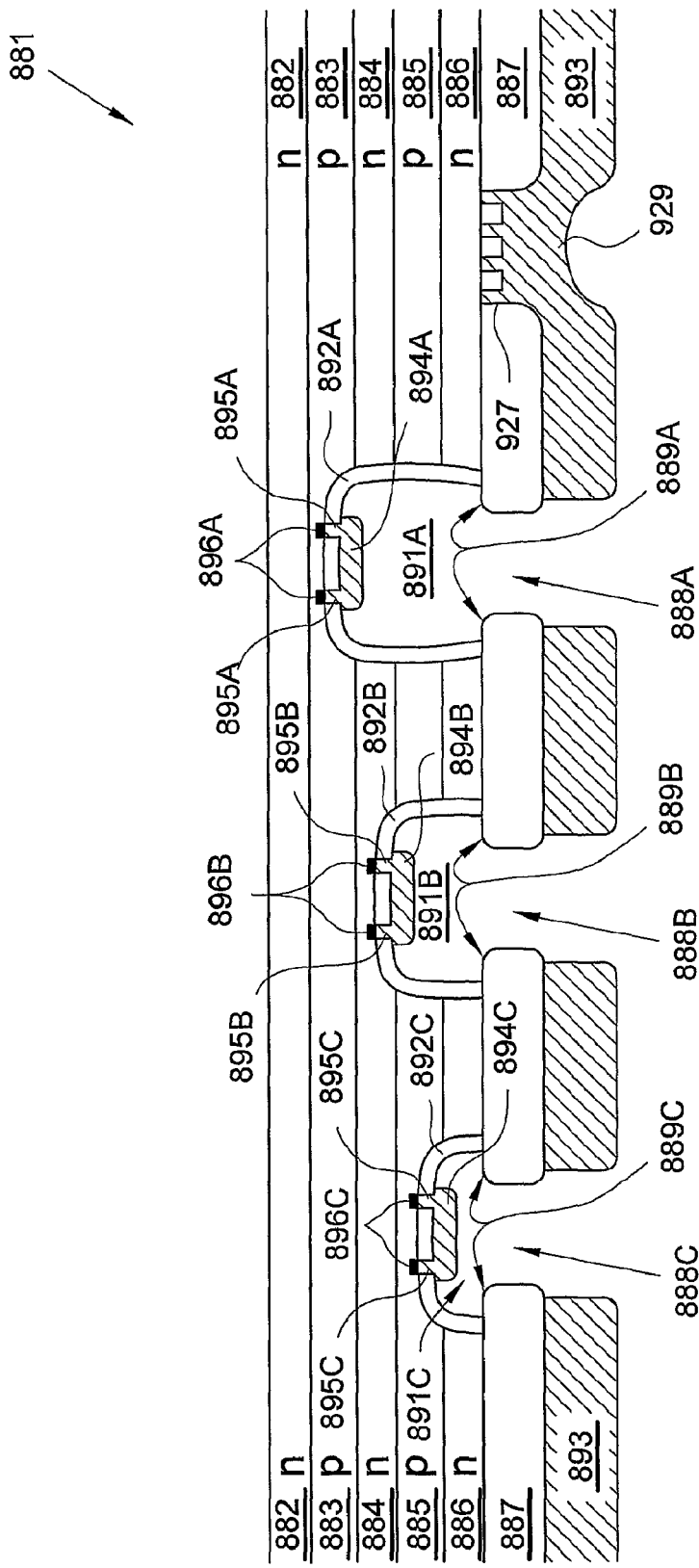
FIG. 51 illustrates the structure of FIGS. 48 to 50 after contacts have been formed to four layers.

The contact formation methods described above can be applied to a stack of semiconductor layers such as shown in FIG. 48, whereby it can be used to make electrical contact to any layer while retaining electrical isolation from all the others. For example in a stack 881 of 5 layers 882, 883, 884, 885, 886, of alternating polarity n-p-n-p-n, it is possible to make contact to the fourth layer 883 from the rear in the stack as shown in FIG. 48, using the methods described above, to produce the structure shown in FIG. 49 in which the dielectric layer 887 is opened 888 and an opening 891 in the semiconductor is etched down to the fourth layer 883 while forming undercut regions 889 under the dielectric 887. A dielectric film 892 is then formed in the openings 891. As shown in FIG. 50, after processing of a subsequent metal deposition 893, the metal layer 894 formed in the opening 891 is able to make contact to this fourth layer 883 and remain electrically isolated from all the other layers. By forming metal fingers 895 in pinholes in the dielectric 892 and contacting the p-type material 883 via solid-phase epitaxially grown p-type material 896. Referring to FIG. 5, the method can be applied repeatedly by protecting each exposed surface as it is formed with a protective coating such as a silicon dioxide layer (that can be formed or grown by a range of approaches documented in the literature) prior to reapplying the same method to expose another layer. In this case the initial dielectric layer 893, may be different from the protective coatings applied to each layers exposed surface. Once all layers to be contacted have been exposed, the protective layers can be removed such as in HF and then a new dielectric layer 892a, 892b, 892c formed and the metal 893 applied to simultaneously form each of the different contacts 894a, 894b, 894c. If the different layers are doped to different levels, the MIS/pin-hole contacts 895, 896 described earlier will provide an ideal way to contact each with low resistance contact regardless of whether n or p-type silicon. Finally a contact similar to that described with reference to FIG. 36 can be formed to contact the back n-type layer 886. The schematic shown in FIG. 51 (not drawn to scale) is the final structure showing all four layers contacted using the MIS/pin-hole contacts to each while being electrically isolated from each other.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming a contact structure, in a device including a first contact type for contacting an underlying layer of a semiconductor junction, wherein the junction comprises the underlying layer of a first semiconductor material of a first dopant polarity, an overlying layer of a second semiconductor material oppositely doped to the underlying layer, the method comprising
   (a) forming a masking layer over the overlying layer, comprising a layer of insulating material,
   (b) forming an opening in the masking layer exposing the overlying layer,
   (c) forming an opening in the overlying layer under the opening in the masking layer, the opening in the overlying layer being formed to extend through the overlying layer to expose the underlying layer, and the opening in the overlying layer also being formed to extend under the edges of the opening in the masking layer to form an undercut region extending around the entire periphery of the opening in the masking layer whereby the undercut region extends entirely across the overlying layer, and
   (d) forming a metal layer over a surface of the masking layer and extending into the opening in the overlying layer to contact the underlying layer, the metal layer where it extends between the masking layer and the underlying layer being isolated from the overlying layer, whereby the metal does not bridge the semiconductor junction.

2. The method of claim 1 wherein after the metal layer is formed the undercut region defines a void between the metal layer and the overlying layer in the undercut region to isolate the metal layer from the overlying layer region.

3. The method of claim 1 wherein the insulating layer over the undercut region collapses into the opening in the overlying layer to isolate the overlying layer from the subsequently formed metal layer.

4. The method of claim 3 wherein the undercut region of the insulating layer is modified relative to the remainder of the insulating layer to promote collapsing into the opening in the overlying layer.

5. The method of claim 4 wherein the undercut region of the insulating layer is modified by being thinned relative to the remainder of the insulating layer to promote collapsing into the opening in the overlying layer.

6. The method of claim 5 wherein thinning of the undercut region of the insulating layer is achieved by etching the entire insulating layer with an etchant which is flowable into the opening in the overlying layer whereby the undercut region is simultaneously etched on its upper and lower surfaces.

7. The method of claim 4 wherein the undercut region of the insulating layer is modified by being softened relative to the remainder of the insulating layer to promote collapsing into the opening in the overlying layer.

8. The method as claimed in claim 1 wherein the opening is formed in the insulation layer by:
   (a) forming a layer of masking material;
   (b) forming openings in the masking material; and
   (c) applying an etchant through the openings in the masking material to etch the openings in the insulation layer.

9. The method of claim 1 wherein the opening is formed in the insulation layer by:
   (a) diffusing a substance into the insulating layer which promotes preferential etching of the insulating layer, the substance being diffused into the insulating layer in locations where openings are to be formed;
   (b) etching the insulating layer with an etchant that preferentially etches the insulating material into which the substance has been diffused.

10. The method of claim 9 wherein the substance is diffused into the insulating layer by applying, a diffusion source to the surface of the insulating layer where diffusion is to take place and heating to drive the diffusion substance into the insulation layer.

11. The method of claim 9 wherein the diffusion substance is diffused into the insulating layer by:
   (a) depositing a diffusion source onto the surface of the overlying layer before the insulating layer is formed, the diffusion source being a source of a substance which promotes preferential etching of the insulating layer when diffused into the insulating layer, the diffusion source being deposited onto the insulating layer in locations where openings are to be formed in the insulating layer;
   (b) forming the insulating layer over the overlying layer and diffusion source whereby the substance is incorporated into the insulating layer in the locations where the diffusion source was deposited;
   (c) etching the insulating layer with an etchant that preferentially etches the insulating material into which the substance has been diffused.

12. The method as claimed in claim 9 wherein the overlying layer of the second semiconductor material includes silicon and the insulating layer includes silicon nitride and the substance diffused into the insulating layer includes phosphorous.

13. The method as claimed in claim 9 wherein the overlying layer of the second semiconductor material includes silicon and the insulating layer includes silicon dioxide and the substance diffused into the insulating layer includes phosphorous.

14. The method of claim 9 wherein after the insulating layer has been selectively etched, the overlying layer exposed by the insulating layer etch is then surface etched to remove a thin surface layer of the overlying layer containing the substance diffused into the insulating material.

15. The method of claim 1 wherein a second contact type is formed on the same surface as the first contact type, the method comprising:
   (a) forming an opening in the insulating layer exposing the overlying layer, and
   (b) forming a metal layer extending into the opening in the insulating layer to contact the overlying layer.

16. The method of claim 15 wherein the step of forming a metal layer for the first and second contact types is the same step and the metal associated with each contact type is subsequently separated by patterning the metal layer.

17. The method of claim 15 wherein the steps of forming a metal layer for the first and second contact types are separate steps performed using an inkjet deposition technique.

18. The method of claim 15 wherein the first and second contact types are formed as two sets of interdigitated contacts on one side of the device.

19. The method of claim 15 wherein, each set of contacts is formed as a set of finger shaped contacts interconnected by a busbar and the fingers of each set are interdigitated.

* * * * *

UNITED STATES PATENT AND TRADEMARK OFFICE
CERTIFICATE OF CORRECTION

PATENT NO.          : 7,998,863 B2                              Page 1 of 1
APPLICATION NO.     : 12/125827
DATED               : August 16, 2011
INVENTOR(S)         : Stuart Ross Wenham et al.

It is certified that error appears in the above-identified patent and that said Letters Patent is hereby corrected as shown below:

ON THE COVER OF THE PATENT
    Left column, item (73), Assignee, replace the text "Newsourth Innovations Pty Limited" with the following text:
        -- NewSouth Innovations Pty Limited --

Signed and Sealed this
Twenty-fifth Day of October, 2011

David J. Kappos
*Director of the United States Patent and Trademark Office*